United States Patent [19]
Watabe

[11] Patent Number: 5,525,530
[45] Date of Patent: Jun. 11, 1996

[54] METHOD OF MANUFACTURING A SEMICONDUCTOR DEVICE

[75] Inventor: Kiyoto Watabe, Hyogo, Japan

[73] Assignee: Mitsubishi Denki Kabushiki Kaisha, Tokyo, Japan

[21] Appl. No.: 363,038

[22] Filed: Dec. 23, 1994

Related U.S. Application Data

[62] Division of Ser. No. 140,915, Oct. 25, 1993, abandoned.

[30] Foreign Application Priority Data

Oct. 23, 1992 [JP] Japan .................................. 4-285700
Jul. 19, 1993 [JP] Japan .................................. 5-200334

[51] Int. Cl.$^6$ ............................................. H01L 21/265
[52] U.S. Cl. .................... 437/34; 437/59; 437/162; 437/192; 148/DIG. 9
[58] Field of Search .......................... 437/34, 59, 162, 437/192; 148/DIG. 9

[56] References Cited

U.S. PATENT DOCUMENTS

| | | |
|---|---|---|
| 4,044,452 | 8/1977 | Abbas et al. |
| 4,737,472 | 4/1988 | Schaber et al. ........................ 437/59 |
| 4,960,726 | 10/1990 | Lechaton et al. ...................... 437/162 |
| 5,132,234 | 7/1992 | Kim et al. ............................... 437/59 |
| 5,171,702 | 12/1992 | Prengle et al. ..................... 148/DIG. 9 |

FOREIGN PATENT DOCUMENTS

| | | |
|---|---|---|
| 0450375 | 10/1991 | European Pat. Off. . |
| 63-246862 | 10/1988 | Japan . |
| 64-25569 | 1/1989 | Japan . |

OTHER PUBLICATIONS

HSST/BiCMOS Technology with 26ps ECL and 45ps 2V CMOS Inverter, Konaka et al., 1990 IEEE pp. 493–496.
2 Micron Merged Bipolar-CMOS Technology, Alvarez et al., 1984 IEDM pp. 761–764.
IEEE Electron Device Letters, vol. 13, No. 8, pp. 392–395 by Bashir et al., Aug. 1992.

*Primary Examiner*—Tuan H. Nguyen
*Attorney, Agent, or Firm*—Lowe, Price, LeBlanc & Becker

[57] ABSTRACT

The present invention is mainly characterized in that a Bi-CMOS is obtained in which characteristics of a bipolar transistor are not deteriorated. The device includes a bipolar transistor and a CMOSFET formed on a semiconductor substrate separately from each other by a field oxide film. The thickness of a gate electrode of an NMOSFET and a gate electrode of a PMOSFET is made larger than the thickness of an emitter electrode of the bipolar transistor.

7 Claims, 70 Drawing Sheets

(a)

(b)

VERTICAL NPN TRANSISTOR     LATERAL PNP TRANSISTOR

METHOD OF MANUFACTURING A SEMICONDUCTOR DEVICE

This application is a division of Application Ser. No. 08/140,915, filed Oct. 25, 1993, now abandoned.

BACKGROUND OF THE INVENTION

1. Field of the Invention

The present invention generally relates to semiconductor devices, and more particularly, to a Bi-CMOS device having a bipolar transistor and a field effect transistor formed on the same semiconductor substrate. The present invention also relates to a method of manufacturing such a Bi-CMOS device.

2. Description of the Background Art

VLSI represented by a memory or processor tends to be made large in scale in recent years. In order to cope with such a tendency, a CMOS having characteristics of a high integration density and low power consumption has often been used. Although an operation speed of a MOS has increased with advancement of microtechnology, requirements for a higher speed are not sufficiently met presently. A bipolar device mainly of ECL is the mainstream in the field of a device operating at a high speed. However, power consumption of the bipolar device is extremely high, which places a heavy restriction on high integration.

In order to implement a device of a high speed and low power consumption, Bi-CMOS technology enabling a device having characteristics of a high integration and low power consumption of the CMOS and a high speed operation of the bipolar, as shown in FIG. 1, has been paid attention to.

FIG. 2 is a cross sectional view of a conventional Bi-CMOS. Referring to FIG. 2, an epitaxial layer Ep is formed on the surface of a silicon substrate 1. An NMOSFET, a PMOSFET, and a bipolar transistor are formed on the epitaxial layer Ep.

Description will be given of a method of manufacturing the conventional Bi-CMOS.

Referring to FIG. 3, an oxide film 2 and a nitride film 3 are formed sequentially on the main surface of silicon substrate 1 of a p type having resistivity of 10 Ωcm. Oxide film 2 and nitride film 3 are patterned to form an opening on a portion in which an $N^+$ buried layer is to be formed. Antimony is doped into the surface of silicon substrate 1 through the opening.

Referring to FIG. 4, in a portion to which antimony is doped, antimony is diffused by annealing at a high temperature (for example, 1180° C.) to form an $N^+$ buried layer 4. At this time, removal of defects and formation of a surface oxide layer 5 of $N^+$ buried layer 4 are simultaneously carried out.

Referring to FIGS. 3 and 4, nitride film 3 is removed to carry out ion implantation of boron. At this time, since surface oxide layer 5 is thicker than oxide film 2, surface oxide layer 5 serves as a mask of the ion implantation. Then, by carrying out annealing at a high temperature, implanted boron is diffused to form a $P^+$ buried layer 6 in silicon substrate 1.

Referring to FIGS. 4 and 5, surface oxide layer 5 and oxide film 2 are removed.

Referring to FIG. 6, an intrinsic type epitaxial layer Ep having the thickness of approximately 1 μm to 1.5 μm is formed on silicon substrate 1. By oxidizing the surface of the epitaxial layer Ep, a thin oxide film 8 is formed. A nitride film is deposited on oxide film 8 (not shown). The nitride film is patterned so as to expose the surface of oxide film 8 on $N^+$ buried layer 4 (not shown). With the nitride film used as a mask, ions of phosphorus are shallowly implanted. Then, ions of phosphorus are deeply implanted to form an $N^+$ layer 9a. With the nitride film used as a mask, oxide film 10 is formed thick on $N^+$ layer 9a. Then, the nitride film is removed. With oxide film 10 used as a mask, ions of boron are implanted through oxide film 8.

Referring to FIG. 7, a p well 11 is formed in the epitaxial layer Ep in which boron is implanted by driving (thermal diffusion) at 1000° C. for 150 to 250 minutes, and an n well 9 is formed by diffusion of $N^+$ layer 9a.

Referring to FIGS. 6 and 7, after removing thin oxide film 8 and thick oxide film 10, an oxide film 12 is formed thin (10 nm). Polysilicon 13 is deposited 50 nm on oxide film 12. A nitride film 14 is further deposited thick (240 nm) thereon. Oxide film 12, polysilicon 13, and nitride film 14 are patterned so as to be left only on active regions $A_1$, $A_2$, $A_3$, $A_4$ with lithography technology. With the obtained pattern used as a mask, ions and boron are implanted into the surface of the substrate for channel cut.

Referring to FIGS. 7 and 8, with nitride film 12 used as a mask, the surface of the substrate is oxidized, whereby a field oxide film 15 of the thickness of approximately 800 nm is formed on the surface of the substrate. After removing oxide film 14, polysilicon 13, and nitride film 12, an oxide film 16 is formed thin (20 nm or less) on active regions $A_1$, $A_2$, $A_3$, $A_4$. Resist 17 having an opening on active region $A_4$ is formed on the substrate. With resist 17 used as a mask, ions of phosphorus are implanted into active region $A_4$ shallowly, and then, deeply.

Referring to FIGS. 8 and 9, by removing resist 17 and carrying out annealing at a high temperature, a drawing-out portion 18 of a collector is formed in active region $A_4$. Referring to FIG. 10, resist 19 having an opening on active region $A_3$ is formed on the substrate. With resist 19 used as a mask, ions of boron are implanted into active region $A_3$.

Referring to FIGS. 10 and 11, by carrying out annealing at a high temperature after removal of resist 19, a P-type base region 20 is formed on the surface of active region $A_3$.

Ions are implanted for adjustment of a threshold value into a region in which a MOS transistor is to be formed, that is, active regions $A_1$, $A_2$.

Referring to FIGS. 11 and 12, after removing oxide film 16 on active regions $A_1$, $A_2$, $A_3$, $A_4$, a gate oxide film 21 of the thickness of 20 nm is formed. Polysilicon 22 is further deposited thereon.

Referring to FIGS. 12 and 13, by patterning polysilicon 22, a gate electrode 24 is formed on active region $A_1$, and a gate electrode 25 is formed on active region $A_2$.

Referring to FIG. 14, such resist pattern 27 as covers part of active region $A_1$, part of active region $A_2$, and all of active region $A_3$ is formed on the substrate. With gate electrode 24 and resist 27 used as a mask, ions of phosphorus are implanted into the surface of the substrate, whereby a source/drain low concentration impurity region (an $N^-$-type LDD (lightly doped drain) region) 28 is formed, and a low concentration impurity region 281 is formed in the surface of active region $A_2$. Then, resist pattern 27 is removed.

Referring to FIG. 15, a TEOS (tetraethyl orthosilicate) film 29 of the thickness of 300 nm is formed on the entire surface of silicon substrate 1.

Referring to FIGS. 15 and 16, by anisotropically etching TEOS film 29, sidewall spacers 29a, 29b are formed on sidewalls of gate electrodes 24, 25, respectively.

Referring to FIG. 17, resist pattern 30 having the same pattern as that used in the step of FIG. 14 is formed on silicon substrate 1. Referring to FIGS. 17 and 18, with resist pattern 30 used as a mask, ion implantation 400 into the surface of silicon substrate 1 is carried out to form a source/drain high concentration region 31 and an N-type common electrode 32. Then, resist pattern 30 is removed.

Referring to FIG. 19, a resist pattern 33 as shown in the figure is formed on silicon substrate 1 having openings on part of active region $A_1$, part of active region $A_2$, and part of active region $A_3$. Referring to FIGS. 19 and 20, with resist pattern 33 used as a mask, ions of boron are implanted, whereby a source/drain region 34, a P-type common electrode 35, and an external base region 46 are formed. Then, resist pattern 33 is removed.

Referring to FIG. 21, a TEOS film 36 of the thickness of 200 nm is deposited on silicon substrate 1. By using lithography technology, an opening 36a for exposing a base region 20 in active region $A_3$ is formed in TEOS film 36. Referring to FIG. 22, polysilicon 37 is deposited on the entire surface of silicon substrate 1 to fill opening 36a. Ions of As are implanted into polysilicon 37. By implanting ions of As into polysilicon 37, an emitter region 48 is formed in the surface of base region 20.

Referring to FIGS. 22 and 23, by patterning polysilicon 37, an emitter electrode 38 is formed. A protective insulating film 39 is formed on silicon substrate 1 so as to cover gate electrode 24, base electrode 25, and emitter electrode 38. A contact hole for electrical connection is formed in protective insulating film 39. An electrode interconnection 40 is electrically connected to the NMOS, the PMOS, and the bipolar transistor through the contact hole.

The conventional Bi-CMOS device was formed by a method as described above. Therefore, referring to FIGS. 15 and 16, when TEOS film 29 was etched to form sidewall spacers 29a, 29b on sidewalls of gate electrode 24, 25, active regions $A_3$, $A_4$ in which the bipolar transistor is to be formed were subjected to reactive ion etching, causing active regions $A_3$, $A_4$ to be damaged.

As a result, referring to FIG. 24, a base current ($I_B$) became large on the side of the low $V_{BE}$ (base-emitter voltage) (refer to the dotted line (2)). In FIG. 24, comparison of the conventional example with the present invention is illustrated (refer to the curve (1)).

In the bipolar transistor, a current amplification factor $h_{FE}$ is given by $$h_{FE}=I_C/I_B$$

In the bipolar transistor, it is desired that the current amplification factor ($h_{FE}$) is large. However, when the base current becomes large on the side of the low $V_{BE}$ as shown in FIG. 24, the current amplification factor becomes small, which in turn deteriorates characteristics of the bipolar transistor.

SUMMARY OF THE INVENTION

One object of the present invention is to provide a method of manufacturing a Bi-CMOS in which characteristics of a bipolar transistor are not deteriorated.

Another object of the present invention is to provide a method of manufacturing a Bi-CMOS having a resistance, in which characteristics of a bipolar transistor are not deteriorated.

A still another object of the present invention is to provide a method of manufacturing a Bi-CMOS including a thin film transistor, in which characteristics of a bipolar transistor are not deteriorated.

A further object of the present invention is to provide a Bi-CMOS manufactured by such a method.

A further object of the present invention is to provide a Bi-CMOS including a resistance manufactured by such a method.

A further object of the present invention is to provide a Bi-CMOS including a thin film transistor manufactured by such a method.

A semiconductor device according to a first aspect of the present invention includes a semiconductor substrate, and a bipolar transistor and a field effect transistor formed on the semiconductor substrate separately from each other. The thickness of a gate electrode of the field effect transistor is made larger than the thickness of an emitter electrode of the bipolar transistor.

In one preferred embodiment of the present invention, a source/drain region of the field effect transistor overlaps with the gate electrode.

In another preferred embodiment of the present invention, the surface of the source/drain region of the field effect transistor is silicidated. The surface of an external base electrode of the bipolar transistor is also silicidated.

In a still another preferred embodiment of the present invention, a tungsten silicide film is provided in the surface of the external base electrode of the bipolar transistor.

In a further preferred embodiment of the present invention, a nitride film is formed on the external base electrode of the bipolar transistor, and a sidewall spacer formed of the nitride film is provided on a sidewall of the external base electrode.

In a further preferred embodiment of the present invention, a nitride film is formed on the external base electrode of the bipolar transistor, and a sidewall spacer is formed on the sidewall of the external base electrode. The sidewall spacer is structured in two layers of an internal sidewall spacer formed of an oxide film in contact with the external base electrode and an external sidewall spacer formed of a nitride film provided on a sidewall of the internal sidewall spacer.

In a further preferred embodiment of the present invention, the semiconductor device further includes a polysilicon resistance or a thin film transistor.

A method of manufacturing a semiconductor device according to a second aspect of the present invention relates to a semiconductor device having a bipolar transistor and a field effect transistor formed on the same semiconductor substrate. An external base electrode, an intrinsic base region, a drawing-out portion of a collector, and an emitter region are formed in a region to form the bipolar transistor. An emitter electrode connected to the emitter region is formed in the region to form the bipolar transistor. A gate electrode of the field effect transistor is formed in a region to form the field effect transistor. With the gate electrode used as a mask, low concentration impurity ions are implanted into the surface of the semiconductor substrate to form a source/drain low concentration impurity region on both sides of the gate electrode in the main surface of the semiconductor substrate. After formation of the emitter electrode, a sidewall spacer is formed on a sidewall of the gate electrode. With the sidewall spacer used as a mask, high concentration impurity ions are implanted into the surface of the semiconductor substrate to form a source/drain high concentration impurity region on both sides of the gate electrode. A protective insulating film is formed on the semiconductor substrate so as to cover the gate electrode, the external base electrode and the emitter electrode. A contact hole for electrical connection is formed in the protective insulating film. An electrode interconnection electrically connected to the field effect transistor and the bipolar transistor is formed through the contact hole.

A method of manufacturing a semiconductor device according to a third aspect of the present invention relates to a method of manufacturing a semiconductor device having a bipolar transistor and a field effect transistor formed on the same semiconductor substrate. A gate insulating film, a first conductor film, and a first insulating film are sequentially formed in a region to form the field effect transistor. An external base electrode having a second insulating film formed thereon is formed in a region to form the bipolar transistor. An external base region and an intrinsic base region are formed in the region to form the bipolar transistor. A first sidewall spacer is formed in connection with the second insulating film on a sidewall of the external base electrode. The first insulating film on the first conductor film is removed. A second conductor film is formed on the semiconductor substrate in contact with the intrinsic base region and the first conductor film. By patterning the second conductor film together with the first conductor film, an emitter electrode is formed in the region to form the bipolar transistor, and a gate electrode is formed in the region to form the field effect transistor. A third insulating film is formed on the entire surface of the semiconductor substrate so as to cover the gate electrode. By selectively etching the third insulating film, a second sidewall spacer is formed on a sidewall of the gate electrode. A protective insulating film is formed on the semiconductor substrate so as to cover the gate electrode, the external base electrode, and the emitter electrode. A contact hole for electrical connection is formed in the protective insulating film. An electrode interconnection electrically connected to the field effect transistor and the bipolar transistor is formed through the contact hole.

A method of manufacturing a semiconductor device according to a fourth aspect of the present invention relates to a method of manufacturing a semiconductor device having a bipolar transistor and a field effect transistor formed on the same semiconductor substrate. A gate insulating film, a first conductor film, and a first insulating film are sequentially formed only in a region to form the field effect transistor. An external base electrode having a second insulating film formed thereon is formed in a region to form the bipolar transistor. An external base region and an intrinsic base region are formed in the region to form the bipolar transistor. A first sidewall spacer is formed in connection with the second insulating film on a sidewall of the external base electrode. The first insulating film on the first conductor film is removed. A second conductor film is formed on the semiconductor substrate in contact with the intrinsic base region and the first conductor film. By etching the second conductor film until the surface of the second insulating film is exposed, an emitter electrode is formed in the region to form the bipolar transistor, and an thick portion of a gate electrode is formed on the first conductor film. With the thick portion of the gate electrode used as a mask, low concentration impurity ions are implanted into the surface of the semiconductor substrate to form a source/drain low concentration impurity region on both sides of the gate electrode in the main surface of the semiconductor substrate. A second sidewall spacer is formed on a sidewall at the thick portion of the gate electrode. With the second sidewall spacer used as a mask, the first conductor film is etched to form a thin portion of the gate electrode overlapping with the source/drain low concentration impurity region. With the second sidewall spacer used as a mask, high concentration impurity ions are implanted into the surface of the semiconductor substrate to form a source/drain high concentration impurity region on both sides of the gate electrode in the surface of the semiconductor substrate. A protective insulating film is formed on the semiconductor substrate so as to cover the gate electrode, the external base electrode, and the emitter electrode. A contact hole for electrical connection is formed in the protective insulating film. An electrode interconnection electrically connected to the field effect transistor and the bipolar transistor is formed through the contact hole.

A manufacturing method according to a fifth aspect of the present invention relates to a method of manufacturing a semiconductor device having a bipolar transistor and a field effect transistor formed on the same semiconductor substrate. A gate insulating film, a first conductor film, and a first insulating film are sequentially formed only in a region to form the field effect transistor. An external base electrode having a second insulating film formed thereon is formed in a region to form the bipolar transistor. An external base region and an intrinsic base region are formed in the region to form the bipolar transistor. A first sidewall spacer is formed in connection with the second insulating film on a sidewall of the external base electrode. The first insulating film on the first conductor film is removed. A second conductor film is formed on the semiconductor substrate in contact with the intrinsic base region and the first conductor film. By etching the second conductor film until the surface of the second insulating film is exposed, an emitter electrode is formed in the region to form the bipolar transistor, and an thick portion of a gate electrode is formed on the first conductor film. The second insulating film on the external base electrode is removed to expose the surface of the external base electrode. With the thick portion of the gate electrode used as a mask, low concentration impurity ions are implanted into the surface of the semiconductor substrate to form a source/drain low concentration impurity region on both sides of the gate electrode in the surface of the semiconductor substrate. A second sidewall spacer is formed on a sidewall of the thick portion of the gate electrode. With the second sidewall spacer used as a mask, the first conductor film is etched to form a thin portion of the gate electrode overlapping with the source/drain low concentration impurity region. With the second sidewall spacer used as a mask, high concentration impurity ions are implanted into the surface of the semiconductor substrate to form a source/drain high concentration impurity region on both sides of the gate electrode in the surface of the semiconductor substrate. The surface of the source/drain high concentration impurity region and the surface of the external base electrode are silicidated. A protective insulating film is formed on the semiconductor substrate so as to cover the gate electrode, the external base electrode, and the emitter electrode. A contact hole for electrical connection is formed in the protective insulating film. An electrode interconnection electrically connected to the field effect transistor and the bipolar transistor is formed through the contact hole.

A manufacturing method according to a sixth aspect of the present invention relates to a method of manufacturing a semiconductor device having a bipolar transistor and a field effect transistor formed on the same substrate. A gate insulating film, a first conductor film, and a first insulating film are sequentially formed only in a region to form the field effect transistor. An external base electrode having a tungsten silicide film and a second insulating film sequentially stacked thereon is formed in a region to form the bipolar transistor. An external base region and an intrinsic base region are formed in the region to form the bipolar transistor. A first sidewall spacer is formed in connection with the second insulating film on a sidewall of the external base electrode. The first insulating film on the first conductor film is removed. A second conductor film is formed on the semiconductor substrate in contact with the intrinsic base region and the first conductor film. By etching the second conductor film until the surface of the second insulating film is exposed, an emitter electrode is formed in the region to form the bipolar transistor, and an thick portion of a gate electrode is formed on the first conductor film. With the thick portion of the gate electrode used as a mask, low concentration impurity ions are implanted into the surface of the semiconductor substrate to form a source/drain low concentration impurity region on both sides of the gate electrode in the surface of the semiconductor substrate. A second sidewall spacer is formed on a sidewall of the thick portion of the gate electrode. With the second sidewall spacer used as mask, the first conductor film is etched to form a thin portion of the gate electrode overlapping with the source/drain low concentration impurity region. With the second sidewall spacer used as a mask, high concentration impurity ions are implanted into the surface of the semiconductor substrate to form a source/drain high concentration impurity region on both sides of the gate electrode in the surface of the semiconductor substrate. A protective insulating film is formed on the semiconductor substrate so as to cover the gate electrode, the external base electrode, and the emitter electrode. A contact hole for electrical connection is formed in the protective insulating film. An electrode interconnection electrically connected to the field effect transistor and the bipolar transistor is formed through the contact hole.

A method according to a seventh aspect of the present invention relates to a method of manufacturing a semiconductor device having a bipolar transistor and a field effect transistor formed on the same semiconductor substrate separately from each other by a field oxide film, and having a polysilicon resistance formed on the field oxide film. A gate insulating film, a first conductor film, and a first insulating film are sequentially formed only in a region to form the field effect transistor. The polysilicon resistance is formed on the field effect transistor, and an external base region is formed in a region to form the bipolar transistor. An external base region and an intrinsic base region are formed in the region to form the bipolar transistor. A first sidewall spacer is formed on a sidewall of the external base electrode. An emitter electrode is formed in the region to form the bipolar transistor. The first insulating film on the first conductor film is removed. A second conductor film is formed on the semiconductor substrate in contact with the intrinsic base region and covering the first conductor film. By patterning the second conductor film together with the first conductor film, an emitter electrode is formed in the region to form the bipolar transistor, and a gate electrode is formed in the region to form the field effect transistor. With the gate electrode used as a mask, low concentration impurity ions are implanted into the surface of the semiconductor substrate to form a source/drain low concentration impurity region on both sides of the gate electrode in the surface of the semiconductor substrate. A sidewall spacer is formed on a sidewall of the gate electrode. With the sidewall spacer used as a mask, high concentration impurity ions are implanted into the surface of the semiconductor substrate to form a source/drain high concentration impurity region on both sides of the gate electrode in the surface of the semiconductor substrate. A protective insulating film is formed on the semiconductor substrate so as to cover the gate electrode, the polysilicon resistance, and the emitter electrode. A contact hole for electrical connection is formed in the protective insulating film. An electrode interconnection electrically connected to the field effect transistor and the bipolar transistor is formed through the contact hole.

A method according to an eighth aspect of the present invention relates to a method of manufacturing a semiconductor device having a bipolar transistor and a field effect transistor formed on the same semiconductor substrate separately from each other by a field oxide film, and having a thin film transistor formed on the field oxide film. A gate insulating film, a first conductor film, and a first insulating film are sequentially formed only in a region to form the field effect transistor. A lower electrode of the thin film transistor is formed on the field oxide film. An external base electrode, an external base region, an intrinsic base region, a drawing-out-portion of a collector, and an emitter region are formed in a region to form the bipolar transistor. The outer surface of the lower electrode is covered with an oxide film. The first insulating film on the first conductor film is removed. A second conductor film is formed on the semiconductor substrate in contact with the intrinsic base region and the drawing-out portion of a collector, covering the lower electrode with the oxide film interposed therebetween, and further in contact with the first conductor film. By patterning the second conductor film together with the first conductor film, an emitter electrode is formed in the region to form the bipolar transistor, an upper electrode of the thin film transistor is formed on the lower electrode, and a gate electrode is formed in the region to form the field effect transistor. With the gate electrode used as a mask, low concentration impurity ions are implanted into the surface of the semiconductor substrate to form a source/drain low concentration impurity region on both sides of the gate electrode in the surface of the semiconductor substrate. A sidewall spacer is formed on a sidewall of the gate electrode. With the sidewall spacer used as a mask, high concentration impurity ions are implanted into the surface of the semiconductor substrate to form a source/drain high concentration impurity region on both sides of the gate electrode in the surface of the semiconductor substrate. A protective insulating film is formed on the semiconductor substrate so as to cover the gate electrode, the upper electrode of the thin film transistor, the external base electrode, and the emitter electrode. A contact hole for electrical connection is formed in the protective insulating film. An electrode interconnection electrically connected to the field effect transistor and the bipolar transistor is formed through the contact hole.

In the semiconductor device according to the first aspect of the present invention, the thickness of the gate electrode of the field effect transistor is made larger than that of the emitter electrode of the bipolar transistor. A semiconductor device having such a structure is manufactured by forming a field effect transistor after completion of a bipolar transistor. Therefore, when a sidewall spacer is formed by reactive ion etching on a sidewall of a gate electrode of the field effect transistor, operating portions of the bipolar transistor is protected by an external base electrode and an emitter electrode. Therefore, the surface thereof is not subjected to reactive ion etching.

In the method of manufacturing a semiconductor device according to the second and the third aspects of the present invention, when the sidewall spacer is formed by reactive ion etching on the sidewall of the gate electrode, operating portions of the bipolar transistor are protected by the external base electrode and the emitter electrode. Therefore, the surface thereof is not subjected to reactive ion etching.

In the method of manufacturing a semiconductor device according to the fourth aspect of the present invention, when the sidewall spacer is formed by reactive ion etching on the sidewall of the gate electrode, operating portions of the bipolar transistor are protected by the external base electrode and the emitter electrode. Therefore, the surface thereof is not subjected to reactive ion etching. Furthermore, a Bi-CMOS is obtained including a field effect transistor having a source/drain region and a gate electrode overlapping with each other.

In the method of manufacturing a semiconductor device according to the fifth aspect of the present invention, when the sidewall spacer is formed by reactive ion etching on the sidewall of the gate electrode, operating portions of the bipolar transistor are protected by the external base electrode and the emitter electrode. Therefore, the surface thereof is not subjected to reactive ion etching. As a result, a Bi-CMOS is obtained in which characteristics of the bipolar transistor are not deteriorated. Furthermore, a Bi-CMOS is obtained including a field effect transistor having a source/drain region and a gate electrode overlapping with each other. In addition, a Bi-CMOS of a low resistance can be obtained since the surface of the source/drain high concentration impurity region and the surface of the external base electrode are silicidated.

In the method of manufacturing the semiconductor device according to the sixth aspect of the present invention, when the sidewall spacer is formed by reactive ion etching on the sidewall of the gate electrode, operating portions of the bipolar transistor are protected by the external base electrode and the emitter electrode. Therefore, the surface thereof is not subjected to reactive ion etching. As a result, a Bi-CMOS can be obtained in which characteristics of the bipolar transistor are not deteriorated. Furthermore, a Bi-CMOS of a low resistance can be obtained since tungsten silicide is formed on the external base electrode.

In the method of manufacturing a semiconductor device according to the seventh aspect of the present invention, when the sidewall spacer is formed by reactive ion etching on the sidewall of the gate electrode, operating portions of the bipolar transistor are protected by the external base electrode and the emitter electrode. Therefore, the surface thereof is not subjected to reactive ion etching. As a result, a Bi-CMOS can be obtained in which characteristics of the bipolar transistor are not deteriorated. Furthermore, a Bi-CMOS including a polysilicon resistance can be obtained since the polysilicon resistance is formed on the field oxide film.

In the method of manufacturing a semiconductor device according to the eighth aspect of the present invention, when the sidewall spacer is formed by reactive ion etching on the sidewall of the gate electrode, operating portions of the bipolar transistor are protected by the external base electrode and the emitter electrode. Therefore, the surface thereof is not subjected to reactive ion etching. As a result, a Bi-CMOS can be obtained in which characteristics of the bipolar transistor are not deteriorated. Furthermore, a Bi-CMOS including a thin film transistor can be obtained since the thin film transistor is formed on the field oxide film.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiment 1

Figure 25:
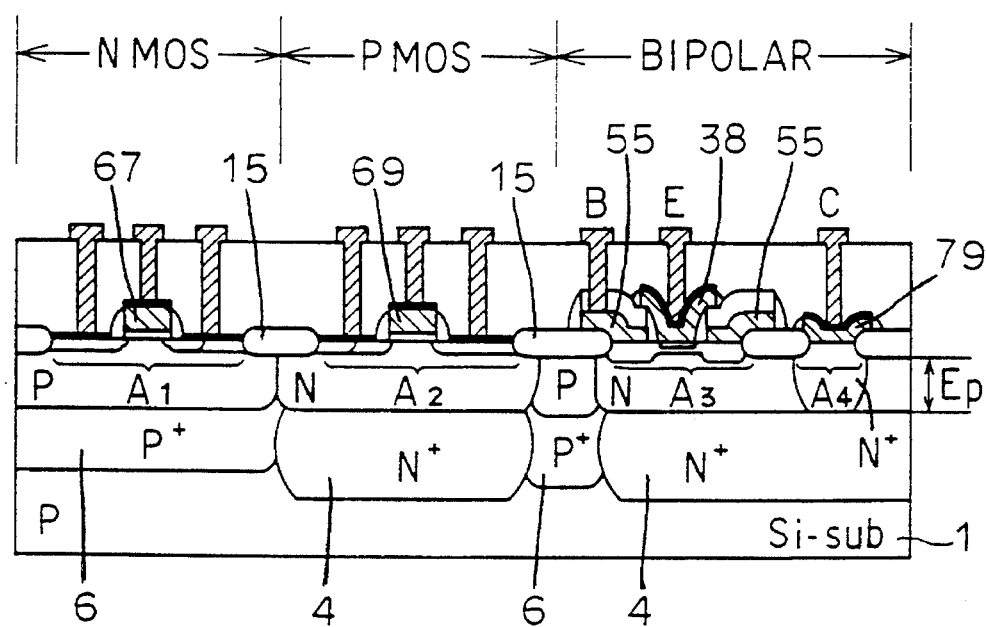
FIG. 25 is a cross sectional view of a Bi-CMOS according to Embodiment 1.

FIG. 25 is a cross sectional view of the Bi-CMOS according to Embodiment 1 of the present invention.

Figure 24:
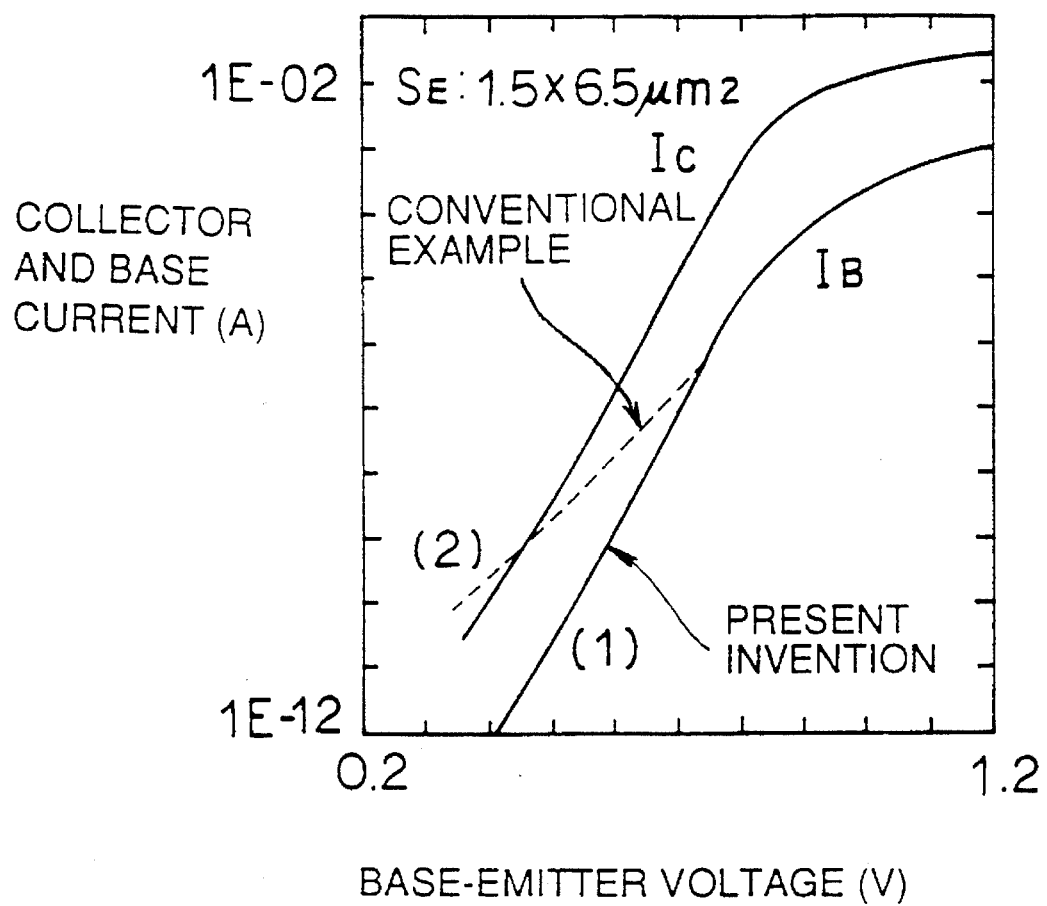
FIG. 24 is a graph showing the relationship between the base-emitter voltage and the collector and base current in a Bi-CMOS.

Referring to FIG. 25, a $P^+$ buried layer 6 and an $N^+$ buried layer 4 are provided in a silicon substrate 1. An epitaxial layer Ep is provided on silicon substrate 1. The epitaxial layer Ep is divided into an active region $A_1$, an active region $A_2$, an active region $A_3$, and an active region $A_4$. An NMOSFET is formed in active region $A_1$, a PMOSFET is formed in active region $A_2$, and a bipolar transistor is formed in active regions $A_3$ and $A_4$. The thickness of gate electrodes 67, 69 of the NMOSFET and the PMOSFET is made larger than that of an emitter electrode 38 of the bipolar transistor. In the Bi-CMOS having such a structure, when a sidewall spacer is formed by a reactive ion etching method on sidewalls of gate electrodes 67, 69, operating portions of the bipolar transistor (the main surface of active region $A_3$ and active region $A_4$) are protected by an external base electrode 55, emitter electrode 38, and a collector electrode 79, as will be described in detail later. Therefore, the surface thereof is hoe subjected to reactive ion etching. As a result, referring to the curve (1) of FIG. 24, the Bi-CMOS can be obtained in which characteristics of the bipolar transistor are not deteriorated.

Description will now be given of a method of manufacturing the Bi-CMOS shown in FIG. 25.

Figure 26:
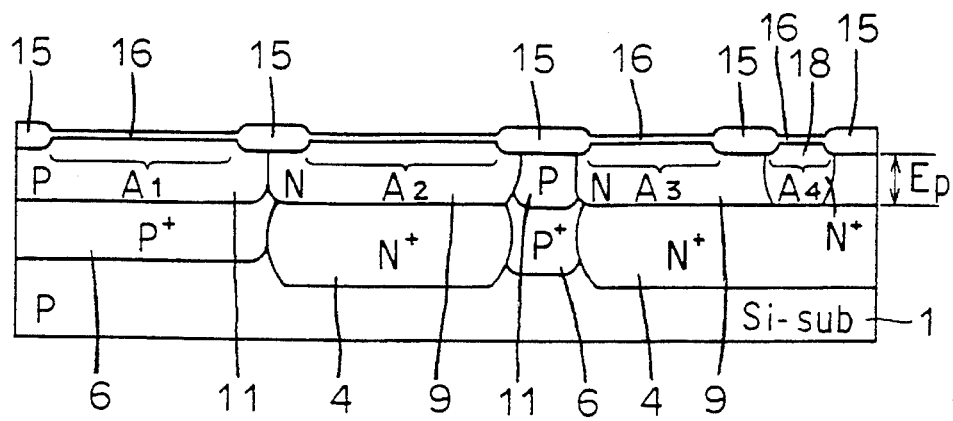
FIGS. 26 to 43 are partial cross sectional views of a semiconductor device in the first to the eighteenth steps of a method of manufacturing the Bi-CMOS according to Embodiment 1.

Referring to FIG. 26, by carrying out the same steps as the conventional steps shown in FIGS. 3 to 9, $P^+$ buried layer 6 and $N^+$ buried layer 4 are formed in silicon substrate 1. The epitaxial layer Ep is formed on silicon substrate 1. A P well 11, an N well 9, P well 11, N well 9, and a drawing-out portion 18 of a collector are formed in the epitaxial layer Ep. By forming a field oxide film 15 in the surface of the epitaxial layer Ep, the epitaxial layer Ep is divided into active region $A_1$, active region $A_2$, active region $A_3$, and active region $A_4$. An oxide film 16 is formed in the surface of active regions $A_1$, $A_2$, $A_3$, and $A_4$. Ions are implanted into the surface of active region $A_1$ and active region $A_2$ for adjusting the threshold value.

Figure 27:
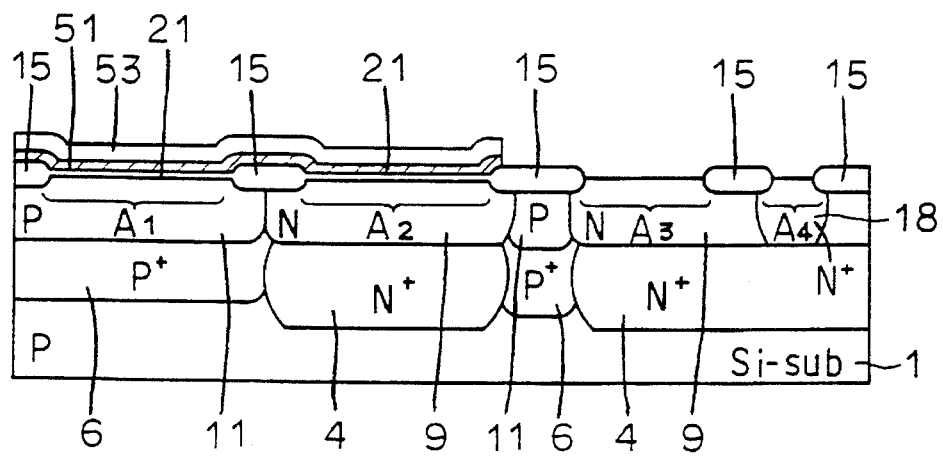

Referring to FIGS. 26 and 27, oxide film 16 on active regions $A_1$, $A_2$, $A_3$, $A_4$ is removed. A gate insulating film 21 of the thickness of 20 nm is formed on the entire surface of silicon substrate 1. A first polycrystalline silicon film 51 of the thickness of 50 nm is formed on the entire surface of silicon substrate 1. An oxide film 53 of the thickness of 20 nm is formed on first polycrystalline silicon film 51. With lithography technology, oxide film 53, first polycrystalline silicon film 51, and gate insulating film 21 are selectively removed to expose the surface of active regions $A_3$, $A_4$.

Figure 28:
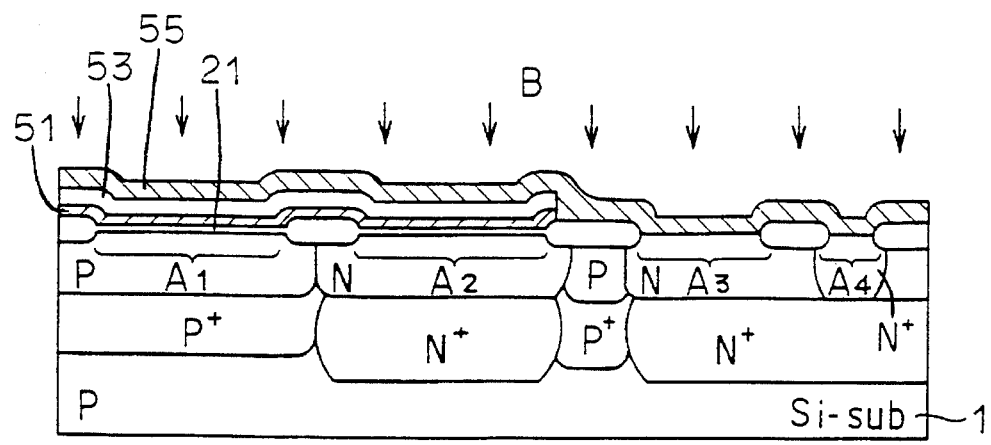

Referring to FIG. 28, a second polycrystalline silicon film 55 is formed on the entire surface of silicon substrate 1 in contact with the surface of active regions $A_3$, $A_4$. Boron is implanted into the surface of second polycrystalline silicon film 55 under conditions of implantation energy of 10 keV, and implantation concentration $4\times10^{15}\text{cm}^{-2}$ so that P-type impurity is left in second polycrystalline silicon film 55.

Figure 29:
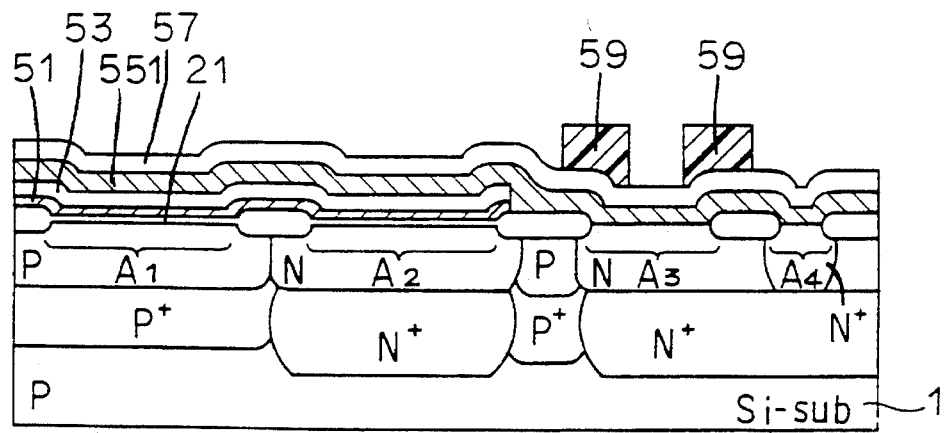

Referring to FIGS. 28 and 29, by an atmospheric pressure CVD method, an oxide film 57 of the thickness of 250 nm is formed on second polycrystalline silicon film 55. A resist pattern 59 is formed on oxide film 57. Resist pattern 59 can be obtained by patterning resist formed on the entire surface of oxide film 57 with lithography technology so that the resist pattern is left only in a region to form the external base electrode of the bipolar transistor.

Figure 30:
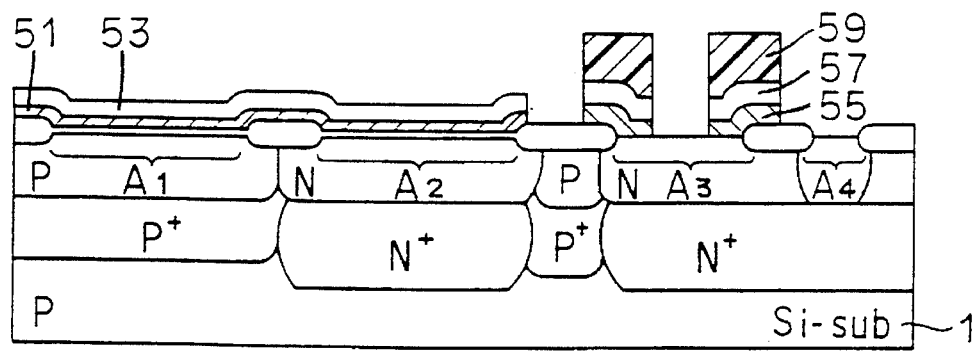

Referring to FIGS. 29 and 30, with resist pattern 59 used as a mask, oxide film 57 and second polycrystalline silicon film 551 are selectively etched to expose part of the surface of active region $A_3$ and the surface of active region $A_4$. Then, resist pattern 59 is removed.

Figure 31:
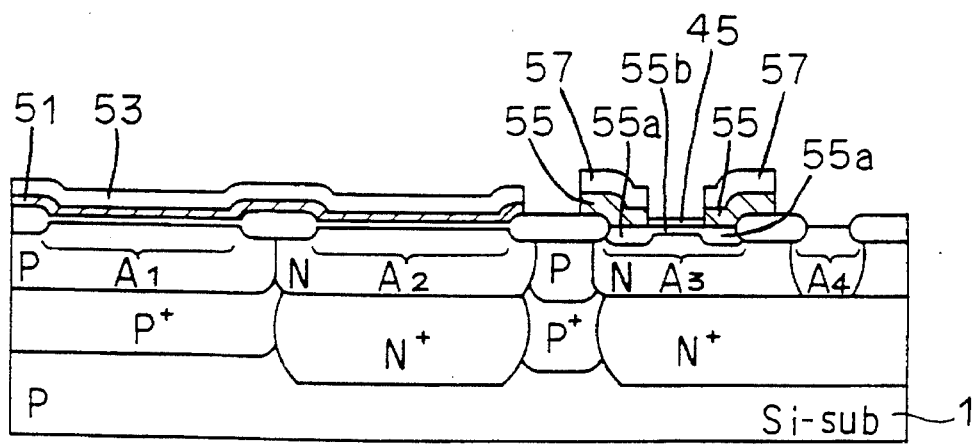

Referring to FIG. 31, the surface of silicon substrate 1 is exposed to the oxygen atmosphere to form an oxide film 45 of the thickness of 8 nm on active region $A_3$. When oxide film 45 is formed, boron included in external base electrode 55 is diffused into active region $A_3$ to form an external base region 55a. Ions of $BF_2$ are implanted into active region $A_3$ under implantation conditions of 20 KeV and $5\times10^{13}\text{cm}^{-2}$, to form an intrinsic base region 55b.

Figure 32:
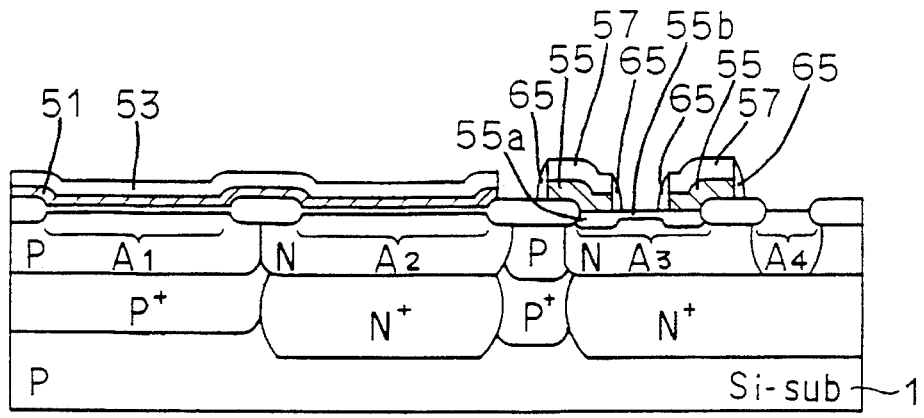
Figure 32:
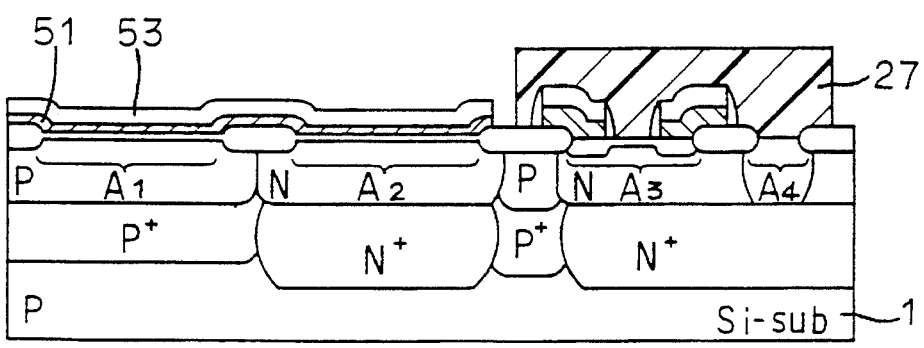

Referring to FIG. 31 and FIG. 32 (a), a TEOS film of the thickness of 250 nm is formed on the entire surface of silicon substrate 1. By etching the film by reactive ion etching, a sidewall spacer 65 is formed on a sidewall of external base electrode 55. At this time, oxide film 45 on active region $A_3$ is also etched away.

Figure 33:
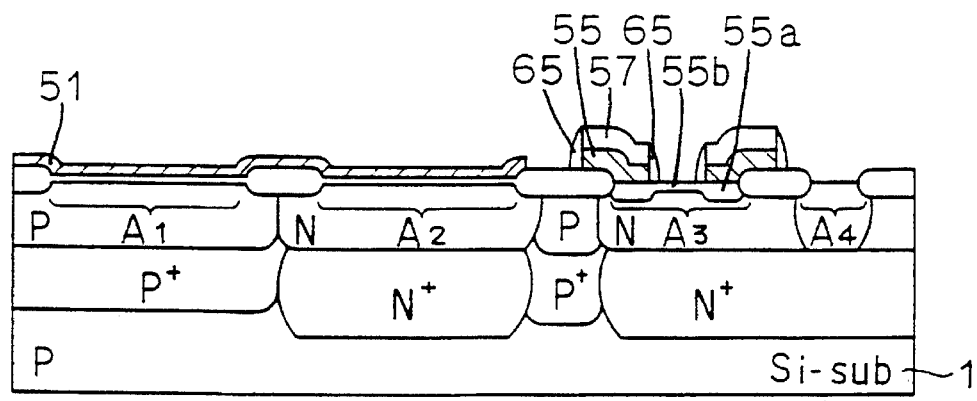

Referring to FIG. 32(b) and FIG. 33, the thick portion of active regions $A_3$, $A_4$ are covered with resist 27. With resist 27 used as a mask, oxide film 53 on active regions $A_1$, $A_2$ is selectively removed.

Figure 34:
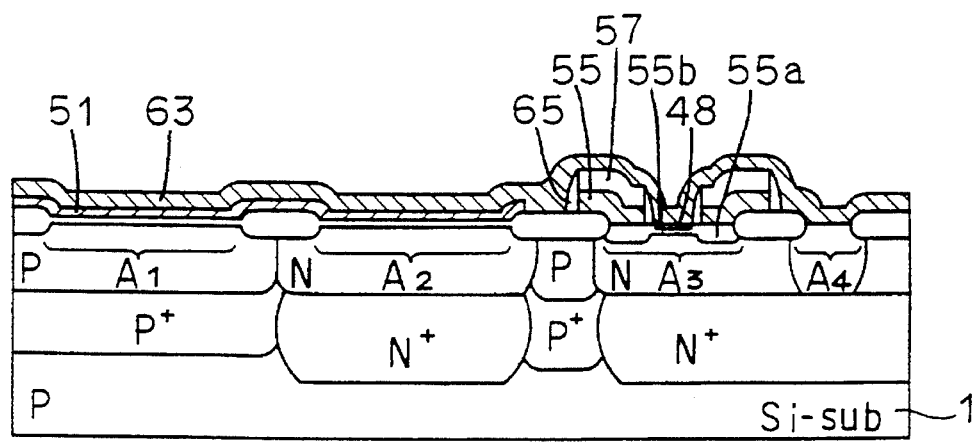

Referring to FIG. 34, a third polycrystalline silicon film 63 is formed on silicon substrate 1 in contact with intrinsic base region 55b and first polycrystalline silicon film 51. Ions of arsenic are implanted into third polycrystalline silicon film 63. Arsenic is diffused into third polycrystalline silicon film 63 at a temperature of approximately 400° C. Then, by carrying out a thermal treatment at 1050° C. for approximately 30 seconds, arsenic is diffused into intrinsic base region 55b to form an emitter region 48.

Figure 35:
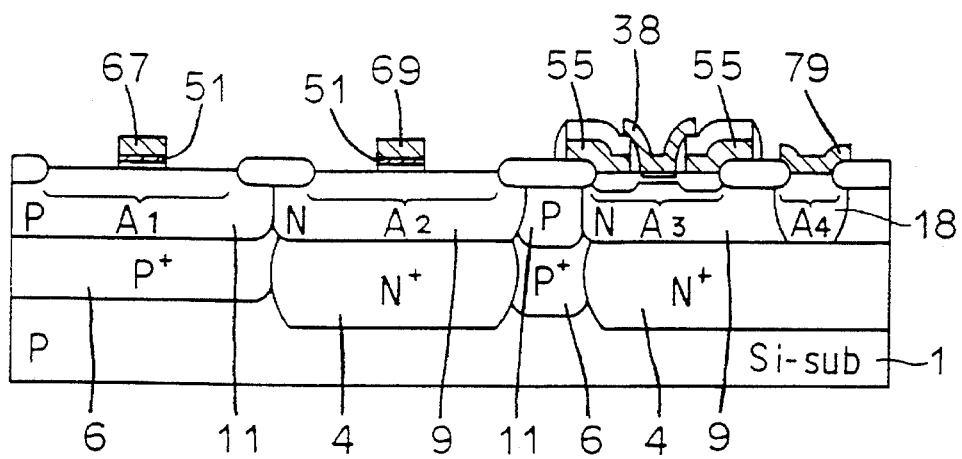

Referring to FIGS. 34 and 35, with lithography technology, third polycrystalline silicon film 63 and first polycrystalline silicon film 51 are patterned to form emitter electrode 38 and collector electrode 79 in a region to form the bipolar transistor, and gate electrodes 67, 69 in regions to form the NMOSFET and the PMOSFET. The film thickness of gate electrodes 67, 69 is made larger than that of emitter electrode 38 by the thickness of first polycrystalline silicon film 51. For simplification of the drawings, hatching of first polycrystalline silicon film 51 is omitted in FIG. 35 et seq. (more specifically, in the figures, the first polycrystalline silicon film and the gate electrode are integrated).

Figure 36:
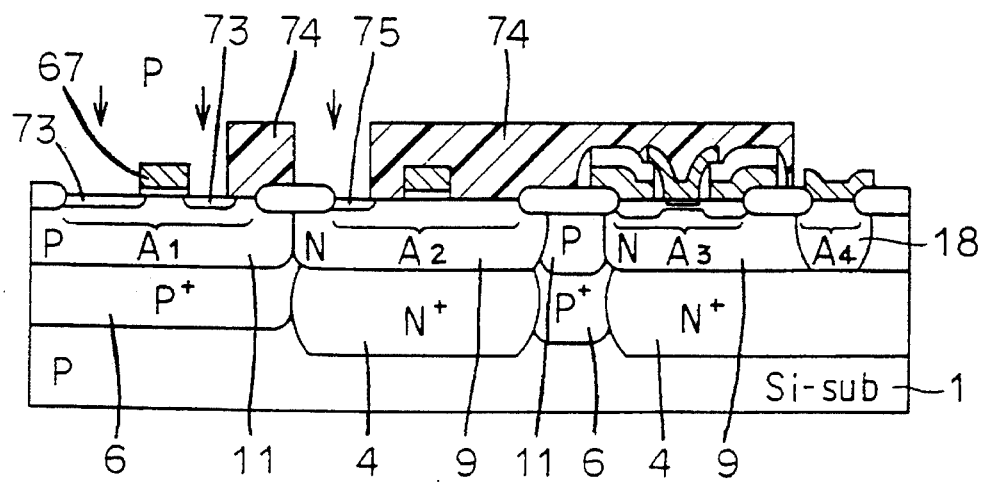

Referring to FIG. 36, a resist pattern 74 covering part of active region $A_1$, part of active region $A_2$, and all of active region $A_3$ is formed on silicon substrate 1. With gate electrode 67 and resist pattern 74 used as a mask, ions of phosphorus are implanted into the surface of silicon substrate 1. By ion implantation of phosphorus, a low concentration impurity region 73, which is an n⁻ type LDD region, is formed on both sides of gate electrode 67 in the surface of active region $A_1$. Simultaneously, a low concentration impurity region 75 is formed in the surface of active region $A_2$. Resist pattern 74 is removed.

Figure 37:
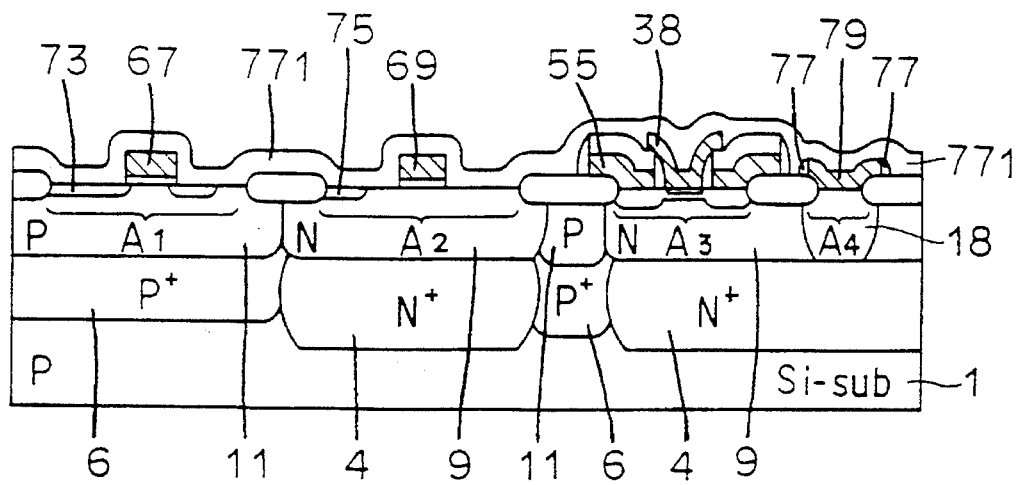
Figure 38:
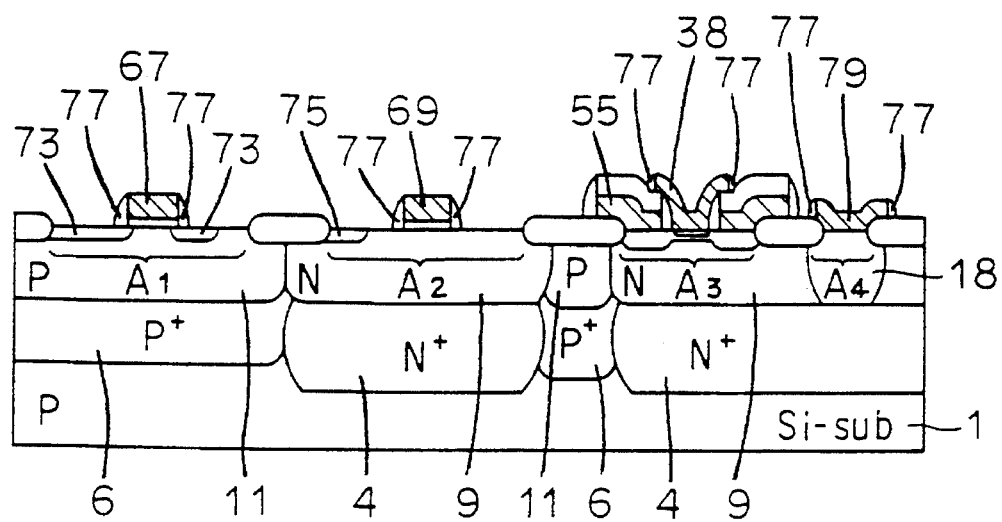

Referring to FIG. 37, a TEOS film 771 is formed on the entire surface of silicon substrate 1. Referring to FIGS. 37 and 38, by anisotropically etching TEOS film 771, sidewall spacers 77 are formed on sidewalls of gate electrodes 67, 69, emitter electrode 38, and collector electrode 79. When sidewall spacers 77 are formed on the sidewalls of gate electrodes 67, 69 by reactive ion etching, operating portions of the bipolar transistor are protected by external base electrode 55, emitter electrode 38 and collector electrode 79. Therefore, the surface thereof is not subjected to reactive ion etching. As a result, referring to FIG. 24, deterioration in characteristics of the bipolar transistor does not occur as conventionally observed.

Figure 39:
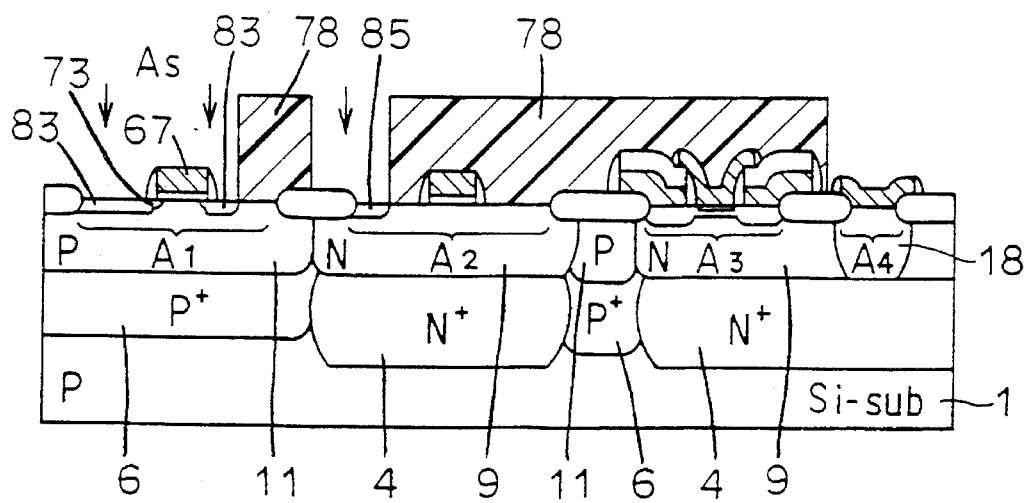

Referring to FIG. 39, a resist pattern 78 having the same pattern as that used in the step of FIG. 36 is formed on silicon substrate 1. With resist pattern 78 used as a mask, ions of arsenic are implanted into the surface of active regions $A_1$, $A_2$. By the ion implantation, a source/drain high concentration impurity region 83 of the NMOSFET is formed. An N-type common electrode 85 is also formed on active region $A_2$. Resist pattern 78 is removed.

Figure 40:
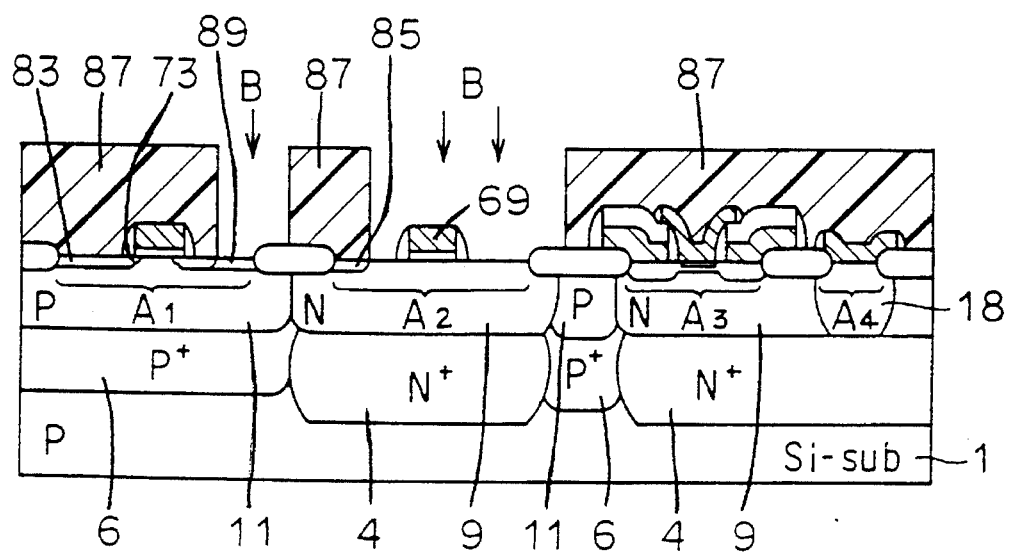
Figure 41:
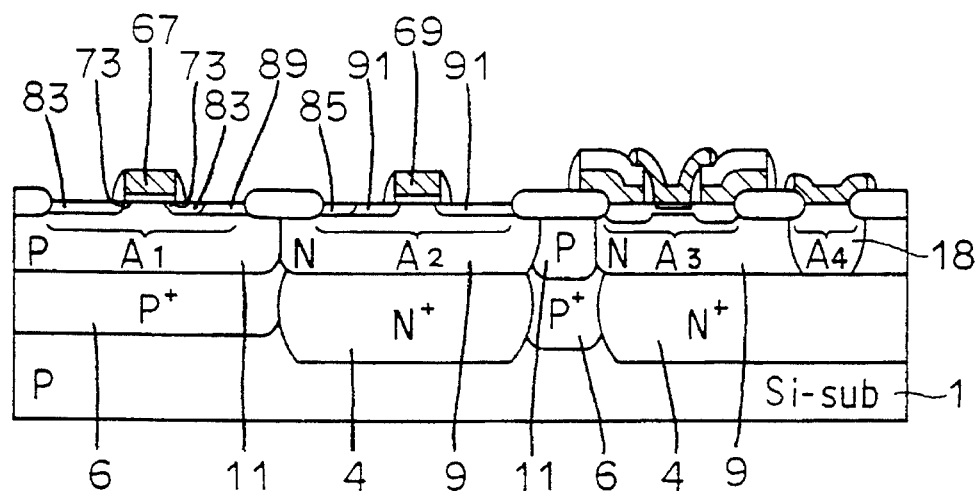

Referring to FIG. 40, a resist pattern 87 having openings to expose part of active region $A_1$ and part of active region $A_2$ is formed on silicon substrate 1. With resist pattern 87 used as a mask, ions of boron are implanted into active regions $A_1$, $A_2$. Then, referring to FIG. 41, by removing resist pattern 87 and carrying out an annealing treatment, an impurity region 91 serving as a source/drain region of the PMOSFET is formed on both sides of gate electrode 69 in the surface of active region $A_2$. A P-type common electrode 89 is also formed in active region $A_1$.

Figure 42:
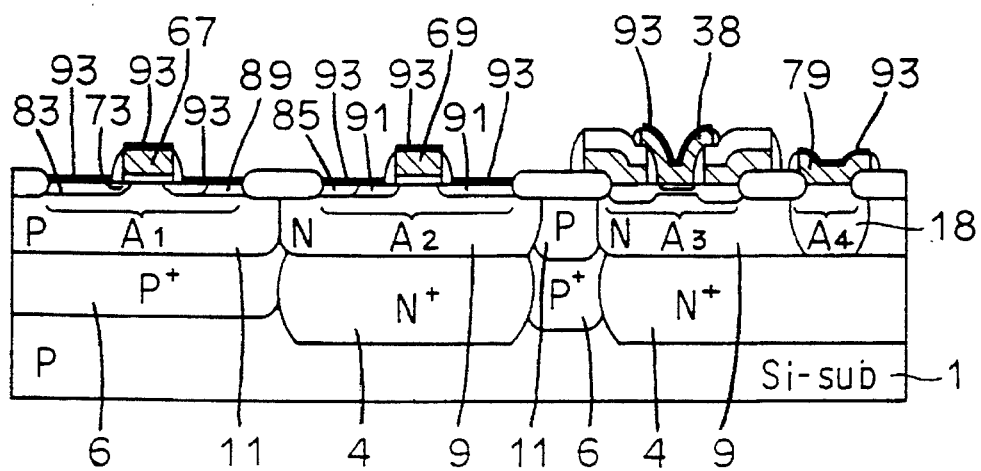

Referring to FIG. 42, the surfaces of high impurity diffusion region 83, gate electrode 67, P-type common electrode 89, N-type common electrode 85, impurity region 91, gate electrode 69, emitter electrode 38, and collector electrode 79 are silicidated with, for example, Ti to form a silicide film 93 thereon. By this silicidation, it is possible to reduce resistances of respective electrodes.

Figure 43:
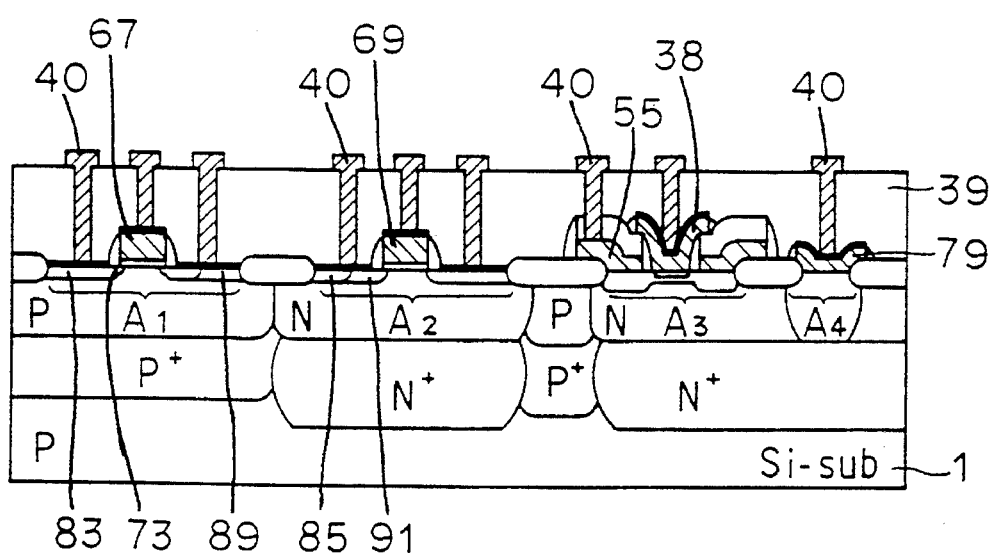

Referring to FIG. 43, a protective insulating film 39 is formed on silicon substrate 1 so as to cover gate electrodes 67, 69, external base electrode 55, emitter electrode 38, and collector electrode 79. A contact hole for electrical connection is formed in protective insulating film 39. By forming an electrode interconnection 40 electrically connected to the NMOSFET, the PMOSFET, and the bipolar transistor through the contact hole, the Bi-CMOS device is completed.

Embodiment 2

In the manufacturing method according to Embodiment 1, oxide film 43 is deposited on first polysilicon layer 51. Therefore, referring to FIGS. 32(b), 33 and 34, before depositing third polysilicon film 63 on silicon substrate 1, oxide film 53 must be removed with lithography technology (in this case, technology to form resist pattern 27 with photolithography). In this embodiment, a method of manufacturing the Bi-CMOS is disclosed in which the step of the lithography technology can be omitted.

Figure 44:
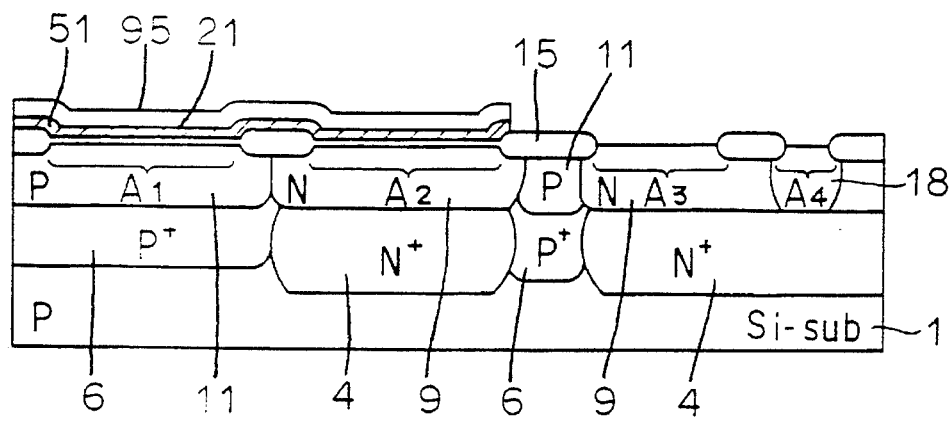
FIGS. 44 to 47 are partial cross sectional views of a semiconductor device in the first to the fourth steps of a method of manufacturing a Bi-CMOS according to Embodiment 2.

Referring to FIG. 44, similar to Embodiment 1, after formation of field oxide film 15 and gate oxide film 21, first polycrystalline silicon film 51 is formed on the entire surface of silicon substrate 1. A nitride film 95 is formed on first polycrystalline silicon film 51. A titanium nitride film may be formed on polycrystalline silicon film 51 in place of nitride film 95. By selectively etching nitride film 95, first polycrystalline silicon film 51, and gate oxide film 21, the surface of active regions $A_3$, $A_4$ is exposed as shown in the figure.

Figure 45:
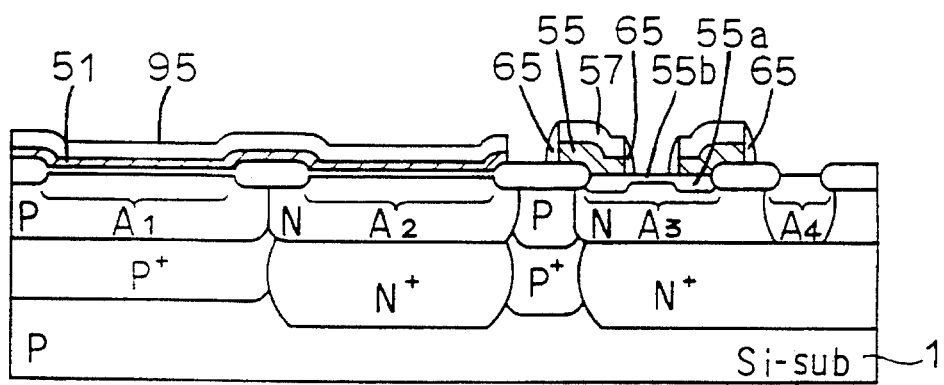

Then, by carrying out the same steps as those shown in FIGS. 28 to 32(a), a semiconductor device shown in FIG. 45 is obtained.

Figure 46:
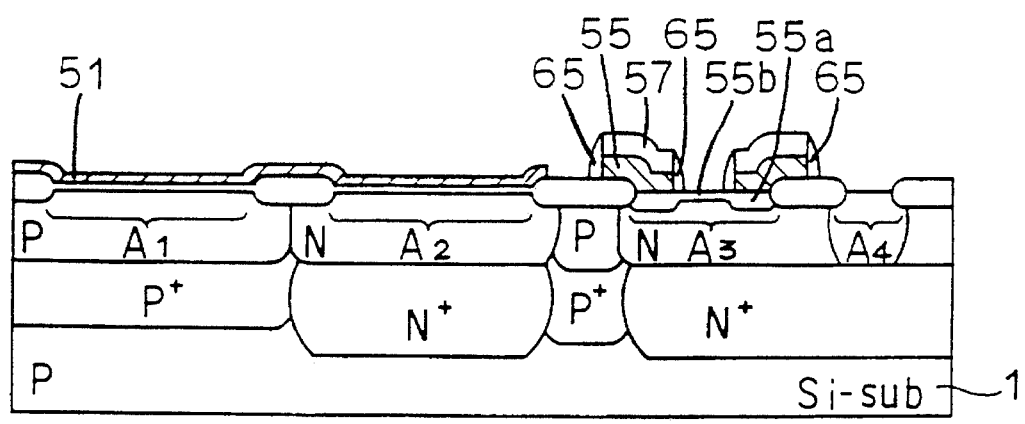

Referring to FIGS. 45 and 46, nitride film 95 is removed with hot phosphoric acid (in the case where the film is formed of titanium nitride, sulfuric acid and hydrogen peroxide are used). In this step, oxide films 65, 57 do not dissolve in hot phosphoric acid. Therefore, technology to cover the side of the bipolar transistor with resist, that is, lithography technology is not needed.

Figure 47:
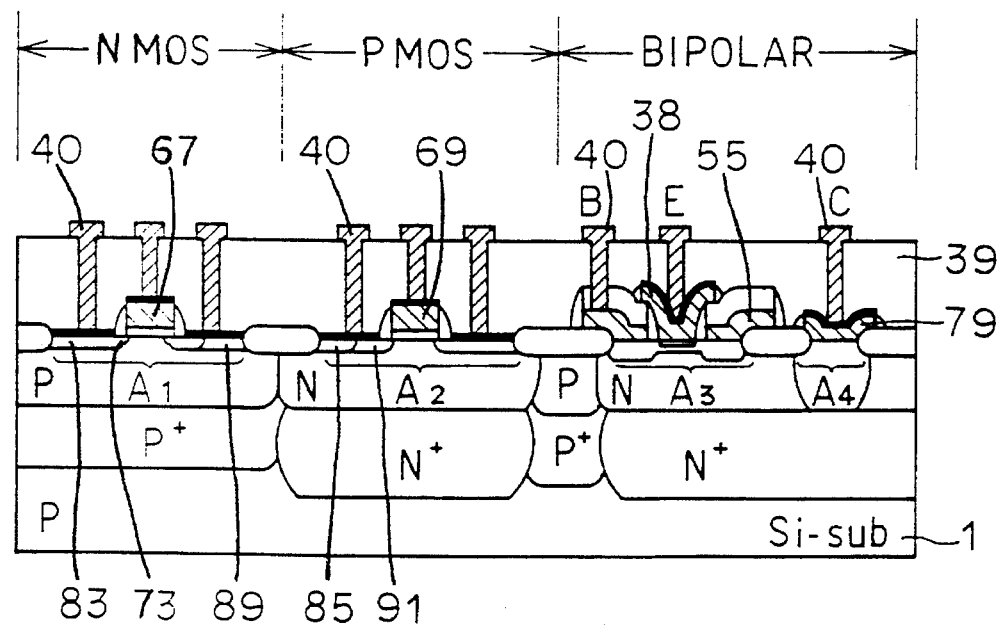

Then, by carrying out the steps similar to those of FIGS. 34 to 43, the Bi-CMOS is completed. A cross section of the completed Bi-CMOS is shown in FIG. 47.

Embodiment 3

Figure 48:
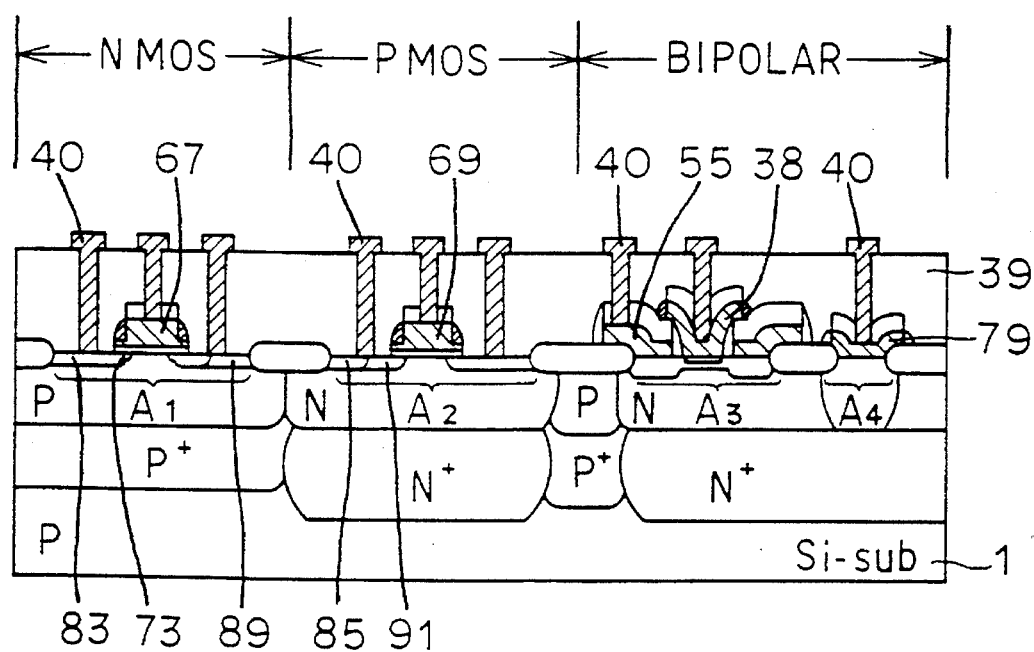
FIG. 48 is a cross sectional view of a Bi-CMOS according to Embodiment 3.

FIG. 48 is a cross sectional view of the Bi-CMOS according to Embodiment 3. This embodiment is characterized in that source/drain low concentration impurity region 73 of an LDD structure overlaps with gate electrode 67 in the NMOSFET. By thus structured, the carrier density of the surface of the n⁻ layer (73) can be controlled to some extent by gate electrode 67. As a result, even if impurity concentration of the n⁻ layer (73) is lowered, mutual conductance is less likely to be reduced by series resistance of the n⁻ layer (73), and device characteristics are less likely to be changed by hot electrons implanted into the oxide film on the n⁻ layer (73). Since impurity concentration of the n⁻ layer (73) can be lowered, the electric relaxation effect is increased. It is also possible to make the n⁻ diffusion layer (73) shallow, whereby the short channel effect can be made small, and punch through is less likely to occur. Description will be given of a method of manufacturing the Bi-CMOS shown in FIG. 48.

Figure 49:
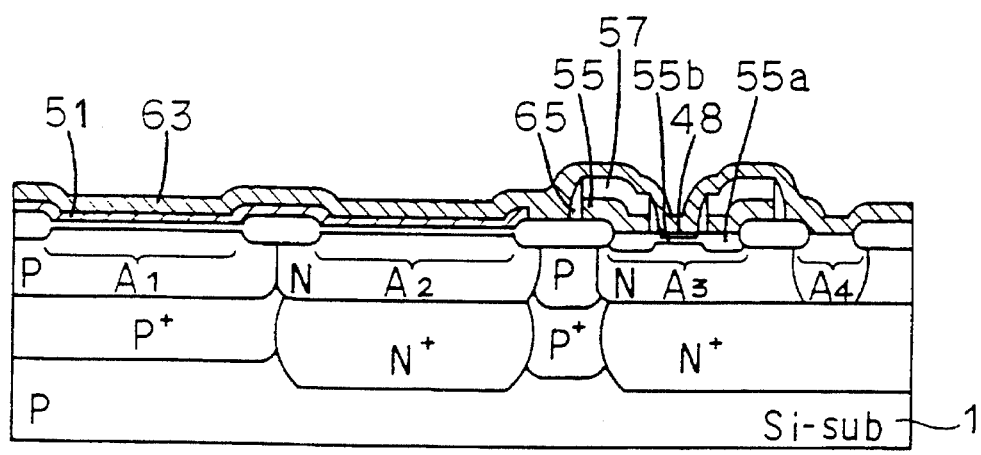
FIGS. 49 to 55 are partial cross sectional views of a semiconductor device in the first to the seventh steps of a method of manufacturing the Bi-CMOS according to Embodiment 3.

Similar to Embodiment 1, a semiconductor device shown in FIG. 49 is formed by carrying out the steps shown in FIGS. 26 to 34.

Figure 50:
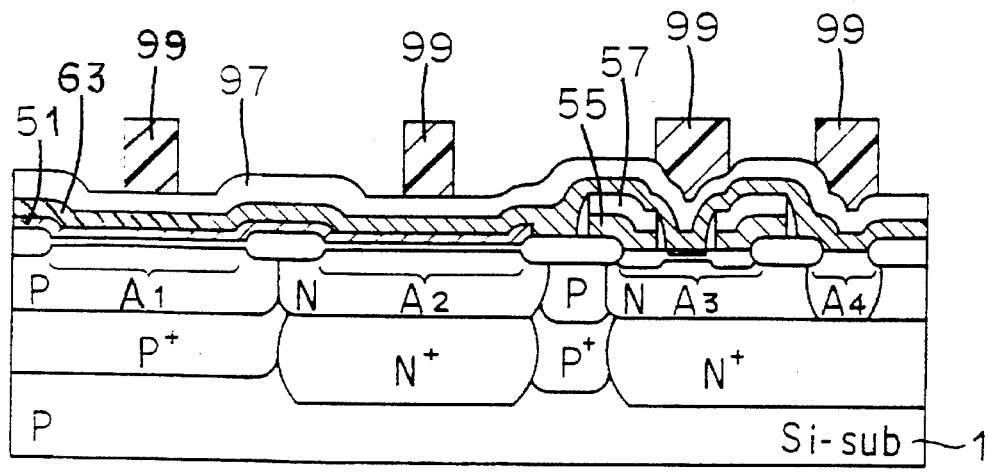

Referring to FIG. 50, a TEOS film 97 is formed on third polycrystalline silicon film 63. Then, a resist pattern 99 is formed having a pattern existing on regions to form the gate electrode of the NMOSFET, the gate electrode of the PMOSFET, and the emitter electrode of the bipolar transistor on TEOS film 97.

Figure 51:
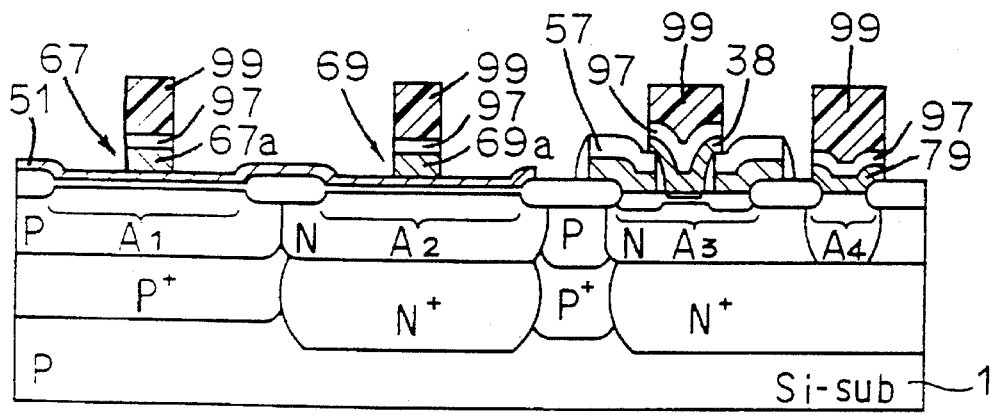

Referring to FIGS. 50 and 51, with resist pattern 99 used as a mask, TEOS film 97 and third polycrystalline silicon film 63 are anisotropically etched. The anisotropic etching is stopped when the surface of oxide film 57 having external base electrode 55 formed thereon is exposed. Therefore, first polycrystalline silicon film 51 is not removed by this etching. By this etching, thick portions 67a, 69a of gate electrodes 67, 69 are formed, and emitter electrode 38 and collector electrode 79 are further formed. Then, resist pattern 99 is removed.

Figure 52:
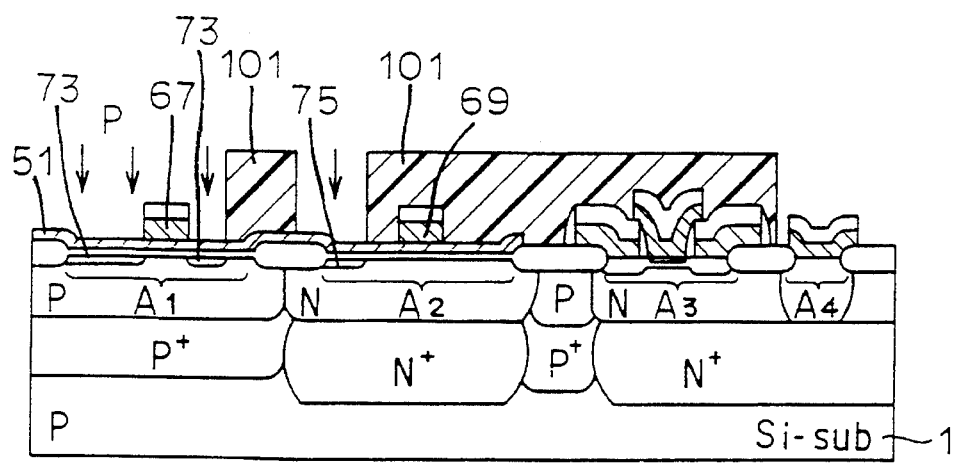

Referring to FIG. 52, resist pattern 101 to cover part of active region $A_1$, part of active region $A_2$, and all of active region $A_3$ is formed on silicon substrate 1.

With resist pattern 101 and gate electrode 67 used as a mask, ions of phosphorus are implanted into active regions $A_1$, $A_2$ to form a source/drain low concentration impurity region 73, and to form a low concentration impurity region 75 in part of active region A$_2$. Ion implantation of phosphorus is carried out through second polycrystalline silicon film 51. Therefore, it is necessary to increase an accelerating voltage as compared to conditions in Embodiment 1. Resist pattern 101 is removed.

Figure 53:
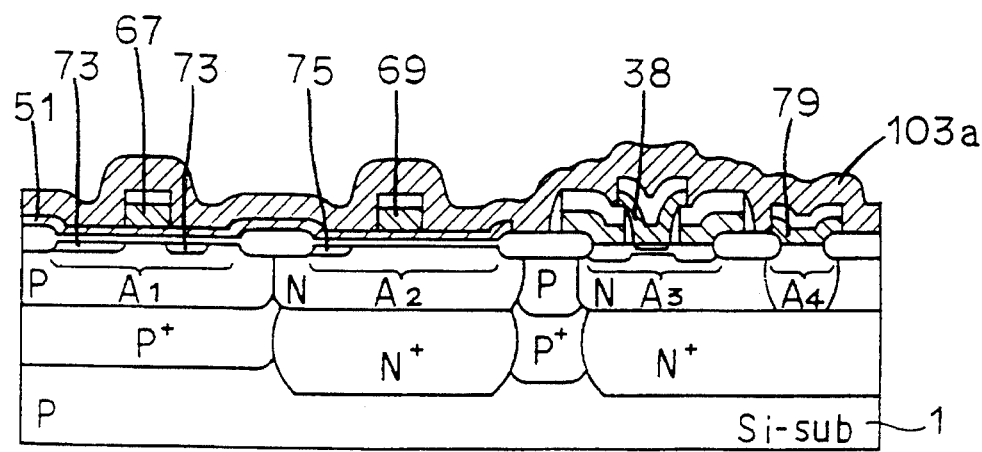
Figure 54:
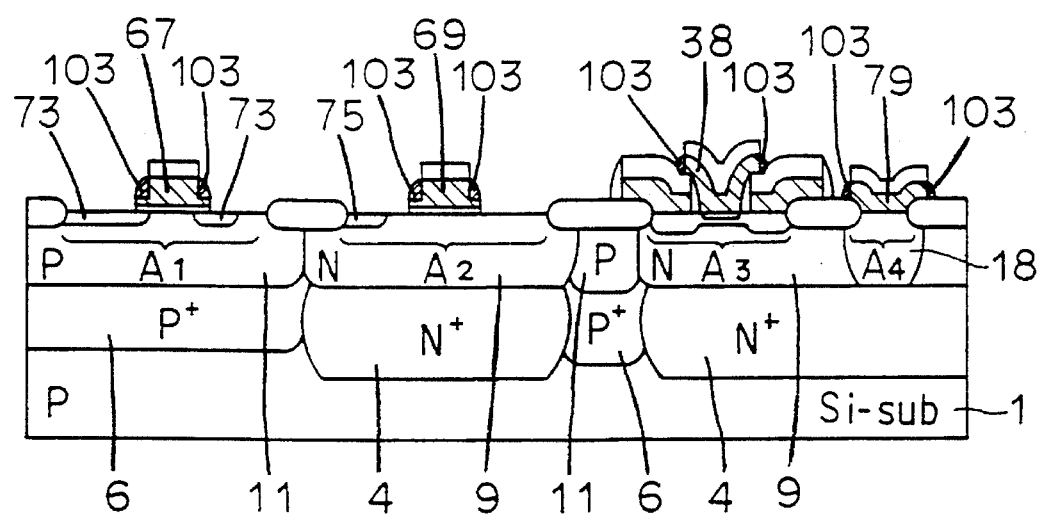
Figure 55:
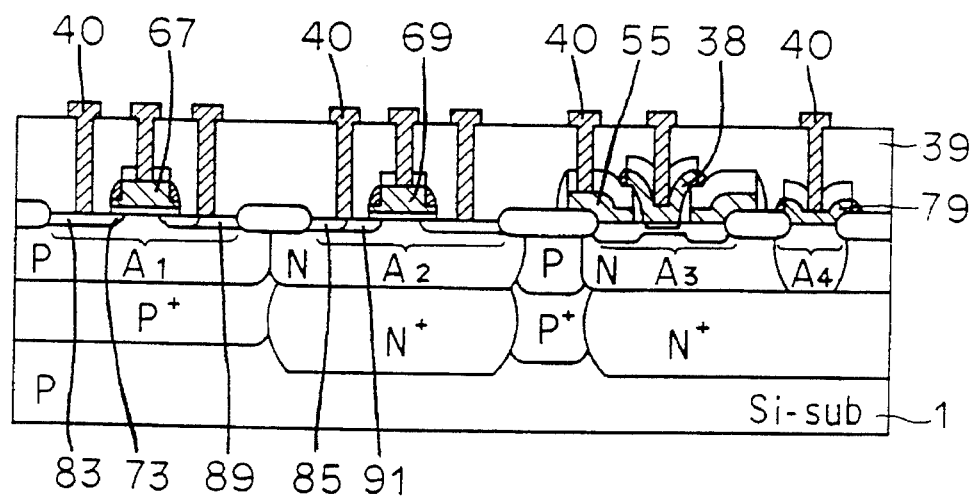

Referring to FIGS. 52 and 53, a polycrystalline silicon film (or a high melting point metal film) 103a is formed on the entire surface of silicon substrate 1. Referring to FIGS. 53 and 54, by anisotropically etching polycrystalline silicon film 103a, sidewall spacers 103 of polycrystalline silicon are formed on sidewalls of gate electrodes 67, 69, emitter electrode 38, and collector electrode 79. Then, arsenic implantation similar to the step shown in FIG. 39 and boron implantation similar to the step shown in FIG. 40 are carried out. Then, referring to FIG. 55, protective insulating film 39 is formed, and a contact hole is formed in protective insulating film 39 to form electrode interconnection 40.

According to this embodiment, referring to FIGS. 50 and 51, since the surface of oxide film 57 of a different material is exposed at the time of completion of etching of third polycrystalline film 63, detection of the end point of etching is facilitated.

Embodiment 4

Figure 56:
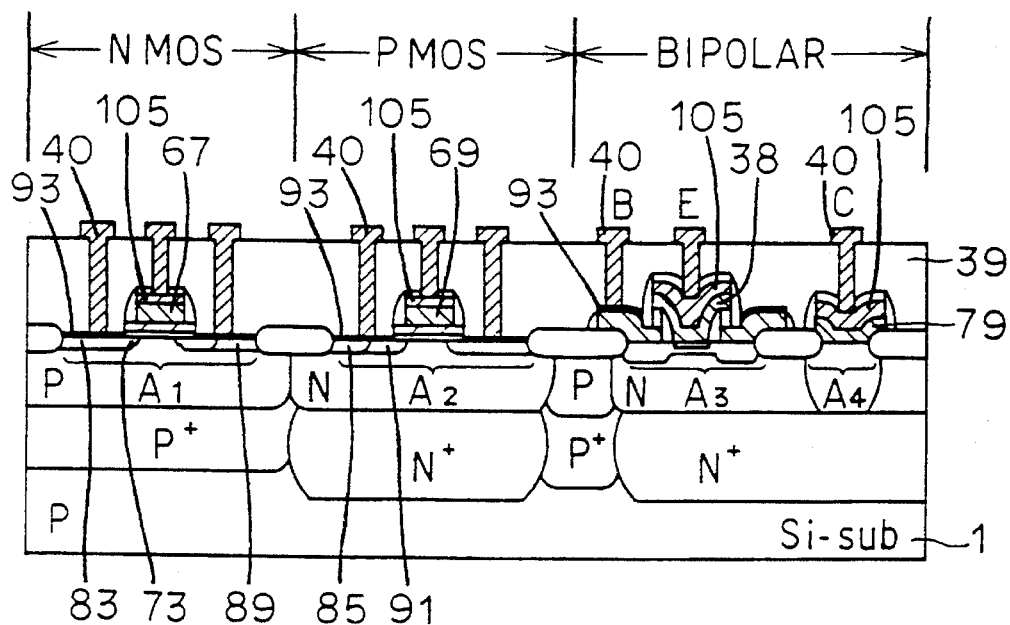
FIG. 56 is a cross sectional view of a Bi-CMOS according to Embodiment 4.

FIG. 56 is a cross sectional view of the Bi-CMOS according to Embodiment 4. Embodiment 4 is different from Embodiment 1 in that the gate electrode is overlapped with the source/drain LDD structure, and in that the surface of external base electrode 55 is silicidated. By silicidation of the surface (93) of external base electrode 55, the base resistance of the bipolar transistor is reduced, resulting in high performance. Description will be given of a method of manufacturing the Bi-CMOS according to Embodiment 4.

Figure 57:
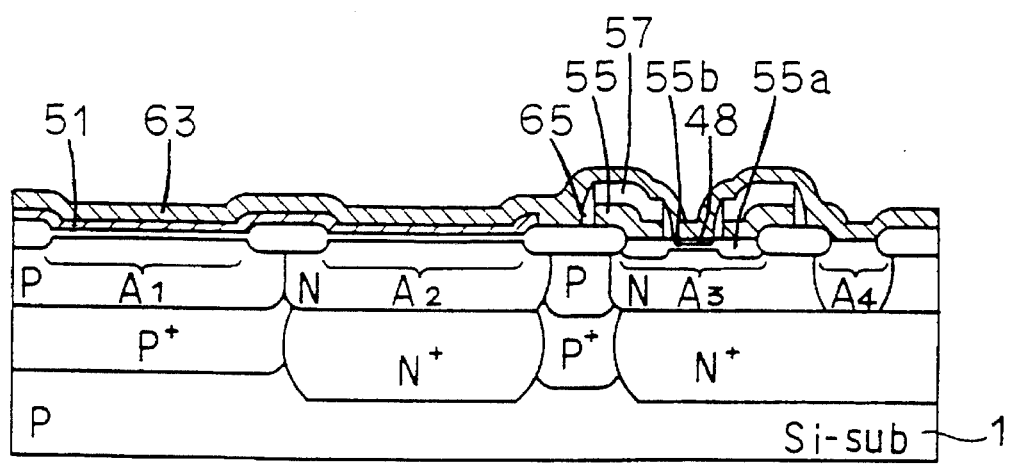
FIGS. 57 to 68 are partial cross sectional views of a semiconductor device in the first to the twelfth steps of a method of manufacturing the Bi-CMOS according to Embodiment 4.

A semiconductor device shown in FIG. 57 is obtained by carrying out the steps similar to those shown in FIGS. 26 to 34.

Figure 58:
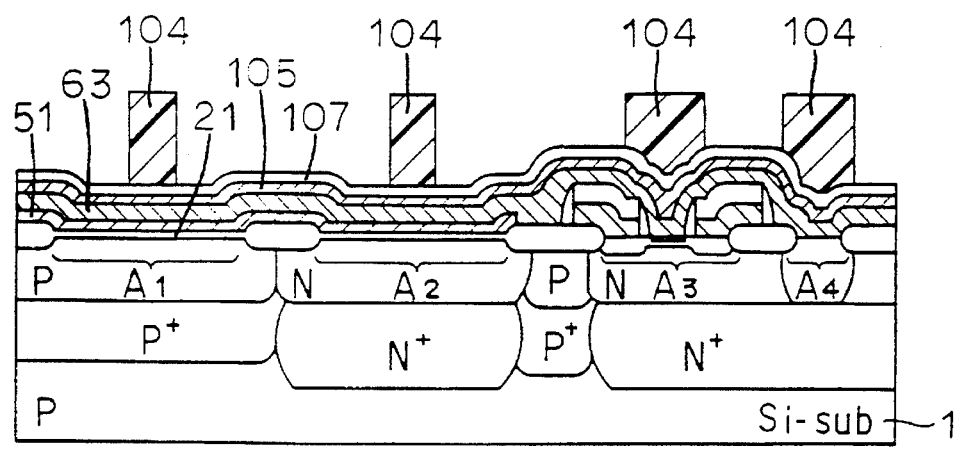

Referring to FIGS. 57 and 58, a tungsten silicide film 105 is formed on the entire surface of third polycrystalline silicon film 63 by sputtering. A TEOS film 107 is formed on tungsten silicide film 105. Resist pattern 104 is formed having a pattern existing in an thick portion of elements to be formed, that is, the gate electrode of the NMOS, the gate electrode of the PMOS, the emitter electrode and the collector electrode, on TEOS film 107.

Figure 59:
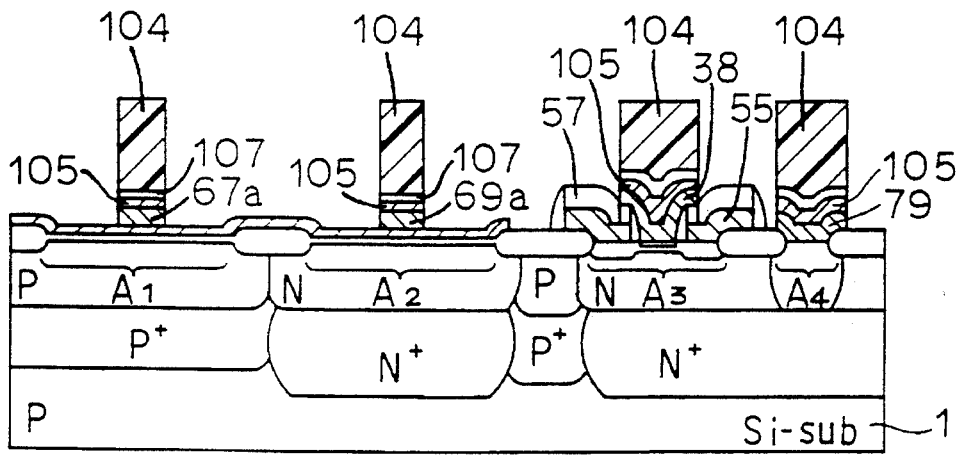

Referring to FIGS. 58 and 59, with resist pattern 104 used as a mask, TEOS film 107, tungsten silicide film 105, and third polycrystalline silicon film 63 are selectively etched to form thick portions 67a, 69a of the gate electrodes, emitter electrode 38, and collector electrode 79. The etching is stopped when the surface of insulating film 57 on external base electrode 55 is exposed. Since a material of polycrystalline silicon film 63 is different from that of insulating film 57, detection of the end point of etching is easy. Therefore, control of the thickness of first polycrystalline silicon film 51 is facilitated.

Figure 60:
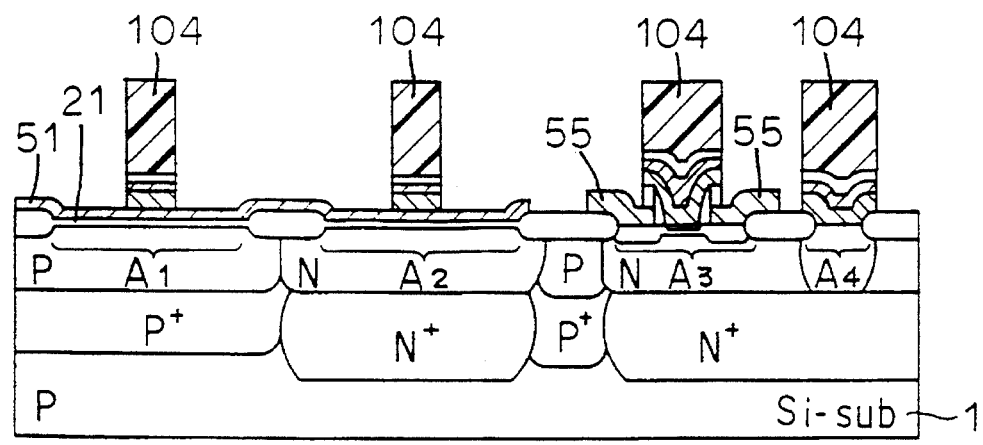

Referring to FIGS. 59 and 60, the oxide film on external base electrode 55 and the oxide film on the sidewall of external base electrode 55 are removed by dry etching, thereby exposing the surface of external base electrode 55.

Figure 61:
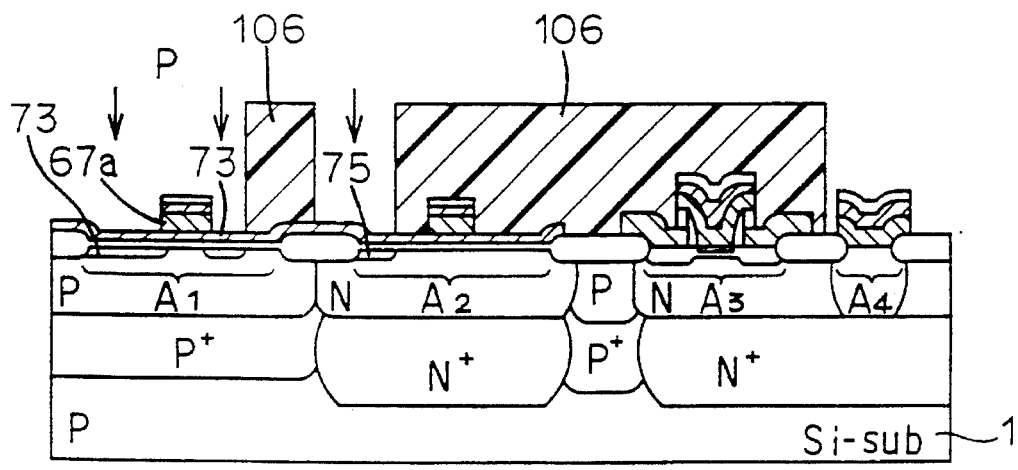

Referring to FIG. 61, resist pattern 106 for exposing part of active region A$_1$, and part of active region A$_2$ is formed on silicon substrate 1. With resist pattern 106 and thick portion 67a of the gate electrode used as a mask, ions of phosphorus are implanted into active regions A$_1$, A$_2$. As a result, a source/drain low concentration impurity region 73 and a low concentration impurity region 75 are formed. Then, resist pattern 106 is removed.

Figure 62:
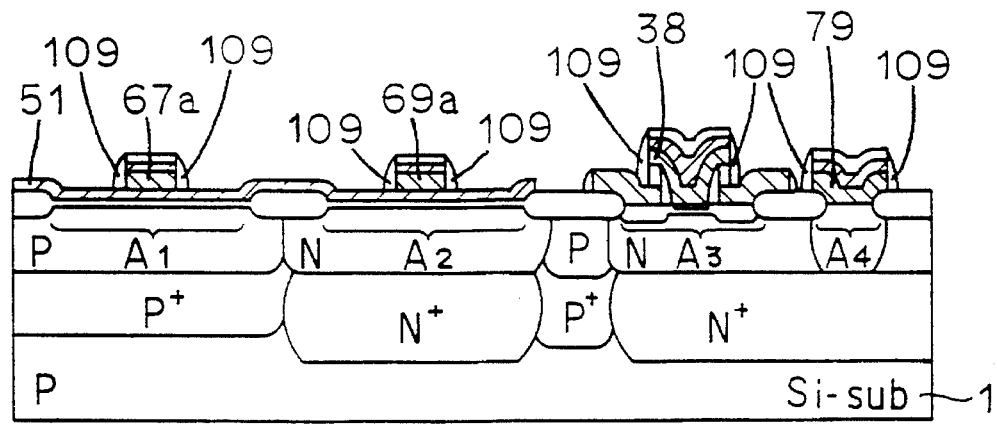

Referring to FIG. 62, a sidewall oxide film 109 of TEOS is formed on sidewalls of thick portions 67a, 69a of the gate electrodes, emitter electrode 38, and collector electrode 79. Sidewall oxide film 109 is formed by forming a TEOS film on silicon substrate 1 so as to cover thick portions 67a, 69a of the gate electrodes, emitter electrode 38, and collector electrode 79 and by anisotropically etching the TEOS film.

Figure 63:
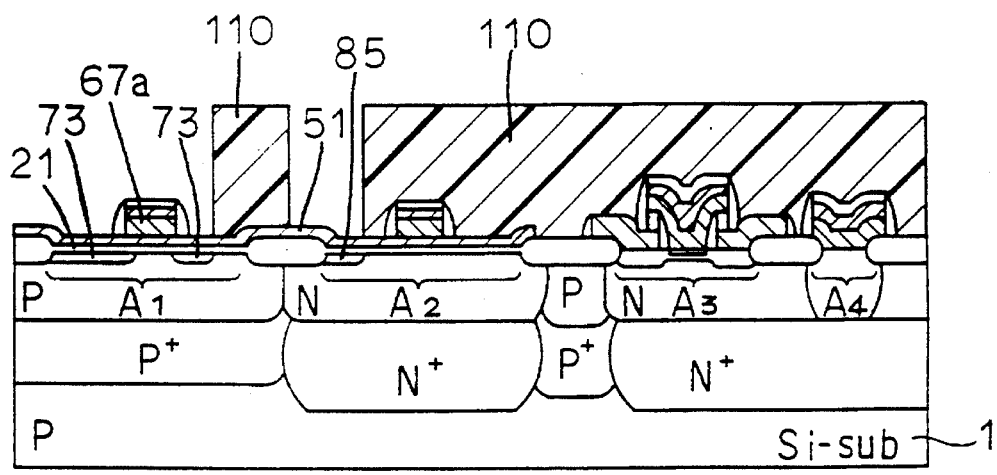

Referring to FIG. 63, a resist pattern 110 having a pattern similar to that used in the step of FIG. 61 is formed on silicon substrate 1.

Figure 64:
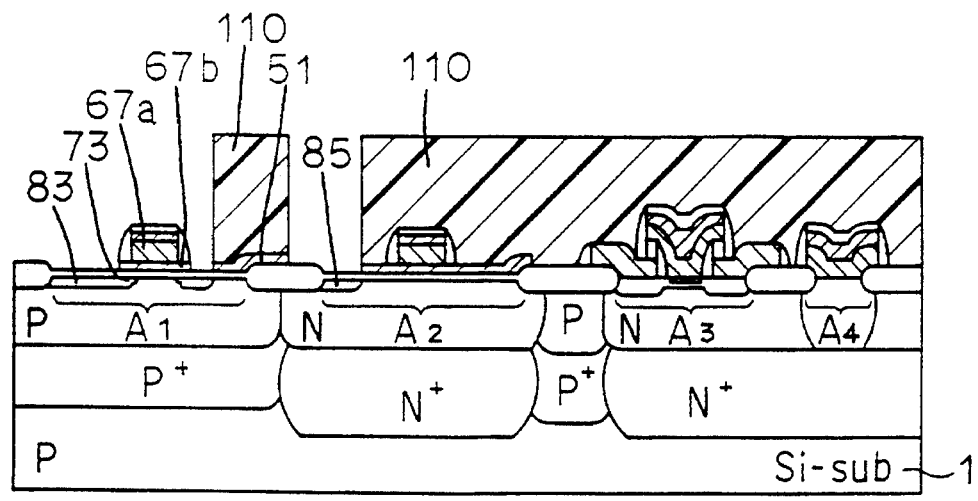

Referring to FIGS. 63 and 64, first polycrystalline silicon film 51 is etched with resist pattern 110 used as a mask to form a thin portion 67b of gate electrode 67 overlapping with source/drain low concentration impurity region 73. By implanting ions of arsenic of high concentration into the surface of silicon substrate 1 with resist pattern 110 used as a mask, a source/drain high concentration impurity region 83 is formed in active region A$_1$, and an N-type common electrode 85 is formed in active region A$_2$. Then, resist pattern 110 is removed.

Figure 65:
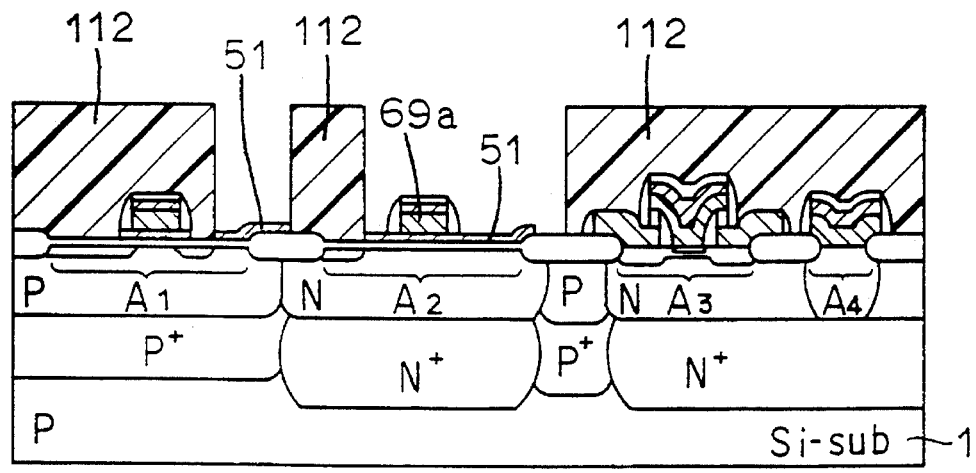
Figure 66:
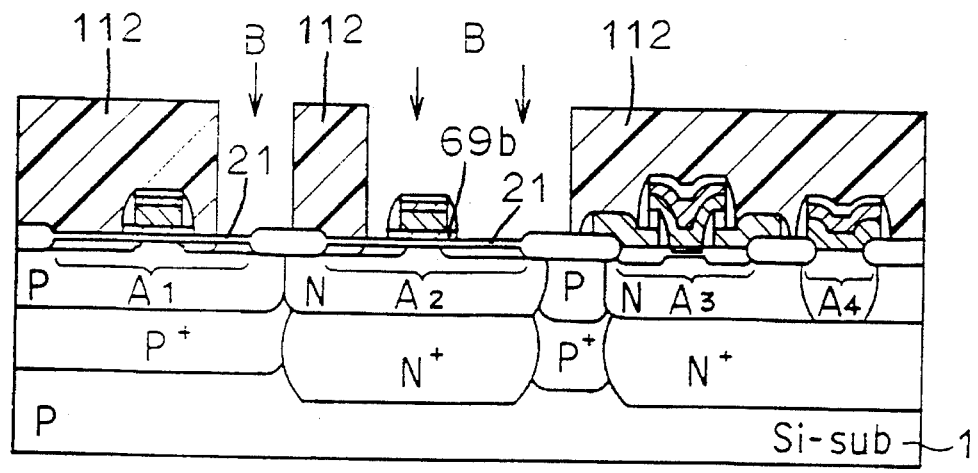

Referring to FIGS. 65 and 66, a resist pattern 112 having a pattern for exposing part of active region A$_1$ and part of active region A$_2$ is formed. With resist pattern 112 and gate electrode 69 used as a mask, first polycrystalline silicon film 51 is etched away. As a result, a thin portion 69b of the gate electrode is formed. Then, by implanting ions of boron of high concentration into the surface of silicon substrate 1 with resist pattern 112 used as a mask, a high concentration impurity region 91 is formed in active region A$_2$, and a P-type common electrode 89 is formed in the surface of active region A$_1$. Then, resist pattern 112 is removed. By carrying out a thermal treatment, the implanted impurity ions are activated. Then, gate insulating film 21 is selectively etched away.

Figure 67:
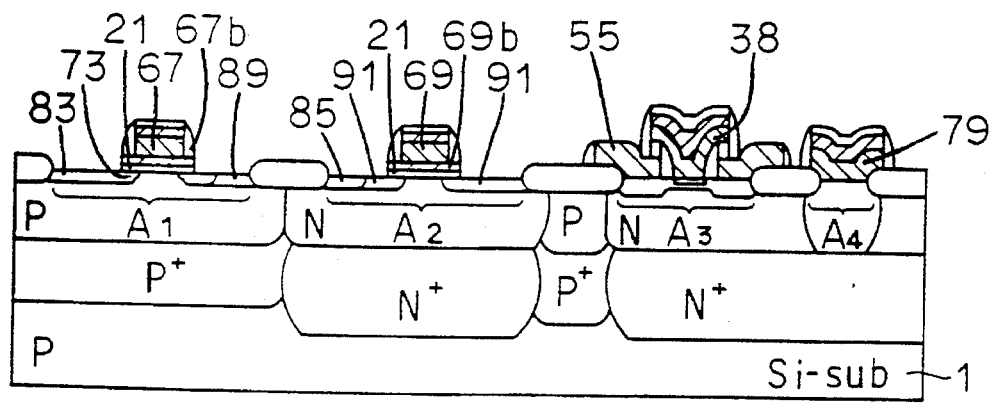
Figure 68:
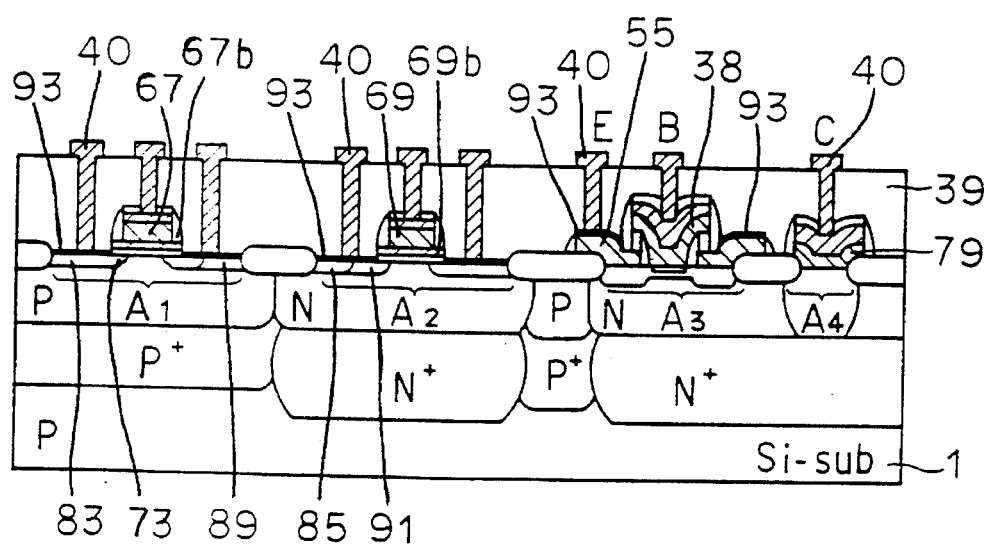

Referring to FIGS. 67 and 68, by depositing a high melting point metal such as titanium on the entire surface of silicon substrate 1 by sputtering and carrying out a thermal treatment, a silicide film 93 is formed on high concentration impurity region 83, P-type common electrode 89, N-type common electrode 85, impurity region 91, and external base electrode 55. Protective insulating film 39 is formed on silicon substrate 1 so as to cover gate electrodes 67, 69, external base electrode 55, emitter electrode 38, and collector electrode 79. A contact hole for electrical connection is formed in protective insulating film 39. Electrode interconnection 40 electrically connected to the NMOSFET, the PMOSFET, and the bipolar transistor is formed through the contact hole.

Embodiment 5

Referring to FIGS. 67 and 68, there is a possibility in Embodiment 4 that sidewall surfaces of thin portions 67b, 69b of gate electrodes 67, 69 are simultaneously silicidated when the surface of external base electrode 55, and source/drain regions 89, 91 are silicidated. Therefore, if gate insulating film 21 is thin, silicide in the surface of source/drain regions 89, 91 may creep up to thin portions 67b, 69b of gate electrodes 67, 69, which in turn causes source/drain regions 89, 91 and gate electrodes 67, 69 to be shorted, respectively.

Embodiment 5 is improved so as to prevent such shorting.

Figure 69:
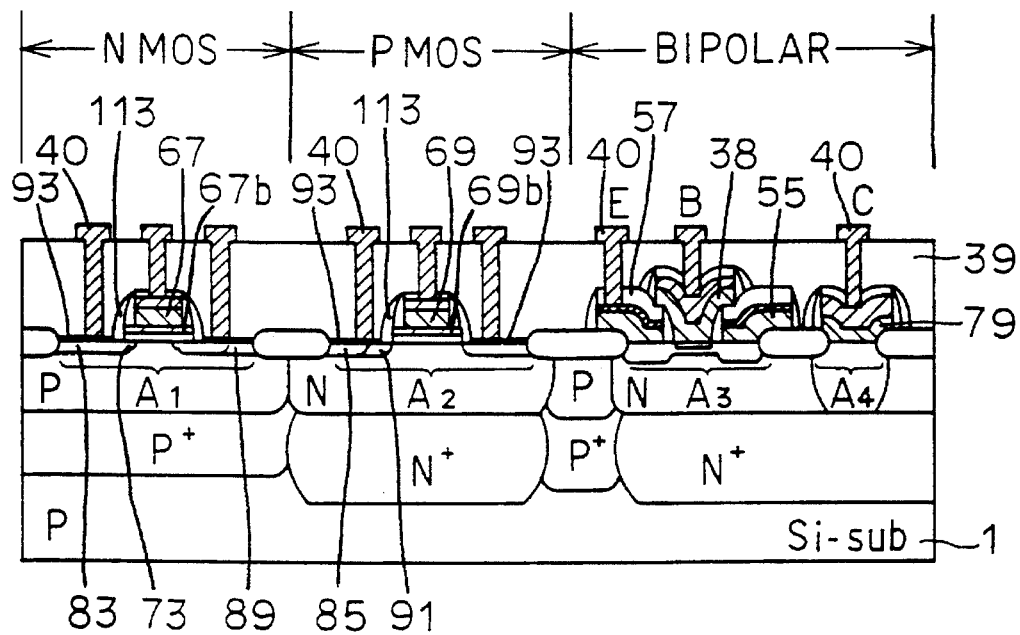
FIG. 69 is a cross sectional view of a Bi-CMOS according to Embodiment 5.

FIG. 69 is a cross sectional view of the Bi-CMOS according to Embodiment 5. This embodiment is first characterized in that a sidewall oxide film 113 is formed so as to cover thin portions 67b, 69b of gate electrodes 67, 69. The second characteristic is that external base electrode 55 is structured in two layers of second polycrystalline silicon film 55 and tungsten silicide film 111. The third characteristic is that oxide film 57 is left on external base electrode 55.

Referring to FIG. 69, in the NMOSFET, an n⁺ region (89) and gate electrode 67 do not overlap with each other. On the other hand, n⁻ region 73 and gate electrode 67 overlap with each other. Therefore, GIDL (Gate Induced Drain Leakage Current), which is problematic when the gate insulating film is thin, is reduced.

Description will now be given of a method of manufacturing the Bi-CMOS shown in FIG. 69.

Figure 70:
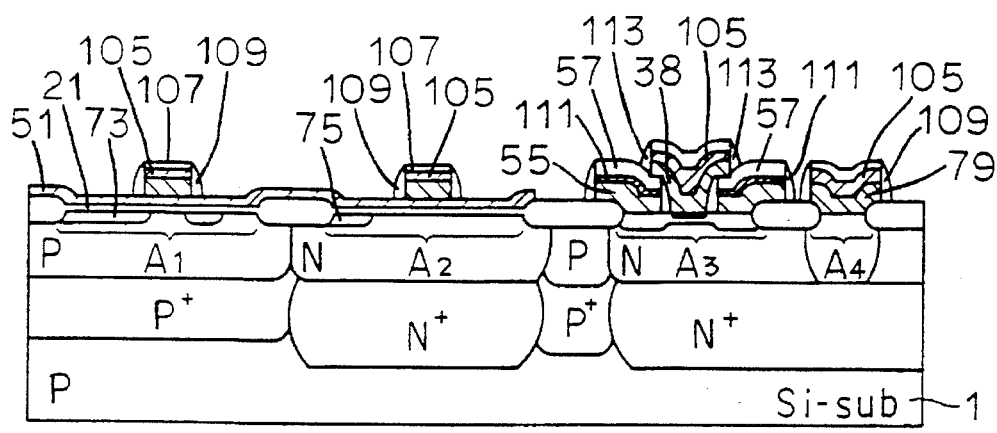
FIGS. 70 to 73 are partial cross sectional views of a semiconductor device in the first to the fourth steps of a method of manufacturing the Bi-CMOS according to Embodiment 5.

A semiconductor device shown in FIG. 70 is formed by carrying out the same steps as those shown in FIGS. 57 to 62.

Figure 71:
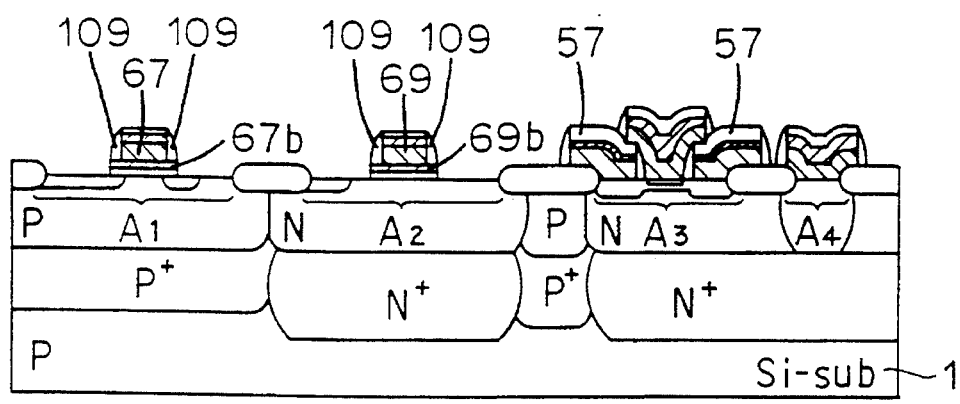

Referring to FIGS. 70 and 71, first polycrystalline silicon film 51 is selectively and anisotropically etched. Then, gate oxide film 21 is selectively etched away.

Figure 72:
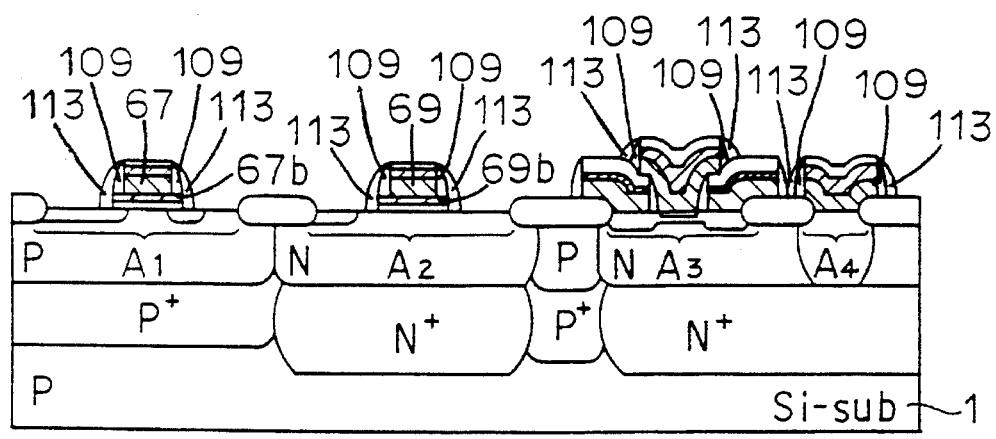

Referring to FIG. 72, a sidewall oxide film 113 is formed so as to cover a sidewall of sidewall oxide film 109 and to cover end portions of thin portions 67b, 69b of the gate electrodes. Sidewall oxide film 113 is formed by forming a TEOS film on the entire surface of silicon substrate 1 to anisotropically etch the TEOS film.

Figure 73:
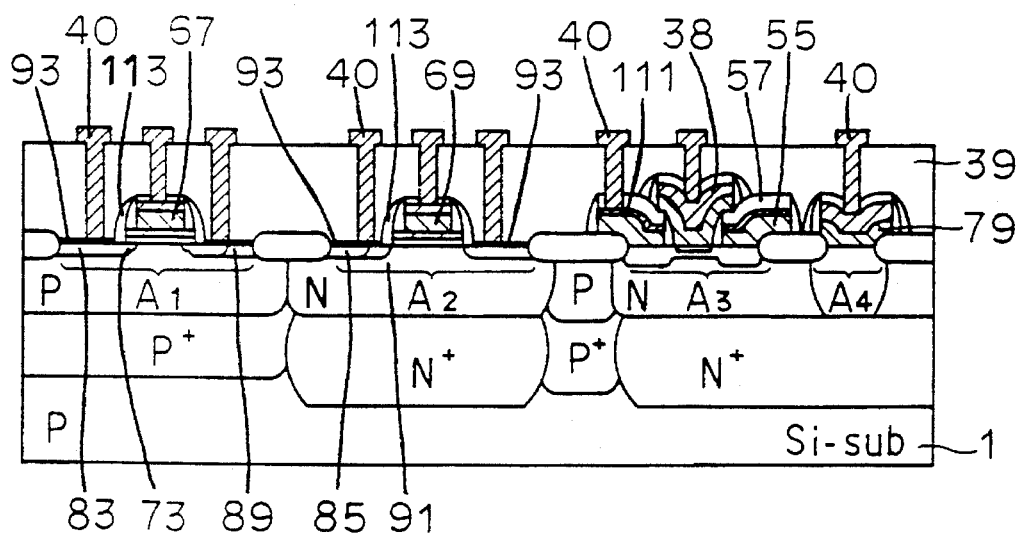

Referring to FIG. 73, silicide film 93 is formed on the surface of source/drain regions 89, 91. Since sidewall oxide film 113 exists at this time, silicide film 93 and gate electrodes 67, 69 are not shorted.

Then, protective insulating film 39 is formed on silicon substrate 1 so as to cover gate electrodes 67, 69, external base electrode 55, emitter electrode 38, and collector electrode 79. A contact hole for electrical connection to the bipolar transistor and the CMOSFET (NMOS +PMOS) is formed in protective insulating film 39. Electrode interconnection 40 electrically connected to the NMOSFET, the PMOSFET, and the bipolar transistor is formed through the contact hole.

According to this embodiment, since tungsten silicide film 111 is formed in advance on external base electrode 55, similar to Embodiment 4, the step of removing oxide film 57 on external base electrode 55 is not needed.

Although the case where an N⁺-type polycrystalline silicon film is used for the gate electrode (refer to FIG. 34 and the description thereof) was illustrated in the above embodiments, the present invention is not limited thereto. With lithography technology, a P⁺-type polycrystalline silicon film may be formed in the PMOS as a gate electrode, and an N⁺-type polycrystalline silicon film may be formed in the NMOS as the gate electrode.

In the above embodiments, a LOCOS method was used for isolating elements. However, the present invention is not limited thereto, and elements may be isolated by trench isolation.

If the gate electrode, the emitter electrode, and the external base electrode structured in two layers of high melting point metal silicide and polysilicon are used, the effects similar to those of the above embodiments can be expected.

Although, referring to FIG. 49, the case where collector electrode 79 is formed as a patterned electrode at the time of formation of emitter electrode 38 was illustrated in the above embodiments, the present invention is not limited thereto. More specifically, in place of formation of a patterned collector electrode, a contact hole leading to drawing-out portion 18 of a collector may be formed in protective insulating film 39 to directly connect electrode interconnection 40 to drawing-out portion 18 of a collector therethrough.

In the above embodiments, a method was illustrated in which annealing was carried out at a high temperature for a short time at the time of formation of the emitter of the bipolar to reduce the emitter resistance. However, the present invention is not limited thereto. Thermal treatments can be carried out en bloc after depositing the protective insulating film.

Embodiment 6

This embodiment relates to a method of manufacturing the Bi-CMOS improved so that the number of the steps of lithography technology can be reduced by one, similar to Embodiment 2.

Figure 1:
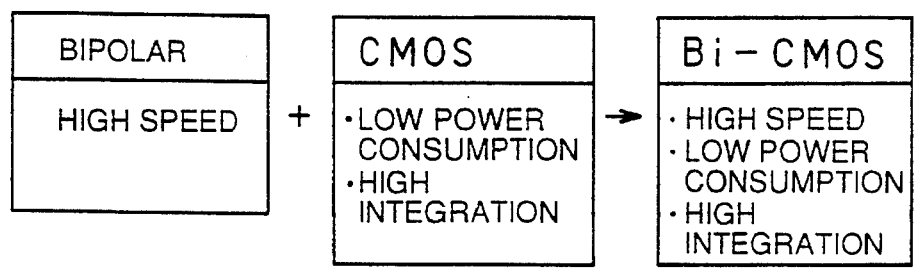
FIG. 1 is a diagram for explaining that a Bi-CMOS is formed in combination of a bipolar transistor and a CMOS.
Figure 2:
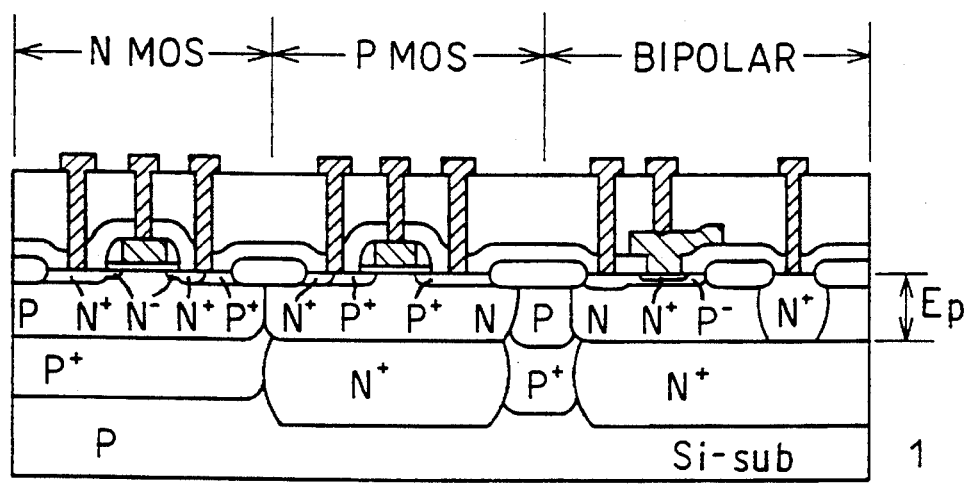
FIG. 2 is a cross sectional view of a conventional Bi-CMOS.
Figure 3:
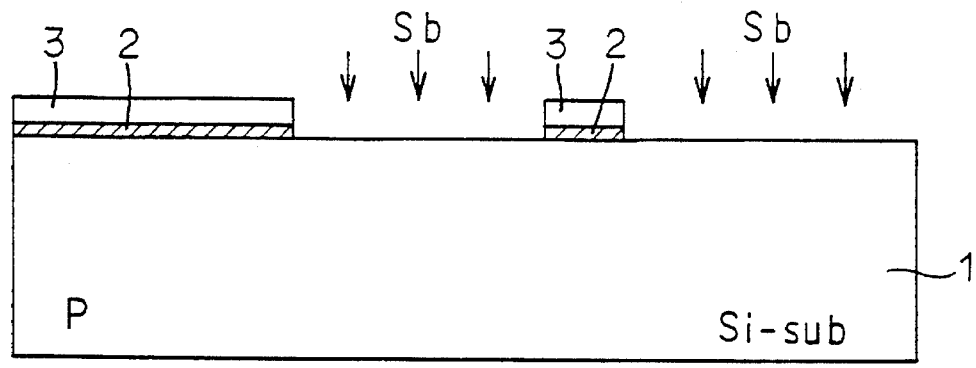
FIGS. 3 to 23 are partial cross sectional views of a semiconductor device in the first to the twenty-first steps of a method of manufacturing the conventional Bi-CMOS.
Figure 4:
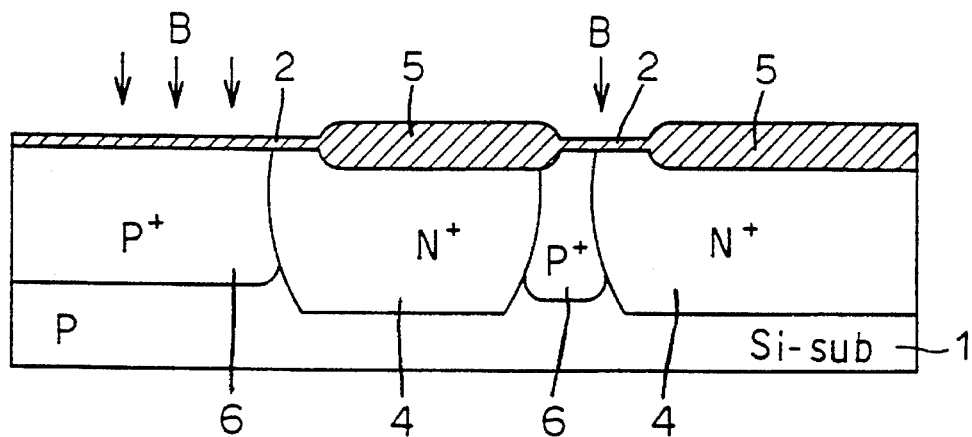
Figure 5:
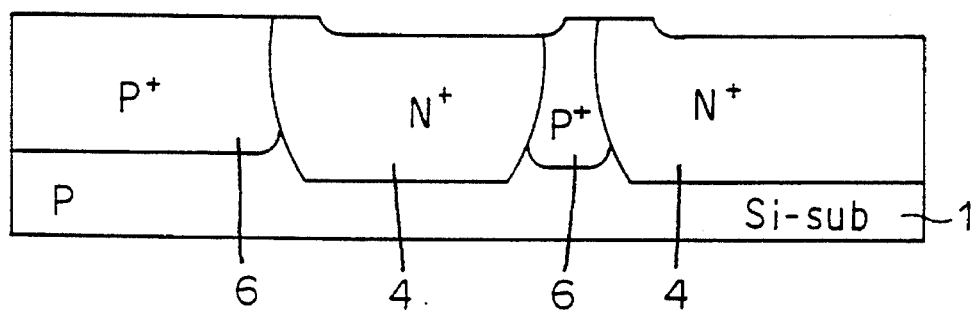
Figure 6:
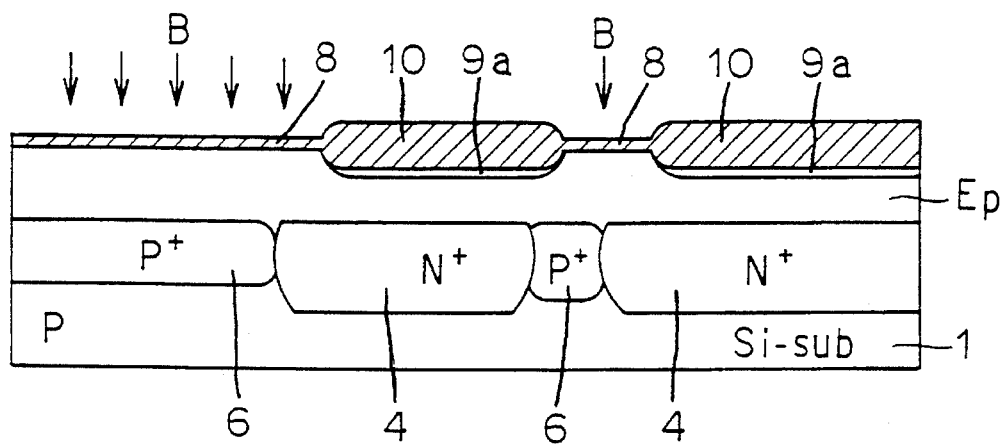
Figure 7:
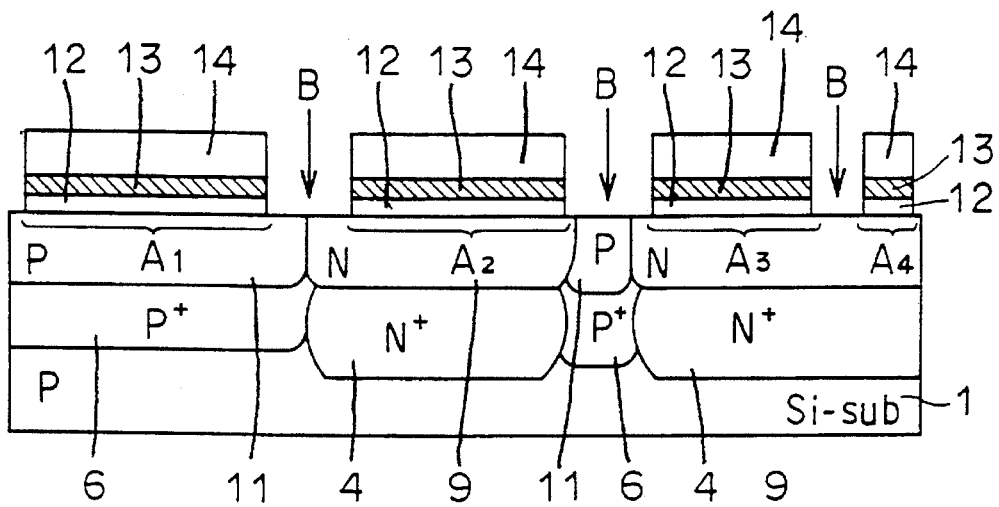
Figure 8:
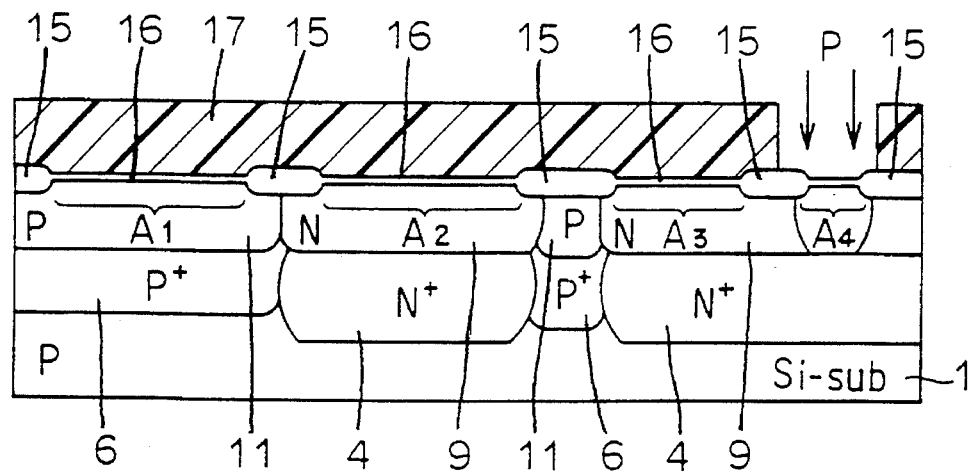
Figure 9:
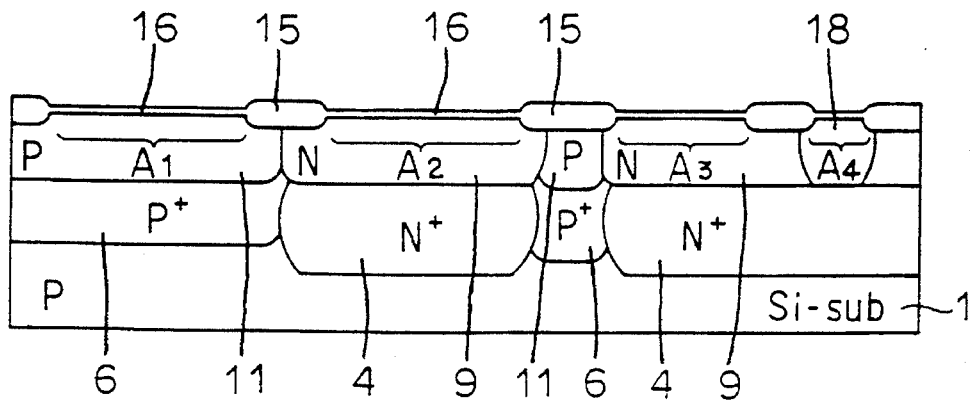
Figure 10:
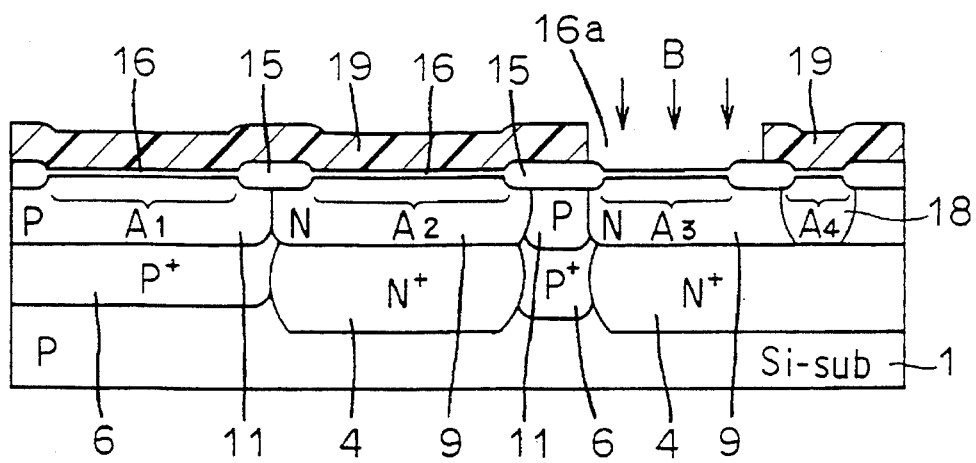
Figure 11:
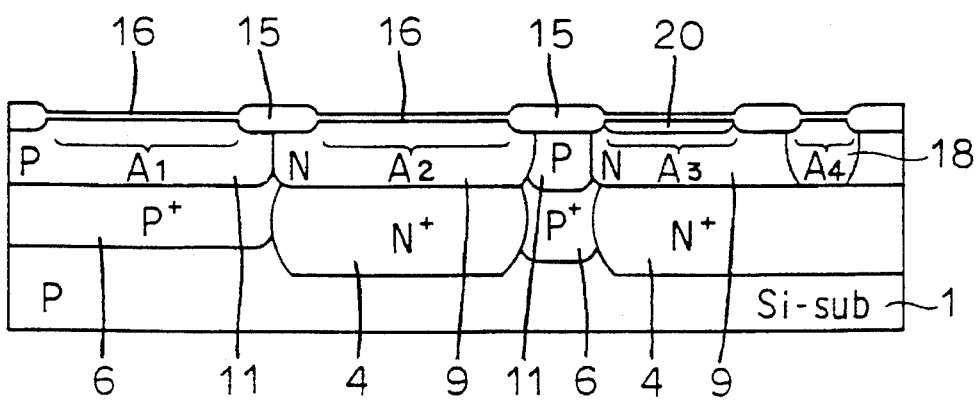
Figure 12:
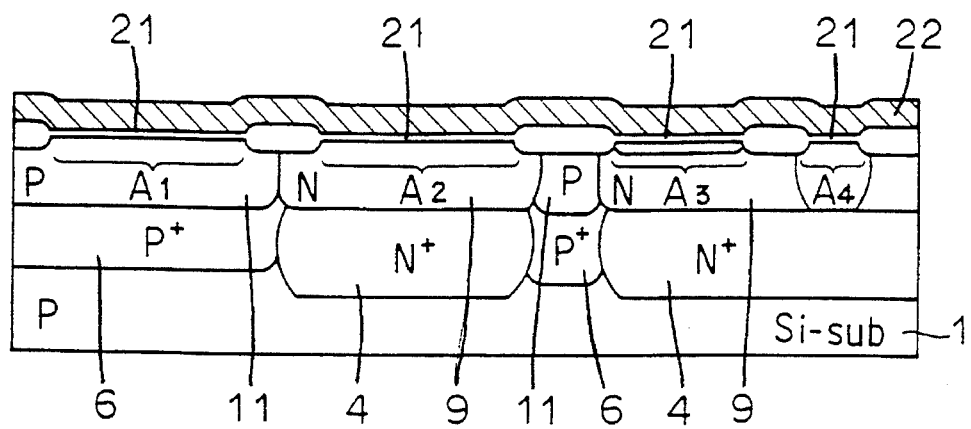
Figure 13:
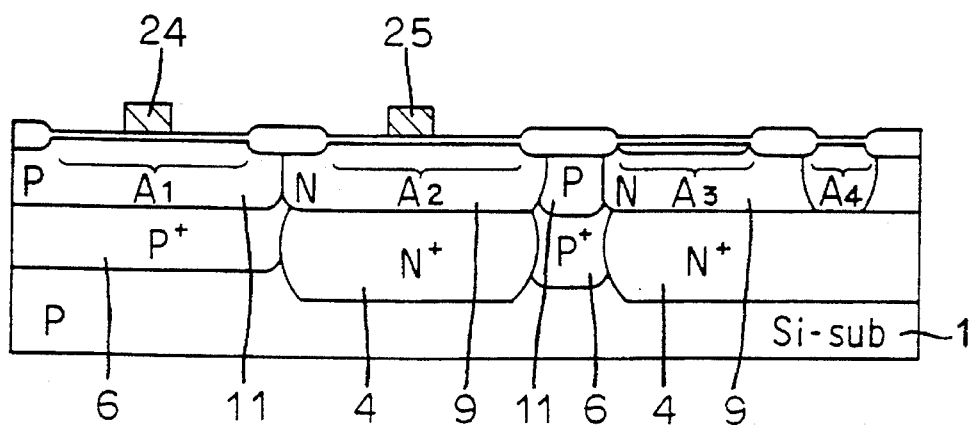
Figure 14:
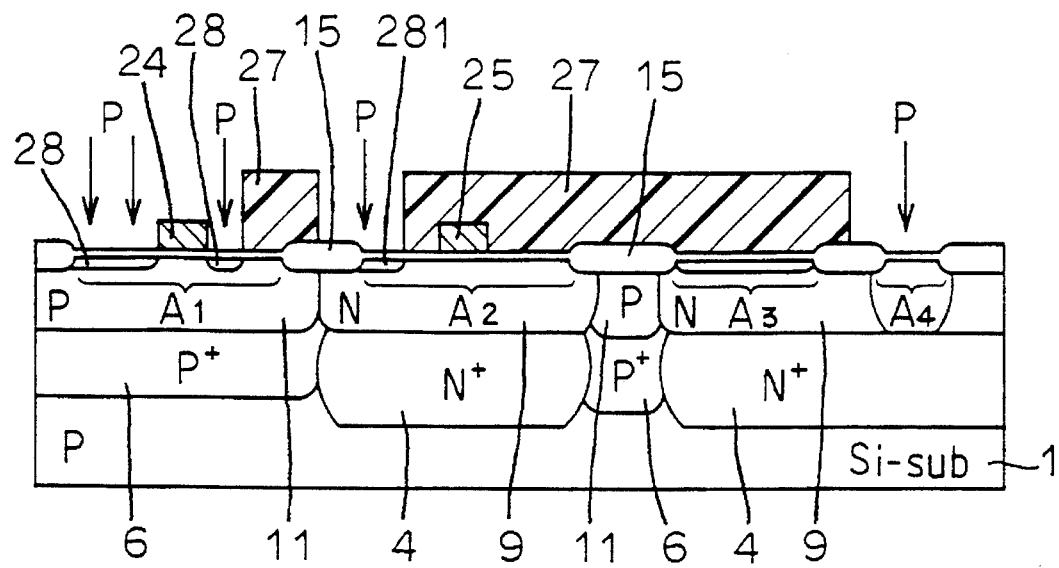
Figure 15:
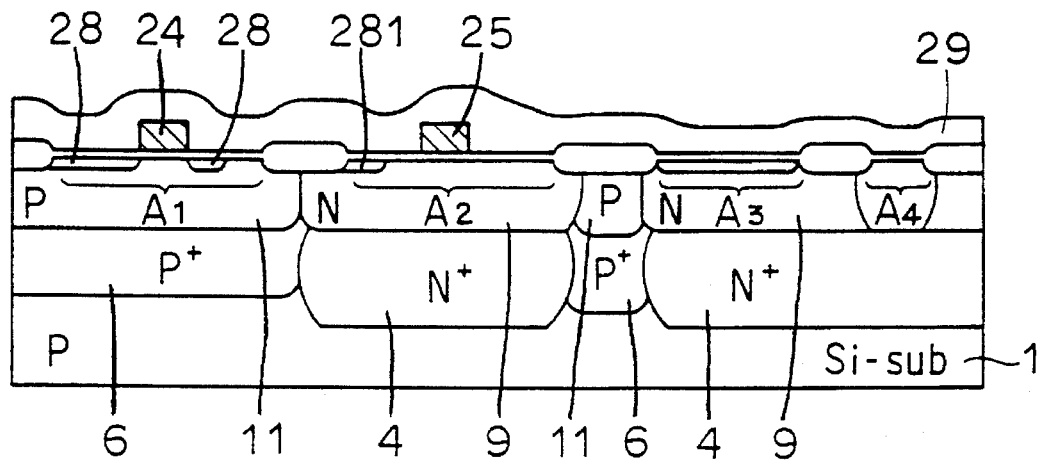
Figure 16:
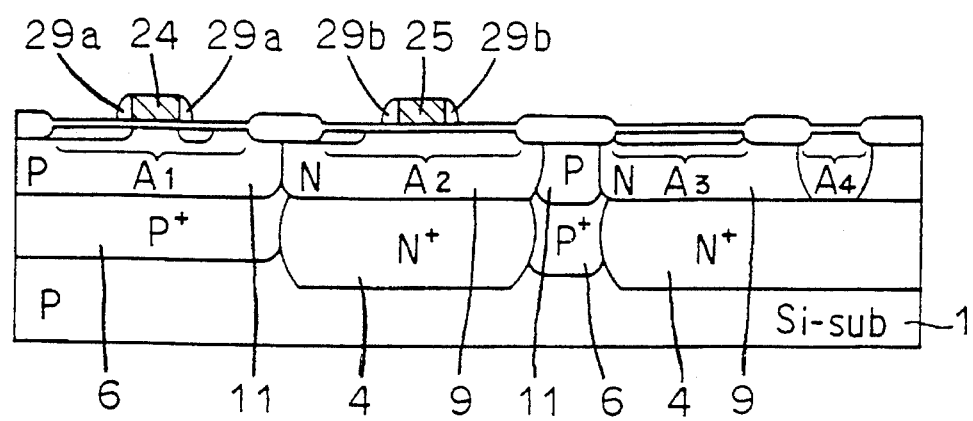
Figure 17:
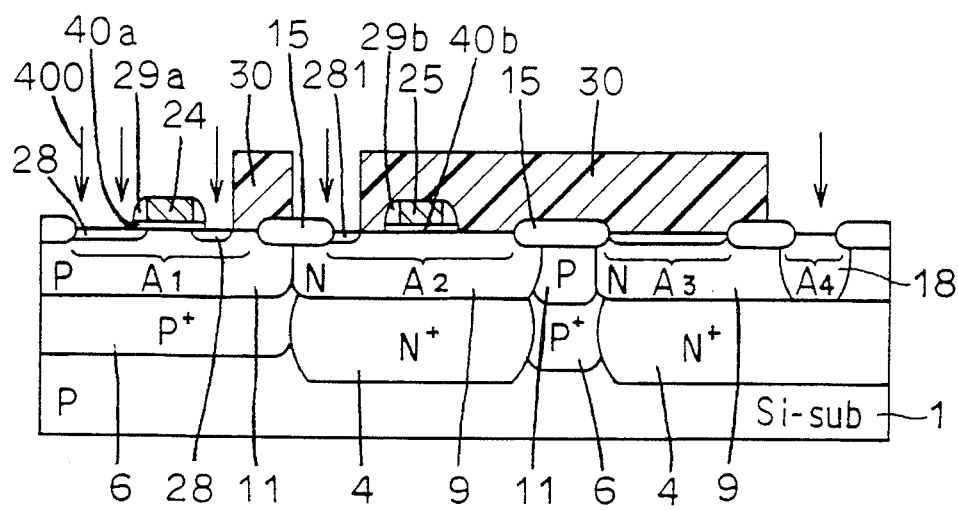
Figure 18:
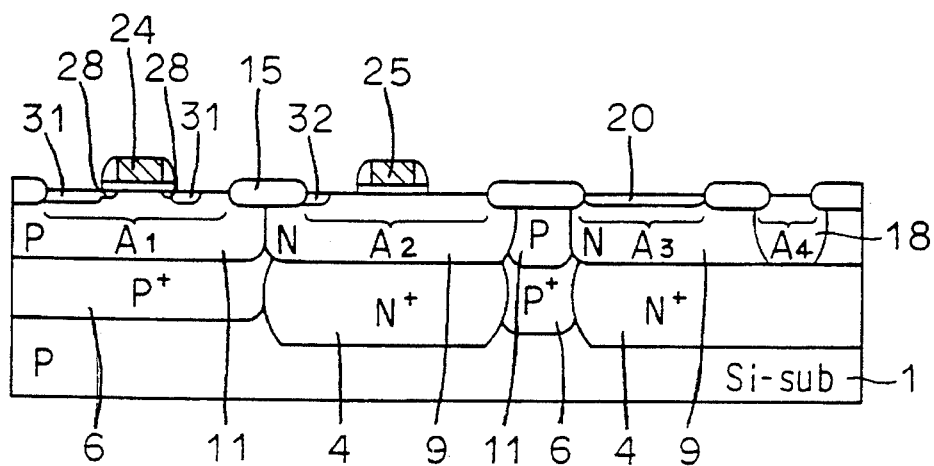
Figure 19:
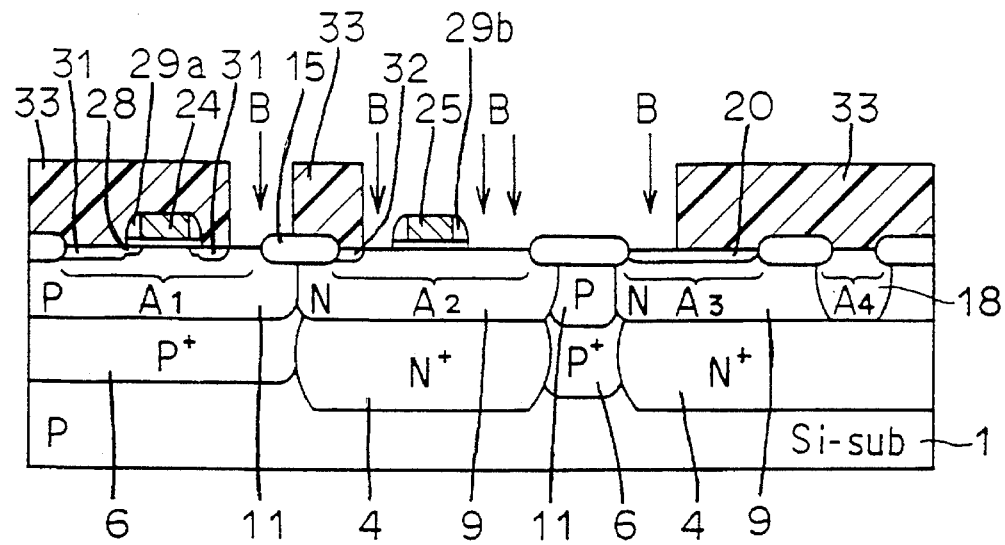
Figure 20:
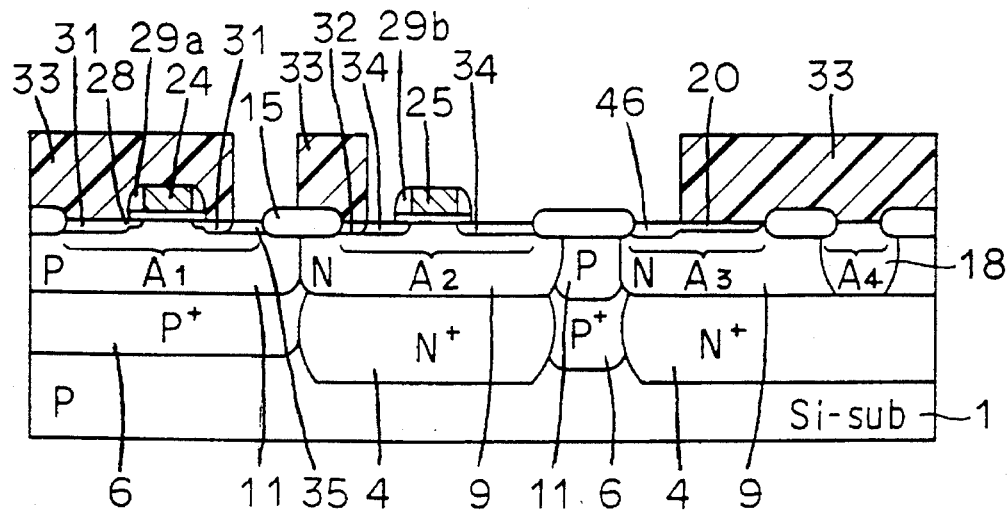
Figure 21:
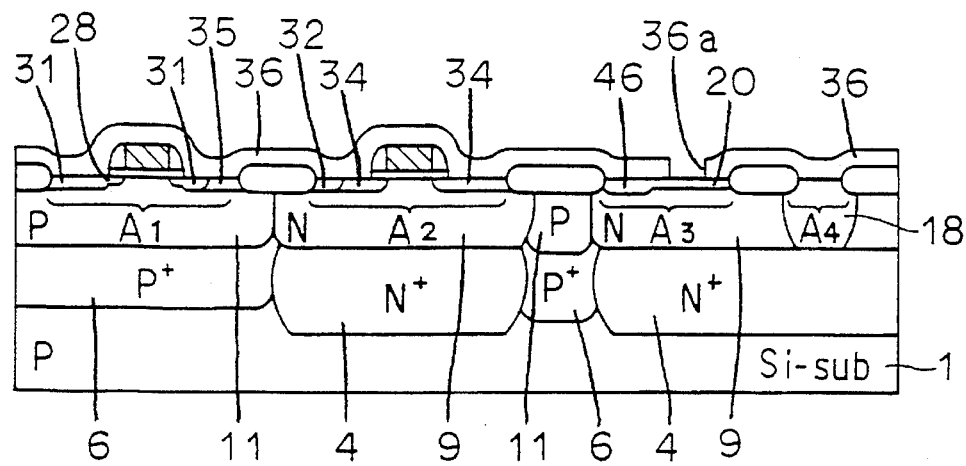
Figure 22:
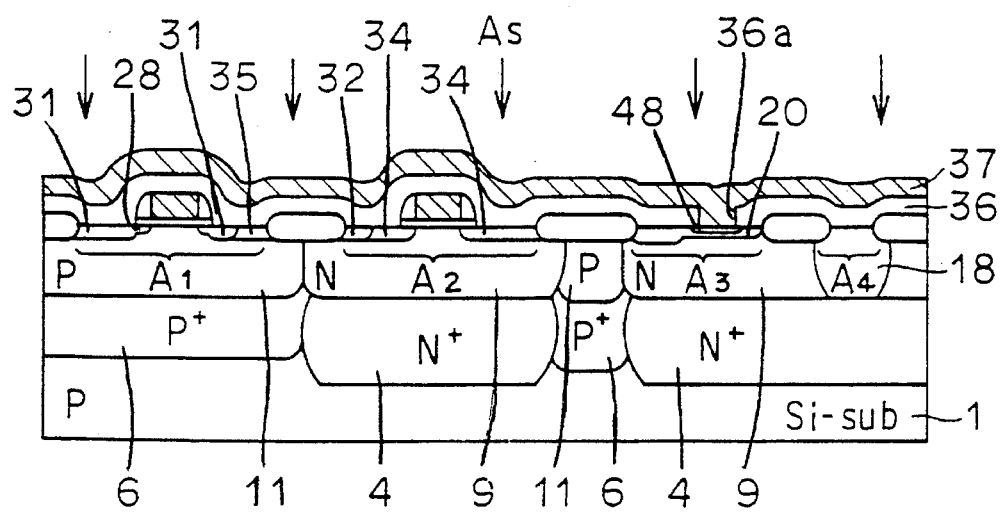
Figure 23:
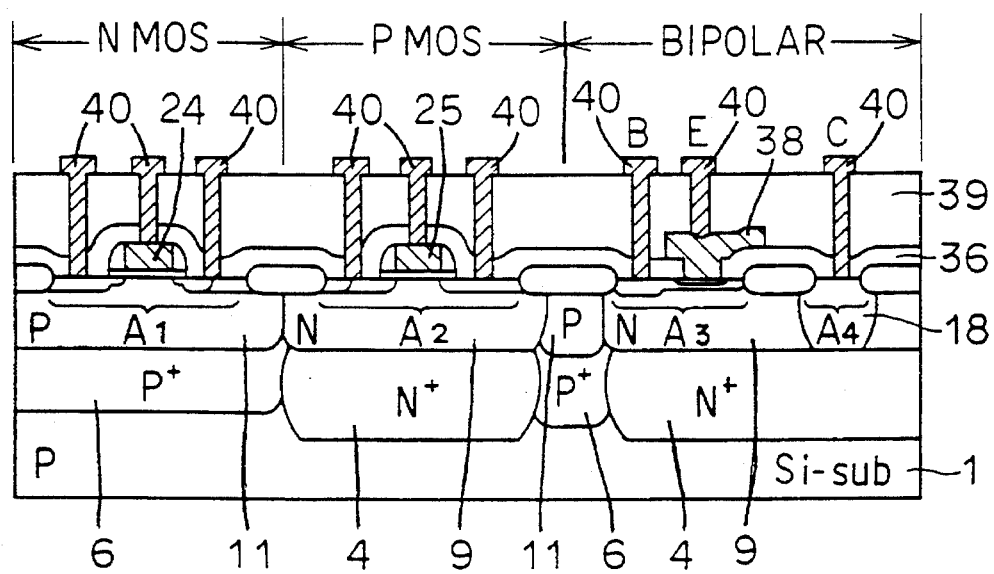
Figure 74:
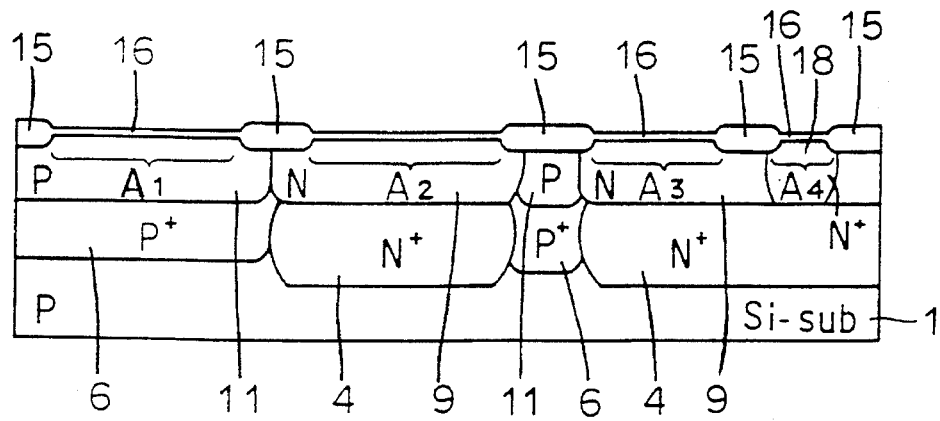
FIG. 74 to 83 are partial cross sectional views of a semiconductor device in the first to the tenth steps of a method of manufacturing a Bi-CMOS according to Embodiment 6.
Figure 75:
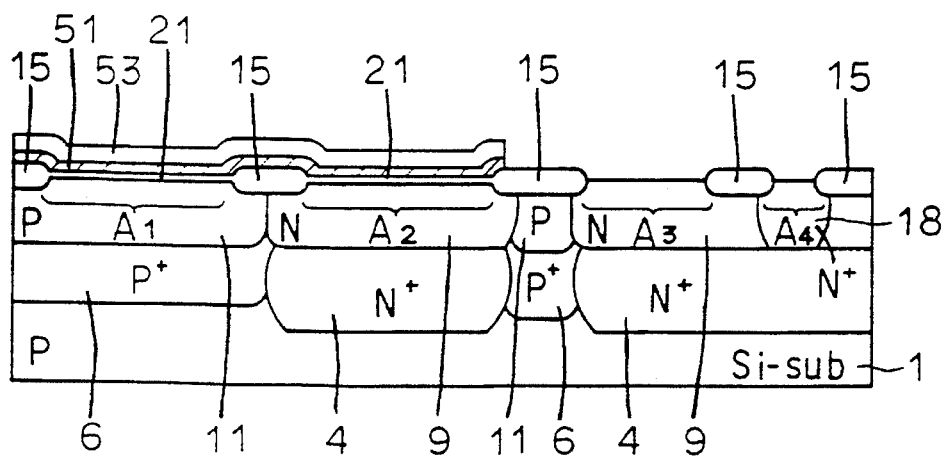
Figure 76:
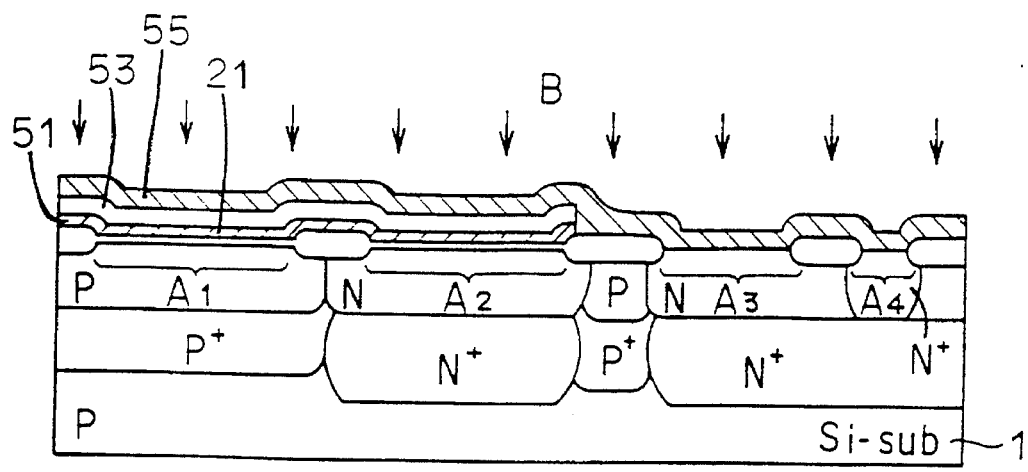

The steps shown in FIGS. 74 to 76 are the same as those shown in FIGS. 1 to 3 of Embodiment 1. By labeling the same reference characters as those of FIGS. 1 to 3 to corresponding portions, the description thereof will not be repeated.

Figure 77:
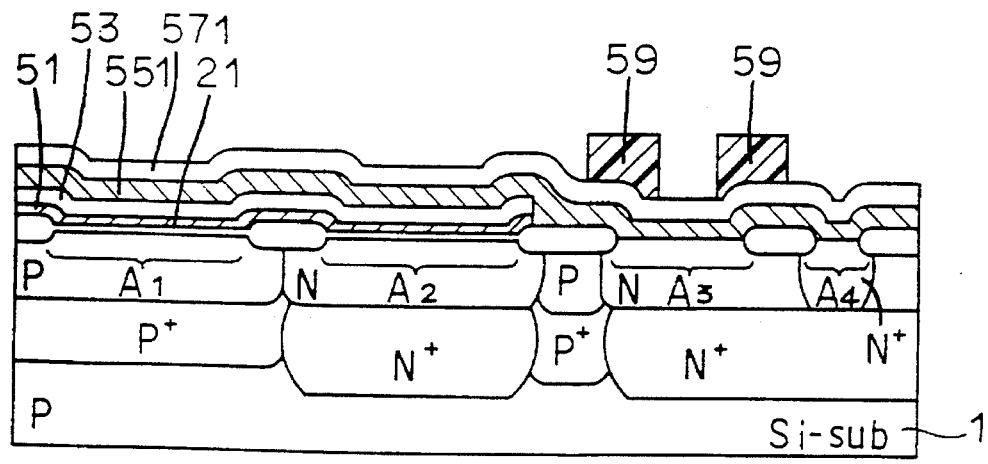
Figure 78:
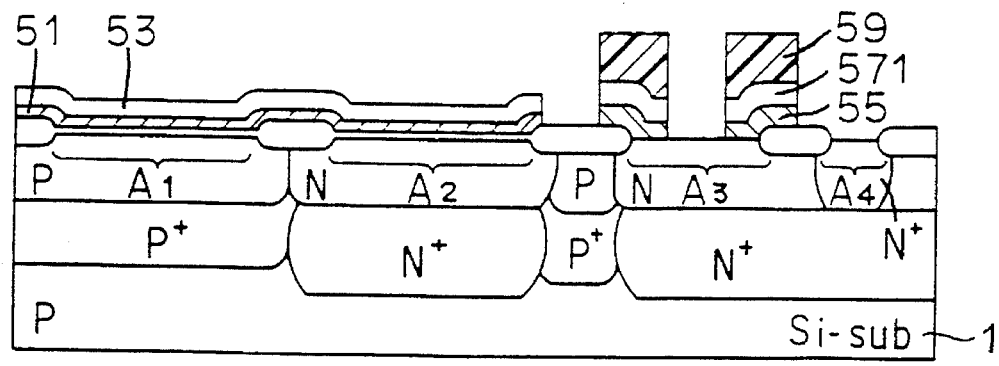
Figure 79:
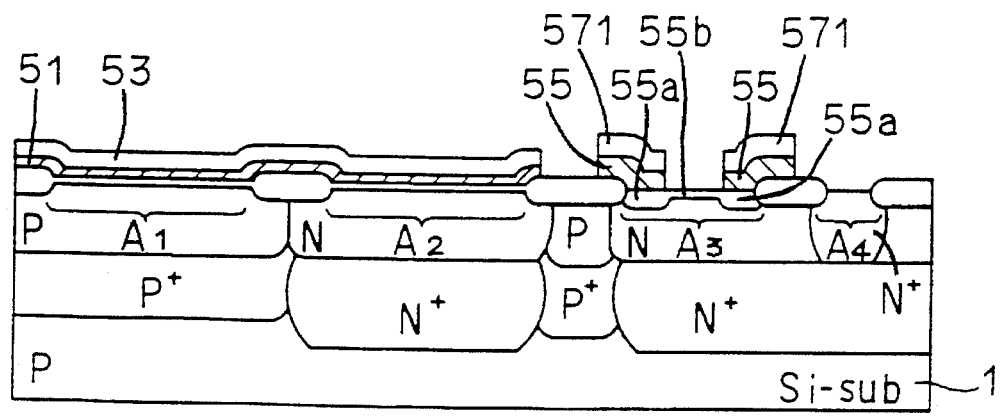

Referring to FIG. 77, a nitride film 571 of the thickness of 200 nm is deposited on second polycrystalline silicon film 551 with a CVD method. Then, resist pattern 59 is formed having a pattern existing on a region to form the external base electrode. Referring to FIGS. 77 and 78, with resist pattern 59 used as a mask, nitride film 571 and second polycrystalline silicon film 55 are patterned. Referring to FIGS. 78 and 79, resist pattern 59 on nitride film 571 is removed. Ions of $BF_2$ are implanted into part of active region $A_3$ (implantation energy of 20 KeV, a dose rate of $5\times10^{13} cm^{-2}$) to form intrinsic base region 55b.

Figure 80:
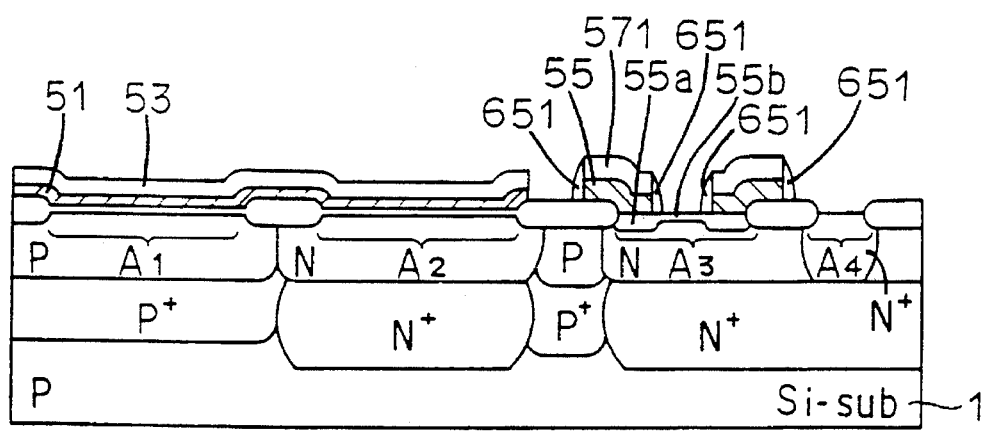

Referring to FIG. 80, a sidewall spacer 651 of a nitride film is formed on a sidewall of external base electrode 55. Sidewall spacer 651 is formed by forming a nitride film on the entire surface of silicon substrate 1 to anisotropically etch the same.

Figure 81:
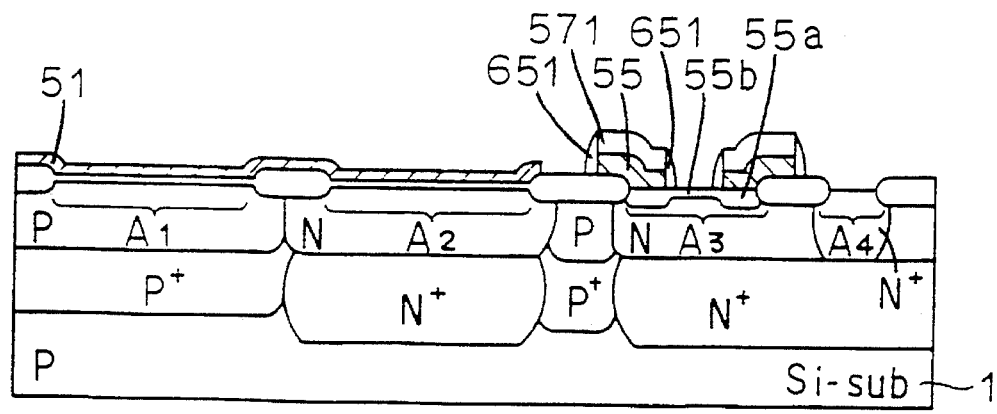

Referring to FIGS. 80 and 81, oxide film 53 is removed with hydrofluoric acid. Nitride films 571, 651 are not etched with hydrofluoric acid. Therefore, it is not necessary to mask the bipolar transistor region with resist, thereby decreasing the number of the steps of lithography technology by one.

Figure 82:
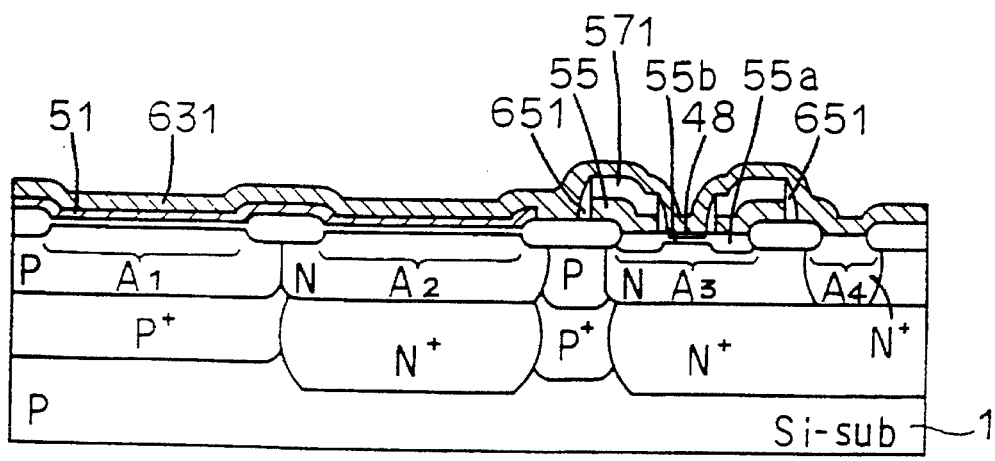
Figure 83:
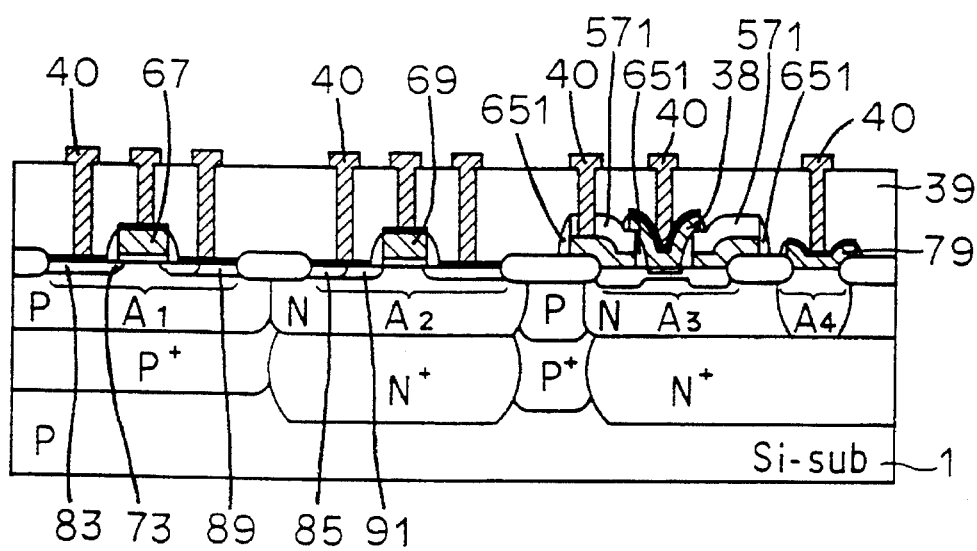

Referring to FIG. 82, third polycrystalline silicon film 631 is formed in contact with first polycrystalline silicon film 51 and emitter region 48. Then, by carrying out the same steps as those shown in FIGS. 35 to 43, the Bi-CMOS shown in FIG. 83 is completed. According to this embodiment, referring to FIG. 83, a semiconductor device having external base electrode 55 covered with nitride films 651, 571 is obtained.

Embodiment 7

Referring to FIG. 83, in the device according to Embodiment 6, since sidewall spacer 651 of a nitride film is formed on the sidewall of external base electrode 55, an emitter-base junction is in contact with the nitride film. Therefore, a surface recoupling current increases, which in turn decreases the current amplification factor ($h_{FE}$) on the side of the low current. In order to prevent this, the sidewall spacer to be formed on the sidewall of external base electrode 55 is structured in two layers of nitride film/oxide film in this embodiment. Description will now be given of a method of manufacturing the same.

Figure 84:
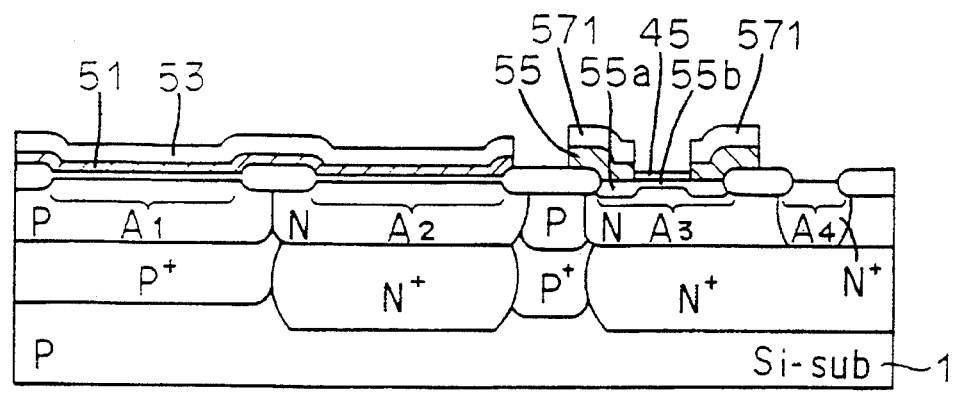
FIGS. 84 to 88 are partial cross sectional views of a semiconductor device in the first to the fifth steps of a method of manufacturing a Bi-CMOS according to Embodiment 7.

By carrying out the steps similar to those of FIGS. 74 to 79, a semiconductor device shown in FIG. 84 is obtained. Referring to FIG. 84, an oxide film 45 of the thickness of 8 nm is formed in part of active region $A_3$ in oxidation atmosphere. At this time, boron included in external base electrode 55 is diffused into active region $A_3$ to form external base region 55a. Ions of $BF_2$ are implanted into part of active region $A_3$ (implantation energy of 20 KeV, a dose rate of $5\times10^{13} cm^{-2}$) to form intrinsic base region 55b.

Figure 85:
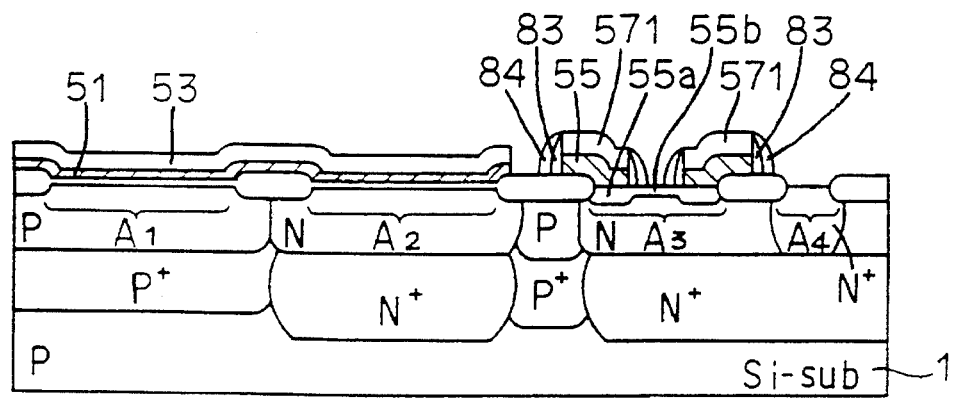

Referring to FIG. 85, a sidewall spacer 83 of TEOS is formed on the sidewall of external base electrode 55. Sidewall spacer 83 is formed by forming a TEOS film on the entire surface of silicon substrate 1 to etch the TEOS film anisotropically. Then, a sidewall spacer 84 of a nitride film is formed on a sidewall of sidewall spacer 83 of TEOS.

Formation of sidewall spacer 84 is carried out by forming a nitride film on the entire surface of silicon substrate 1 to etch the same anisotropically.

Figure 86:
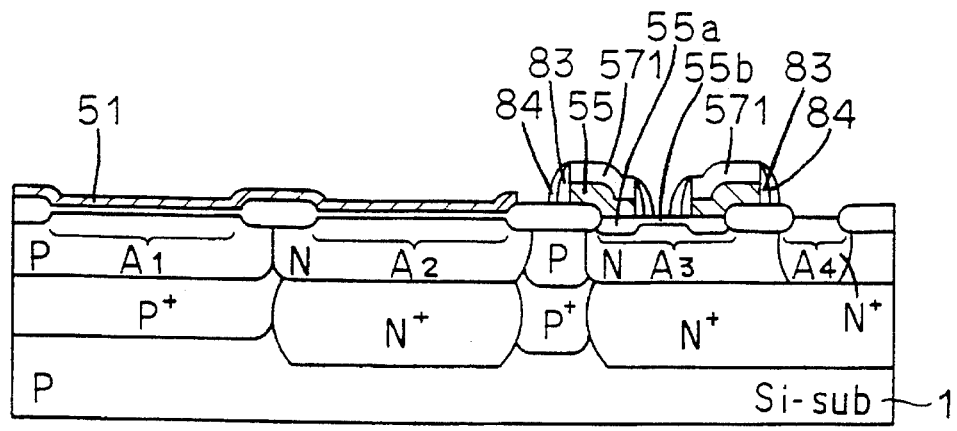
Figure 87:
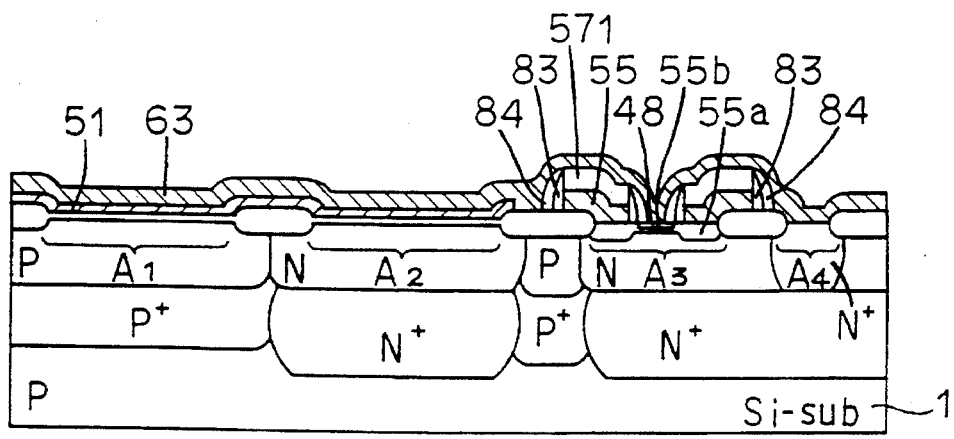
Figure 88:
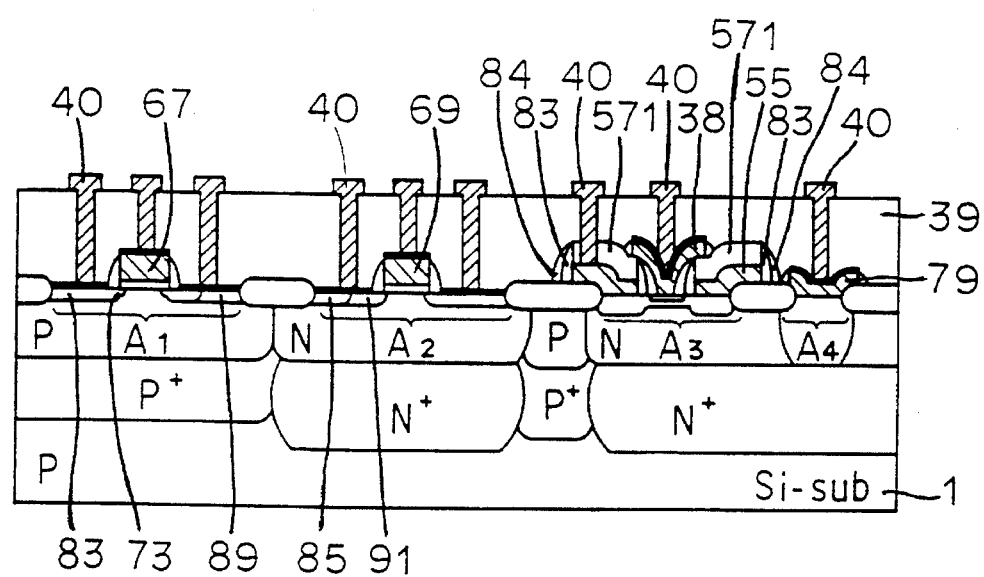

Referring to FIGS. 85 and 86, oxide film 53 is removed with hydrofluoric acid. Referring to FIG. 87, third polycrystalline silicon film 63 is formed in contact with first polycrystalline silicon film 51 and emitter region 48. Then, similar to Embodiment 6, by carrying out the same step as that shown in FIG. 83, the Bi-CMOS device shown in FIG. 88 is completed.

Embodiment 8

From Embodiment 1 to Embodiment 7, intrinsic base region 55b was formed before formation of a sidewall spacer on a sidewall of external base electrode 55. However, referring to FIG. 85, the intrinsic base region may be formed after formation of the nitride film (84)/TEOS (83), by phase diffusion of $B_2H_6$ gas at 700° to 900° C. In this case, since the sidewall spacer is formed of nitride films 84, 571, the sidewall spacer is never etched. Therefore, the distance between emitter and base does not change.

Figure 89:
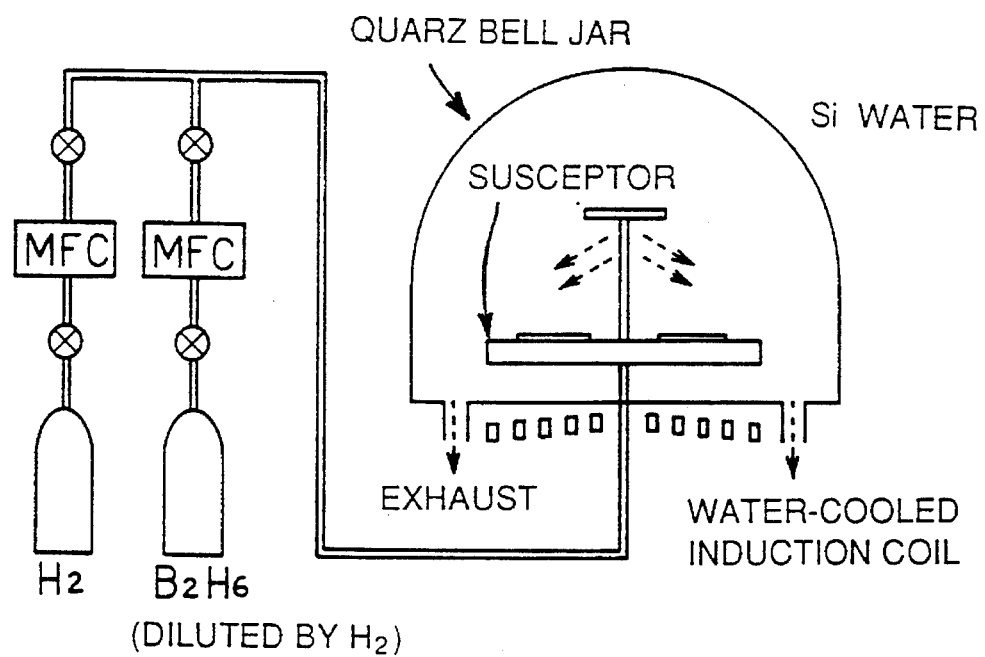
FIG. 89 is a schematic diagram of a gas phase diffusion device used in manufacturing a Bi-CMOS according to Embodiment 8.

FIG. 89 is a schematic diagram of a device for carrying out gas phase diffusion.

It should be noted that, in nitride film 84/TEOS film 83, boron may be added into TEOS film 83.

From Embodiment 1 to Embodiment 7, the intrinsic base region was formed before formation of a sidewall spacer on a sidewall of the external base electrode. Therefore, the intrinsic base region was etched at the time of formation of the sidewall spacer by RIE, which in turn caused variation of the current amplification factor ($h_{FE}$).

In this embodiment, since the intrinsic base region is formed after formation of the sidewall spacer, variation of the current amplification factor is reduced.

Embodiment 9

Resistance with high accuracy is needed in a circuit using a bipolar transistor. This embodiment relates to a method of manufacturing a Bi-CMOS device having resistance formed on the same substrate.

Figure 90:
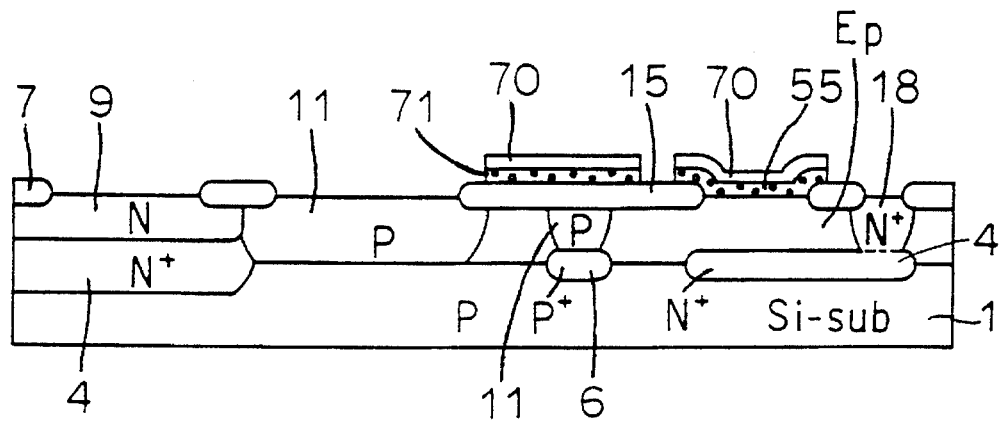
FIGS. 90 to 95 are partial cross sectional views of a semiconductor device in the first to the sixth steps of a method of manufacturing a Bi-CMOS according to Embodiment 9.

Referring to FIG. 90, after formation of $N^+$ buried layer 4 and $P^+$ buried layer 6 on P-type silicon substrate 1, the epitaxial layer Ep is formed on silicon substrate 1. N well 9, P well 11, a field oxide film 15, and drawing-out portion 18 of a collector are formed in the epitaxial layer Ep. A polysilicon resistance 71 having an oxide film 70 formed thereon is formed on field oxide film 15. In the region to form the bipolar transistor formed is external base electrode 55 having oxide film 70 formed thereon. External base electrode 55 and polysilicon resistance 71 are formed by selectively etching the P-type doped polysilicon and the first oxide film sequentially formed on the entire surface of silicon substrate 1 with lithography technology. The P-type doped polysilicon may be formed by ion implantation, or by mixing $B_2H_6$ gas during deposition of polysilicon with a CVD method.

Figure 91:
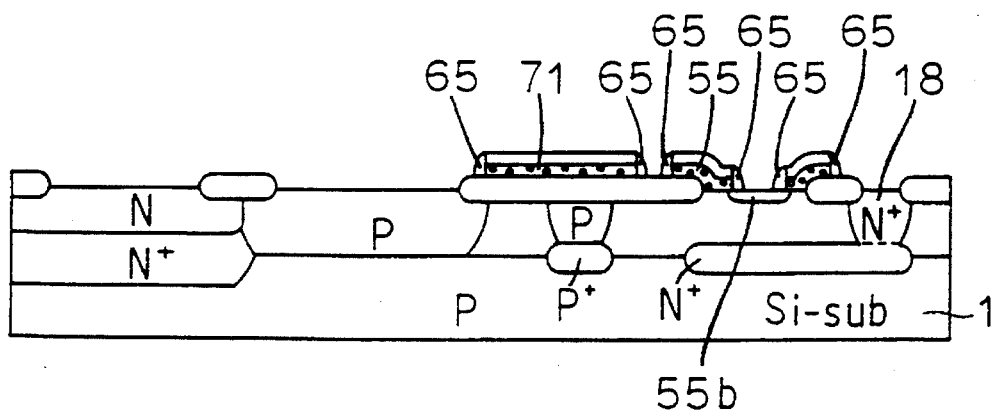

Referring to FIG. 91, an opening is formed for exposing the surface of intrinsic base region 55b is formed in external base electrode 55 with lithography technology. P-type impurity is implanted in the opening to form intrinsic base region 55b. By depositing the second oxide film on the entire surface of silicon substrate 1 to etch the same by reactive ion etching, a sidewall spacer 65 is formed on a sidewall of polysilicon resistance 71 and external base electrode 55.

Figure 92:
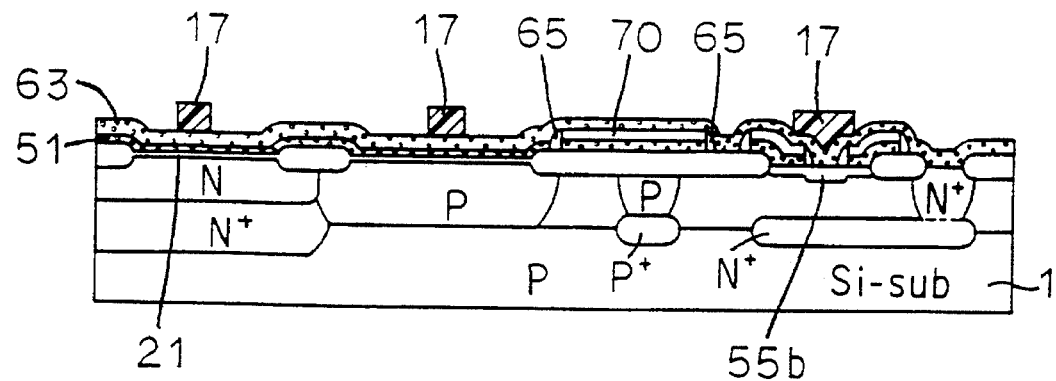

Referring to FIG. 92, gate insulating film 21 is formed in the region to form the field effect transistor. Gate insulating film 21 is formed by oxidation of the surface of silicon substrate 1. First polycrystalline silicon film 51 is formed in the region to form the field effect transistor in contact with gate insulating film 21. First polycrystalline silicon film 51 is formed with lithography technology. Second polycrystalline silicon film 63 is deposited on silicon substrate 1 in contact with first polycrystalline silicon film 51 and intrinsic base region 55b.

Figure 93:
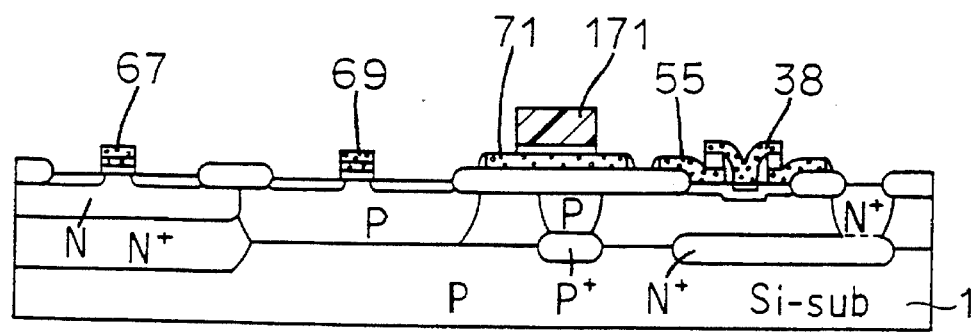

Referring to FIGS. 92 and 93, first polycrystalline silicon film 51 and second polycrystalline silicon film 63 are etched with lithography technology using resist pattern 17, to form gate electrodes 67, 69, and emitter electrode 38.

Then, a resist pattern 171 to leave a pattern on polysilicon resistance 71 is formed with lithography technology. With resist pattern 171 used as a mask, oxide film 70 and sidewall spacer 65 are etched.

Then, in order to form an LDD structure, phosphorus ions and boron ions are implanted into regions to form the NMOSFET and the PMOSFET, respectively.

Figure 94:
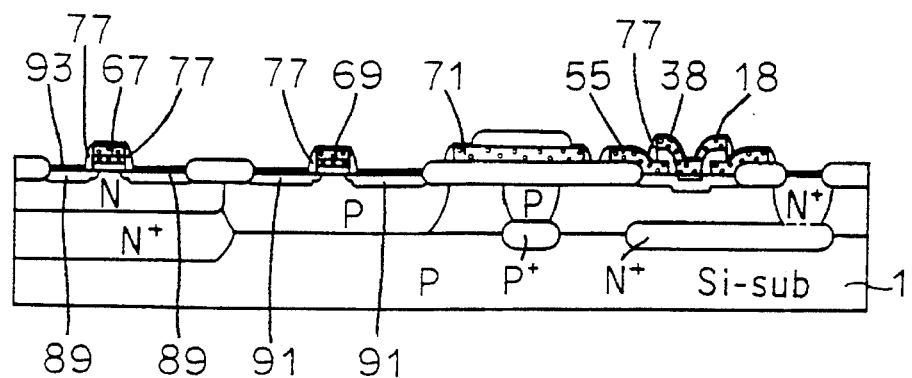

Referring to FIG. 94, sidewall spacers 77 are formed on sidewalls of gate electrode 67, gate electrode 69, and emitter electrode 38. Sidewall spacers 77 are formed by depositing an oxide film on the entire surface of silicon substrate 1 to etch the oxide film by reactive ion etching. With sidewall spacers 77 used as a mask, ions are implanted to form N-type and P-type source/drain regions 89, 91 (the detail of which is the same as Embodiments 1 to 8, whereby the description thereof will not be repeated). Then, titanium is deposited on the entire surface of silicon substrate 1 with a sputtering method. By carrying out a thermal treatment, the surface of source/drain regions 89, 91, the surface of gate electrodes 67, 69, and the surface of emitter electrode 38 are titanium silicidated (93).

Figure 95:
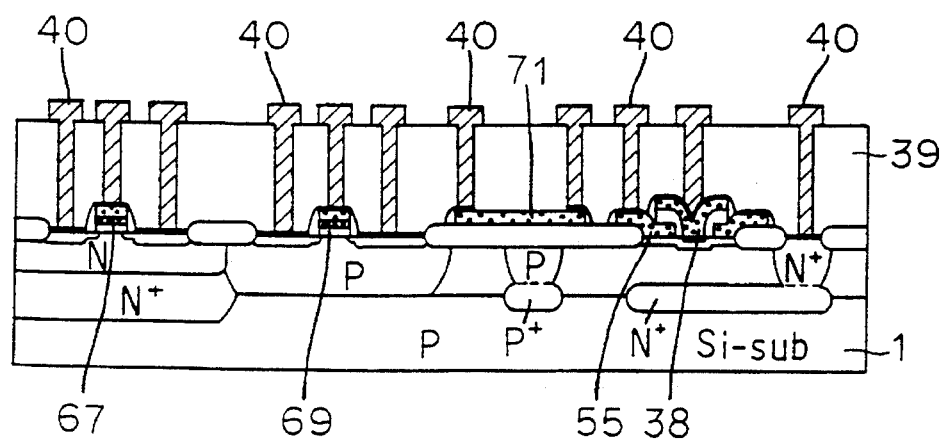

Referring to FIG. 95, protective insulating film 39 is formed on the surface of silicon substrate 1 so as to cover polysilicon resistance 71, gate electrodes 67, 69, external base electrode 55, and emitter electrode 38. A contact hole for electrical connection is formed in protective insulating film 39. Electrode interconnection 40 electrically connected to the CMOSFET, the polysilicon resistance, and the bipolar transistor is formed through the contact hole.

Embodiment 10

This embodiment is an improvement of Embodiment 9. In a method according to Embodiment 9, referring to FIG. 93, it is necessary to provide resist 171 on polysilicon resistance 71 in order to expose the surface of external base electrode 55, causing lithography technology to be complicated. This embodiment relates to a method for decreasing the number of the steps of lithography technology.

Figure 96:
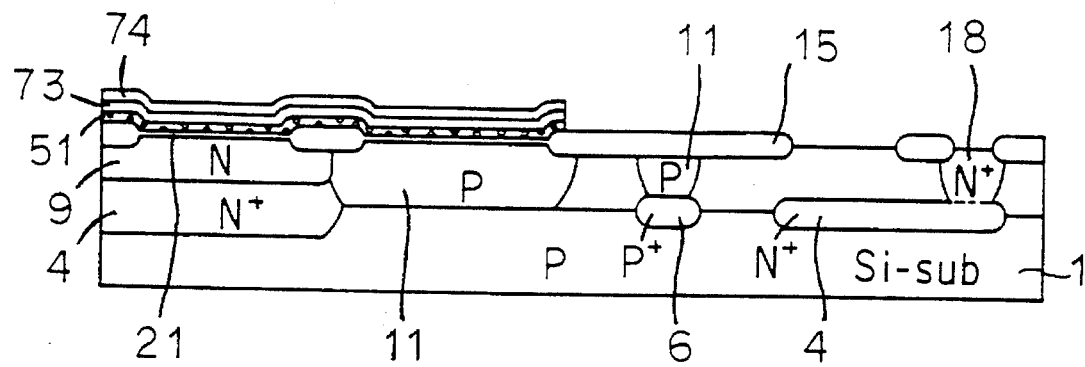
FIGS. 96 to 101 are partial cross sectional views of a semiconductor device in the first to the sixth steps of a method of manufacturing a Bi-CMOS according to Embodiment 10.

Referring to FIG. 96, $N^+$ buried layer 4 and $P^+$ buried layer 6 are formed in silicon substrate 1. The $n^-$-type epitaxial layer Ep is formed on silicon substrate 1. N well 9, P well 11, field oxide film 15, and drawing-out portion 18 of a collector are formed in the epitaxial layer Ep. Gate insulating film 21, first polycrystalline silicon film 51, nitride film 73, and oxide film 74 are sequentially formed in a region to form the CMOS. These films are formed with lithography technology.

Figure 97:
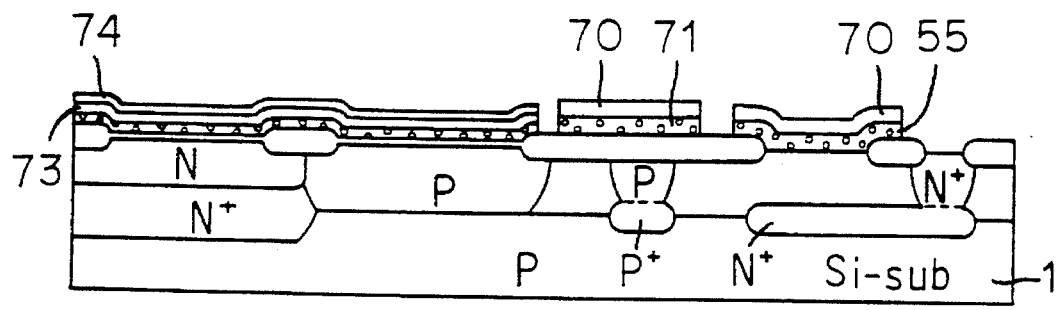

Referring to FIG. 97, in order to form polysilicon resistance 71 and external base electrode 55, a second polysilicon film is deposited on the entire surface of silicon substrate 1 (not shown). Desired impurity is implanted into regions to form the polysilicon resistance and the external base region in the second polysilicon film. The implantation conditions are, for example, implantation energy of 10 KeV, and implantation concentration of $4\times10^{15}/cm^2$ in the case of boron. An oxide film is formed on the second polysilicon film at a deposition temperature at which the impurity implanted into the second polysilicon film will not diffused into the n⁻ epitaxial layer Ep.

Figure 98:
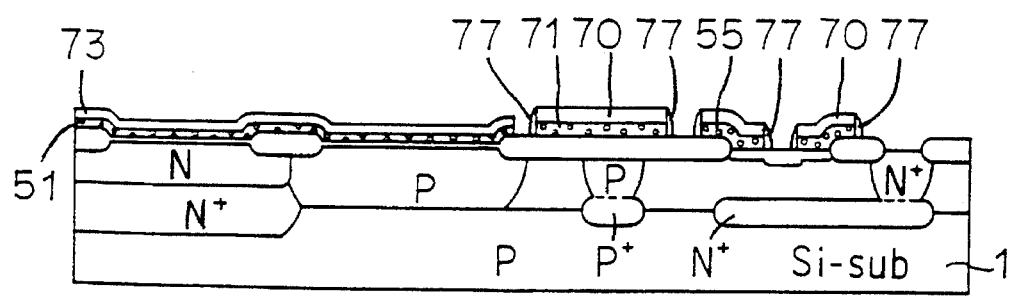

Referring to FIG. 97, by patterning the second polysilicon film and the oxide film deposited as described above with lithography technology, polysilicon resistance 71 having oxide film 70 formed thereon is formed on field oxide film 15, and external base electrode 55 having oxide film 70 formed thereon is formed in the region to form the bipolar transistor. Referring to FIG. 98, external base electrode 55 having oxide film 70 formed thereon is etched with lithographer technology to expose the surface of the intrinsic base region. After oxidizing the surface of the intrinsic base region, ions of $BF_2$ are implanted into the surface as P-type impurity under the conditions of implantation energy of 30 keV and implantation concentration of $5\times10^{13}/cm^2$. Then, referring to FIG. 98, an oxide film is deposited on the entire surface of silicon substrate 1 (not shown). By anisotropically etching the oxide film, sidewall spacers 77 are formed on sidewalls of polysilicon resistance 71 and external base electrode 55. At the time of anisotropic etching, oxide film 32 covering the CMOS region is also removed. Nitride film 73 covering the MOS region is removed with hot phosphoric acid.

Figure 99:
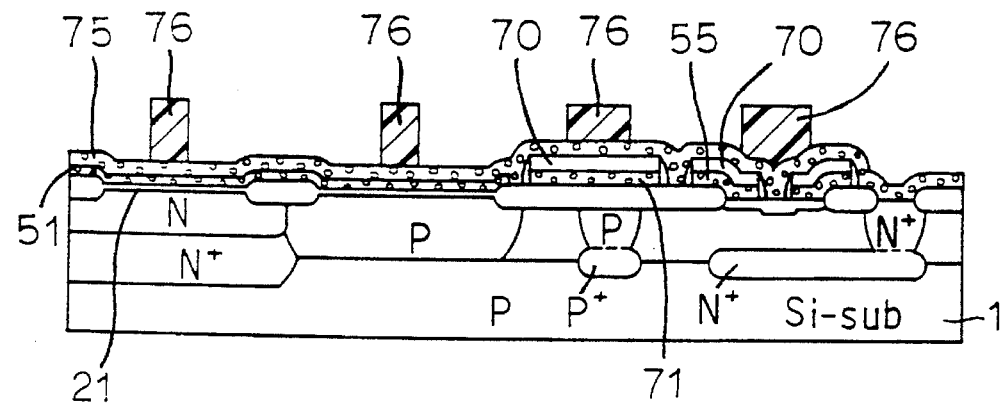
Figure 100:
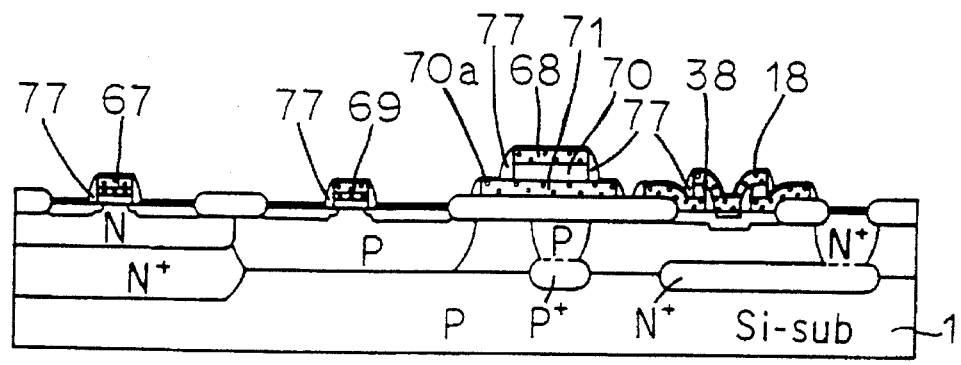

Referring to FIG. 99, a third polysilicon film 75 is deposited over the entire surface of silicon substrate 1 in contact with first polycrystalline silicon film 51 and the intrinsic base region. Arsenic of high concentration is implanted into third polysilicon film 75. Resist pattern 76 is formed on silicon substrate 1 having a pattern existing in an thick portion of the gate electrode, the polysilicon resistance, and the thick portion of the emitter electrode. Referring to FIGS. 99 and 100, with resist pattern 76 used as a mask, third polysilicon film 75 and first polycrystalline silicon film 51 are etched. Then, the oxide film on external base region 55, the oxide film on a contact portion 70a of the polysilicon resistance, and gate insulating film 21 are etched. As a result, gate electrodes 67, 69, a conductor pattern 65, and emitter electrode 38 are obtained. Resist pattern 76 is removed.

Referring to FIG. 100, in order to form an LDD structure, low concentration n-type impurity and low concentration p-type impurity are implanted into the NMOS portion and the PMOS portion, respectively. Then, a fourth oxide film is deposited on the entire surface of silicon substrate 1. By etching the fourth oxide film by reactive ion etching, sidewall spacers 77 are formed on sidewalls of gate electrodes 67, 69, emitter electrode 38, and polysilicon resistance 71. With sidewall spacer 77 used as a mask, ions of high concentration n-type impurity are implanted into the NMOS portion. Then, high concentration p-type impurity is implanted into the PMOS portion. By depositing titanium on the entire surface with a sputtering method, the exposed surface is silicidated.

Figure 101:
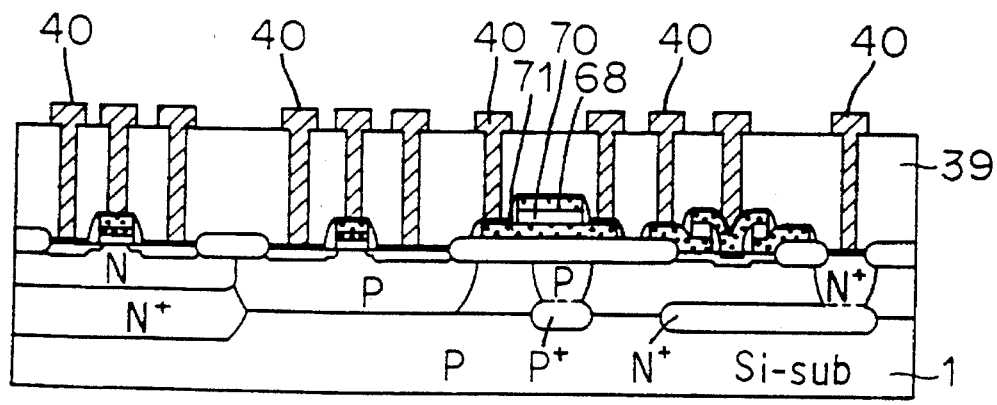

Referring to FIG. 101, protective insulating film 39 is formed on silicon substrate 1 so as to cover gate electrodes 67, 69, polysilicon resistance 71, conductor pattern 68, external base electrode 55, and emitter electrode 38. A contact hole for electrical connection is formed in protective insulating film 39. Electrode interconnection 40 electrically connected to the NMOSFET, the PMOSFET, the polysilicon resistance, and the bipolar transistor is formed through the contact hole. According to this embodiment, oxide film 70 on polysilicon resistance 71 is protected by conductor pattern 68 at the time of etching for exposing the surface of external base electrode 55. Therefore, the number of steps of lithography is decreased by one.

Figure 102:
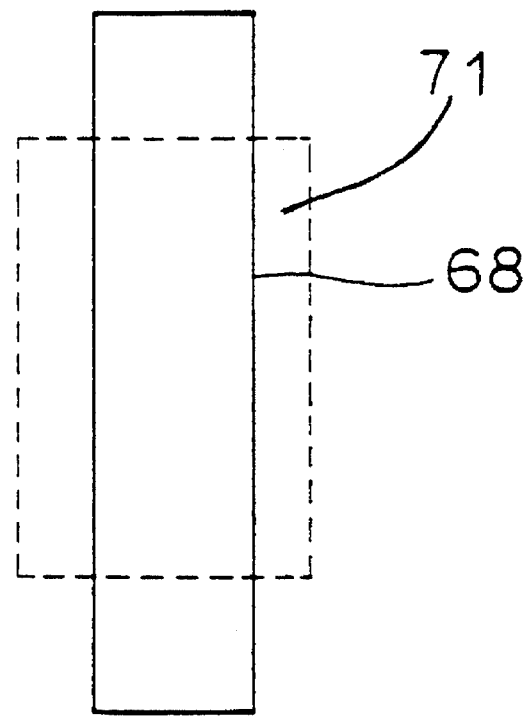
FIG. 102 is a plan view of a portion of a polysilicon resistance of the semiconductor device shown in FIG. 101.

FIG. 102 is a plan view of a portion of polysilicon resistance 71 of the semiconductor device shown in FIG. 101. Conductor pattern 68 is provided on polysilicon resistance 71.

Embodiment 11

Figure 103:
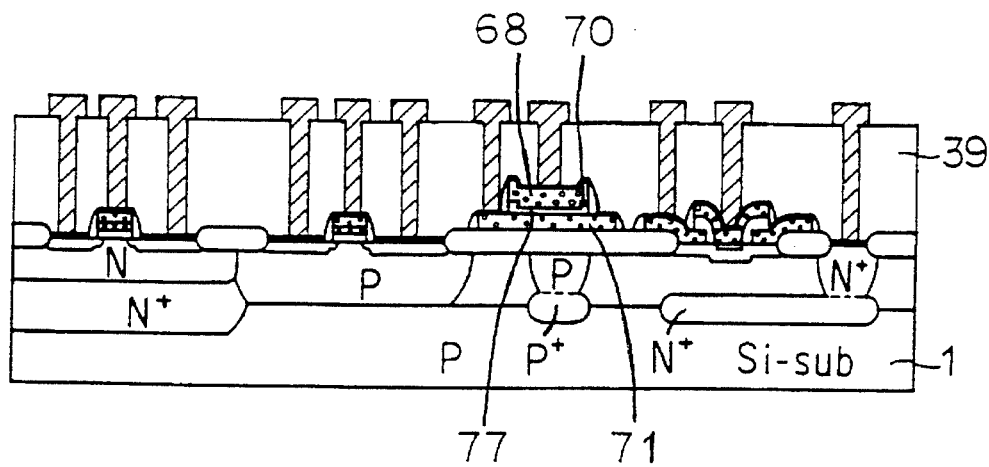
FIG. 103 is a cross sectional view of a Bi-CMOS according to Embodiment 11.

FIG. 103 is a cross sectional view of a Bi-CMOS device according to Embodiment 11. The device according to this embodiment is a Bi-CMOS device having capacitance formed of polysilicon resistance 71 and gate electrode 68 as a lower electrode and an upper electrode, respectively. In the device according to Embodiment 10, a contact was not provided in the conductive pattern provided on the polysilicon resistance. However, when used as capacitance, a contact must be formed as shown in FIG. 103. In order to implement high capacitance, oxide film 77 directly under the contact is formed thin. Similar to Embodiment 10, thin oxide film 77 is formed by forming thick oxide film 70 on polysilicon resistance 71 and etching thick oxide film 70 with lithography technology. The other steps are the same as those of Embodiment 10.

Embodiment 12

Figure 104:
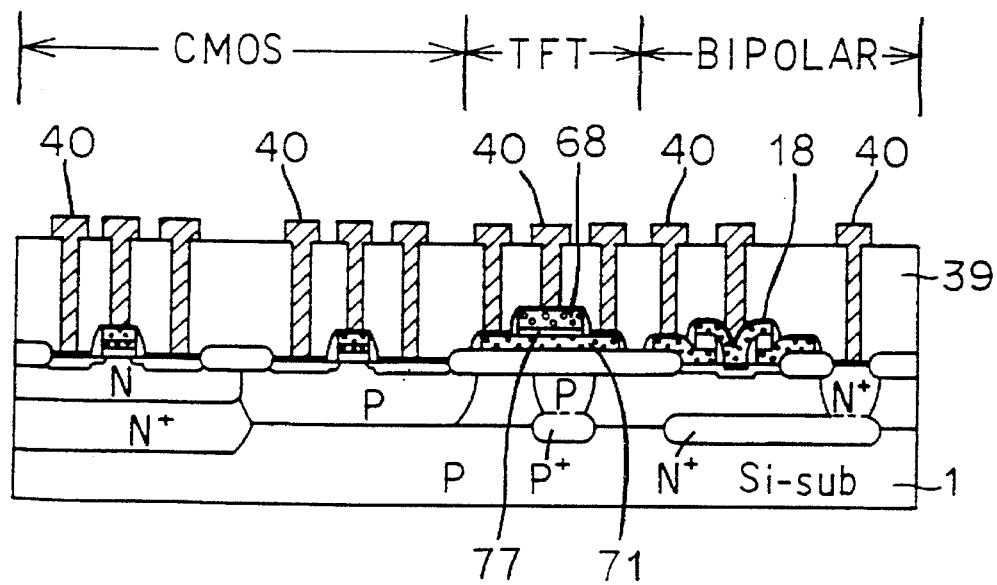
FIG. 104 is a cross sectional view of a Bi-CMOS according to Embodiment 12.

FIG. 104 is a cross sectional view of a Bi-CMOS according to Embodiment 12. Referring to FIG. 104, this embodiment includes a thin film transistor (TFT) using polysilicon resistance 71 as a source/drain region. Description will now be given of a method of manufacturing the Bi-CMOS according to Embodiment 12.

Figure 105:
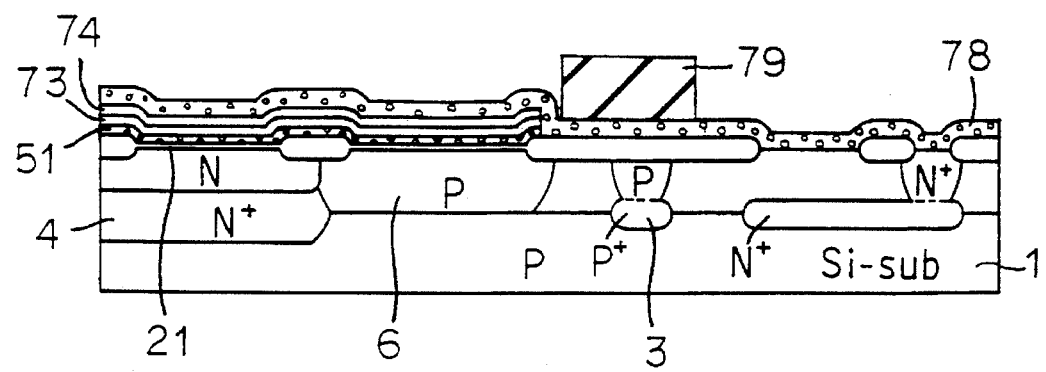
FIGS. 105 to 112 are partial cross sectional views of a semiconductor device in the first to the eighth steps of a method of manufacturing the Bi-CMOS according to Embodiment 12.

Referring to FIG. 105, the steps are the same as those of Embodiment 11 up to the step of forming oxide film 74 on nitride film 73. Amorphous polysilicon 78 is formed on the entire surface of silicon substrate 1. Amorphous polysilicon 78 is selected for increasing the grain diameter of polysilicon. Polysilicon of a large grain diameter can not only increase mobility of the transistor, but also reduce the base resistance.

Resist 79 is formed in a region to form the thin film transistor on amorphous polysilicon 78. With resist 79 used as a mask, boron is implanted into amorphous polysilicon 78 (concentration of $4\times10^{15}/cm^2$). Resist 79 is removed.

Figure 106:
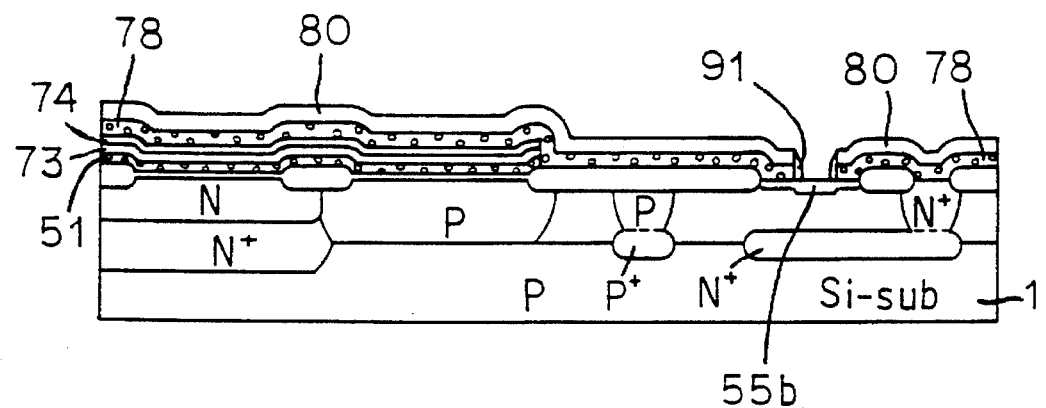

Referring to FIG. 106, a second oxide film 80 is deposited on amorphous polysilicon 78. With lithography technology, second oxide film 80 and amorphous polysilicon 78 are selectively etched to form an opening for exposing the surface of intrinsic base region 55b to be formed. As P-type impurity, example, ions of $BF_2$ are implanted into intrinsic base region 55b to be formed under the conditions of implantation energy of 30 KeV and implantation concentration of $5\times10^{13}/cm^2$. Then, a third oxide film is deposited on the entire surface of silicon substrate 1 (not shown). By etching the third oxide film anisotropically, a sidewall spacer 91 is formed on a sidewall of the opening. The third oxide film is anisotropically etched to expose the silicon surface to serve as an emitter portion.

Figure 107:
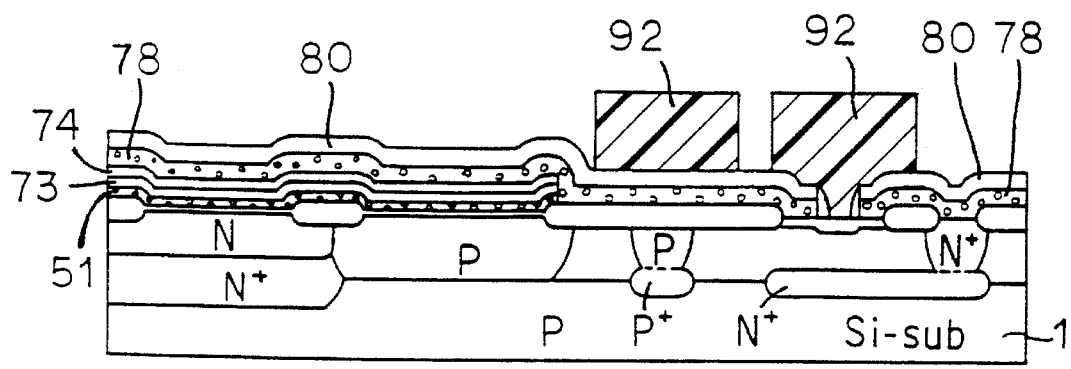

Referring to FIG. 107, resist 92 is provided on the external base electrode and on the region to form the thin film transistor.

Figure 108:
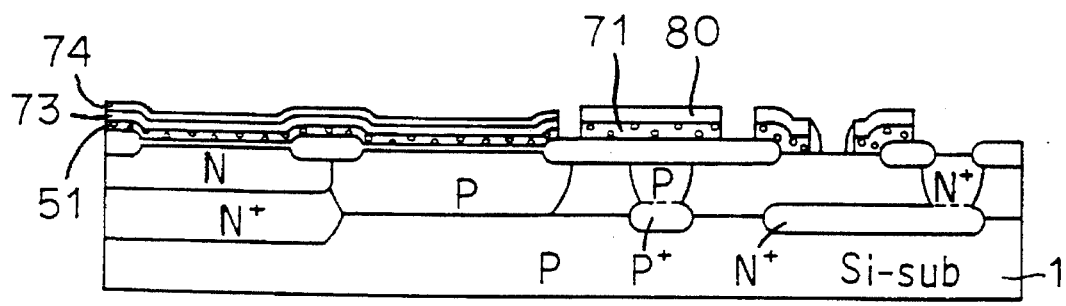

Referring to FIGS. 107 and 108, with resist 92 used as a mask, second oxide film 80 and amorphous silicon 78 are etched. Resist 92 is removed.

Figure 109:
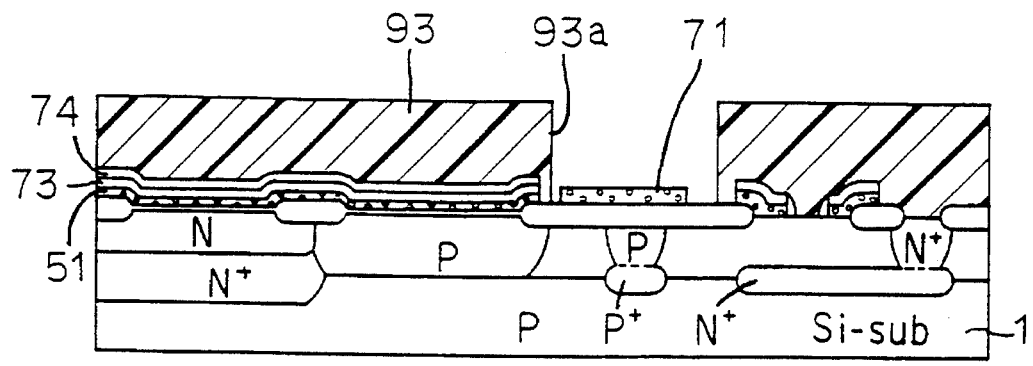

Referring to FIGS. 108 and 109, resist pattern 93 is formed having an opening 93a in the region to form the thin film transistor (TFT) on silicon substrate 1. With resist pattern 93 used as a mask, second oxide film 80 on polysilicon resistance 71 is etched away. With resist pattern 93 used as a mask, ions for adjusting the threshold voltage, for example, ions of phosphorus, are implanted into polysilicon resistance 71 under the condition of impurity concentration of $1\times10^{12}/cm^2$. Resist pattern 93 is removed.

Figure 110:
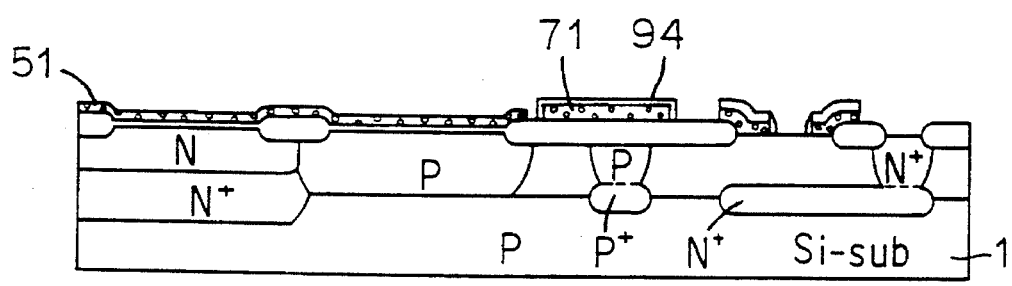

Referring to FIG. 110, a gate oxide film 94, which is a thin oxide film, is formed so as to cover polysilicon resistance 71. Gate oxide film 94 is formed by selectively and anisotropically etching the oxide film formed on the surface of silicon substrate 1 with lithography technology. At this time, oxide film 74 covering the MOS region is also removed. Finally, nitride film 73 covering the MOS region is removed with hot phosphoric acid.

Figure 111:
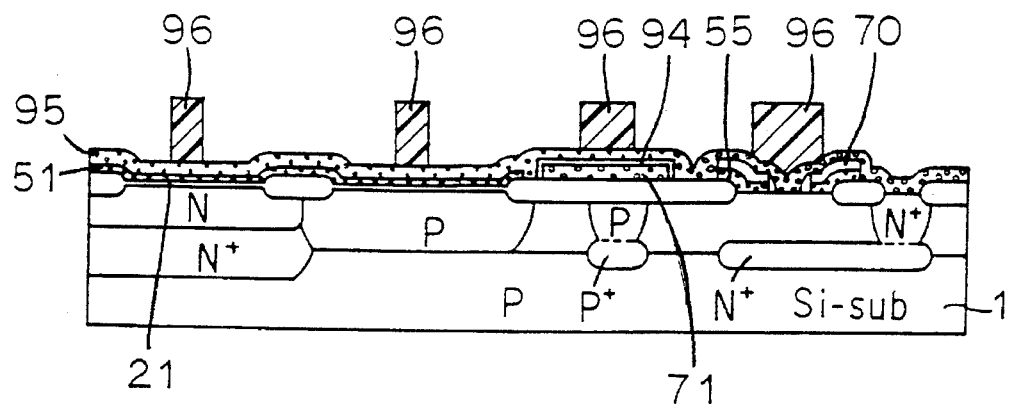
Figure 112:
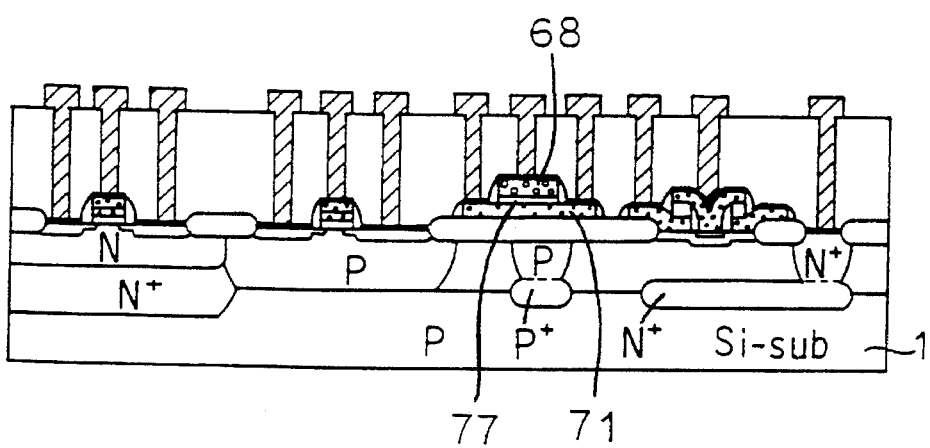

Referring to FIG. 111, arsenic doped polysilicon 93 is deposited on the entire surface of silicon substrate 1. Resist pattern 96 is formed on arsenic doped polysilicon 95 having a pattern existing on a gate electrode, an emitter electrode, and a gate electrode of the thin film transistor to be formed. With resist pattern 96 used as a mask, arsenic doped polysilicon 95 is etched. Then, oxide film 70 on external base electrode 55, and gate oxide films 21, 94 are etched. By carrying out the same steps as those of Embodiment 2, a Bi-CMOS shown in FIG. 112 is completed.

Embodiment 13

Figure 113:
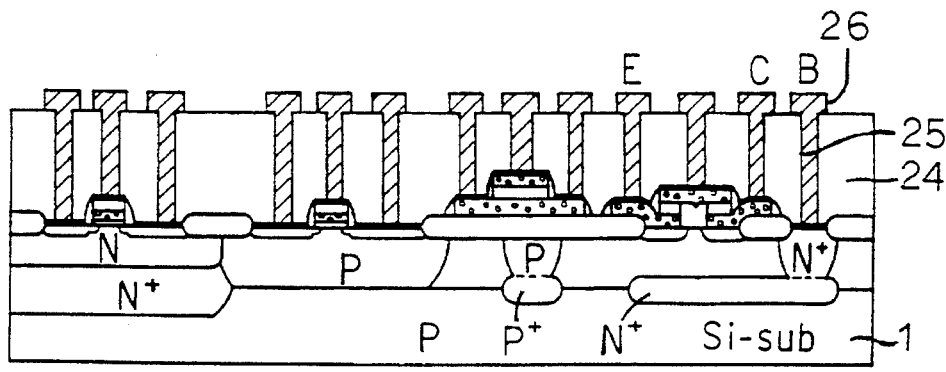
FIG. 113 is a cross sectional view of a Bi-CMOS according to Embodiment 13.

Embodiment 13 relates to a method of forming a lateral PNP transistor shown in FIG. 113 without adding any new steps to the manufacturing process of Embodiment 10. By comparing FIG. 104 with FIG. 113, in this embodiment, a lateral PNP transistor is formed in the NPN transistor portion of Embodiment 10.

Description will now be given of a method of manufacturing a semiconductor device shown in FIG. 113.

Figure 114:
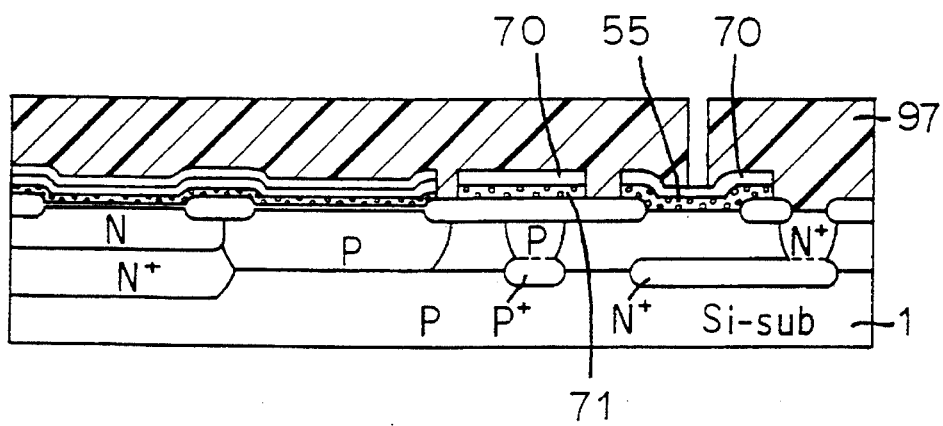
FIG. 114 is a partial cross sectional view of a semiconductor device in the first step of a method of manufacturing the Bi-CMOS according to Embodiment 13.

Referring to FIG. 114, the steps up to the step of forming polysilicon resistance 71 and oxide film 70 are the same as those of Embodiment 10. Before explaining the next step, description will be given of some points to which attention must be paid in manufacturing the lateral PNP transistor.

Figure 115:
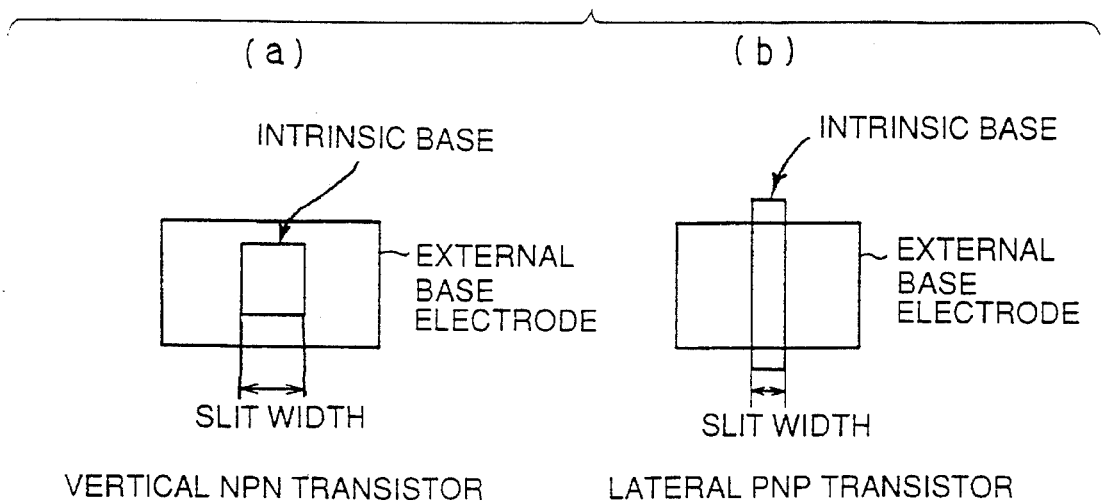
FIG. 115 are a diagram showing a vertical PNP transistor in comparison with a lateral PNP transistor.

Referring to FIG. 115, in the case of the lateral PNP transistor (b), the slit width is smaller as compared to a vertical NPN transistor (a). Therefore, in the case of the lateral PNP transistor, the external base electrode must be divided into two regions.

Returning to FIG. 114, resist pattern 97 having an opening with a width corresponding to the slit width on external base electrode is formed on the surface of silicon substrate 1. With resist pattern 97 used as a mask, oxide film 70 and external base electrode 55 are etched. In Embodiment 10, ion implantation into the intrinsic base was then carried out. However, in this embodiment, as will be described later, ion implantation into the intrinsic base is carried out after formation of sidewalls of the emitter electrode.

Figure 116:
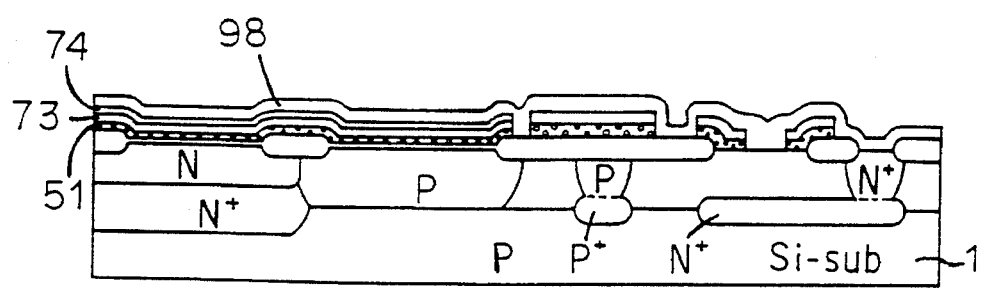
FIGS. 116 to 118 are partial cross sectional views of a semiconductor device in the second to the fourth steps of a method of manufacturing the Bi-CMOS according to Embodiment 13.

Referring to FIG. 116, after removing resist pattern 97, third oxide film 98 is deposited on the entire surface of silicon substrate 1. Since the slit width is small, the lateral PNP transistor portion is completely filled with third oxide film 98. Then, third oxide film 98 is etched by reactive ion etching. However, the silicon surface is non exposed in the lateral PNP transistor portion. Therefore, even if $BF_2$ for forming the intrinsic base is implanted under the condition of 30 KeV and $5\times10^{13}cm^{-2}$, $BF_2$ is implanted only into the NPN transistor portion. In reactive ion etching of third oxide film 98, oxide film 74 covering the MOS region is removed.

Then, nitride film 73 covering the MOS region is removed with hot phosphoric acid.

Figure 117:
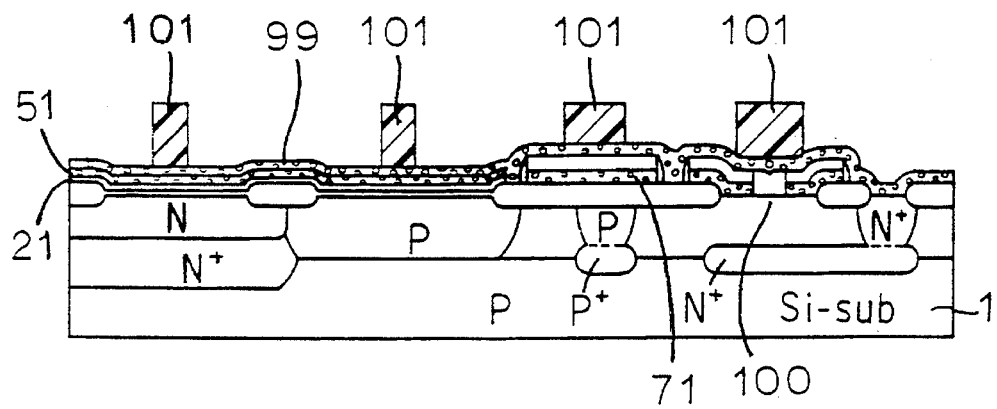
Figure 118:
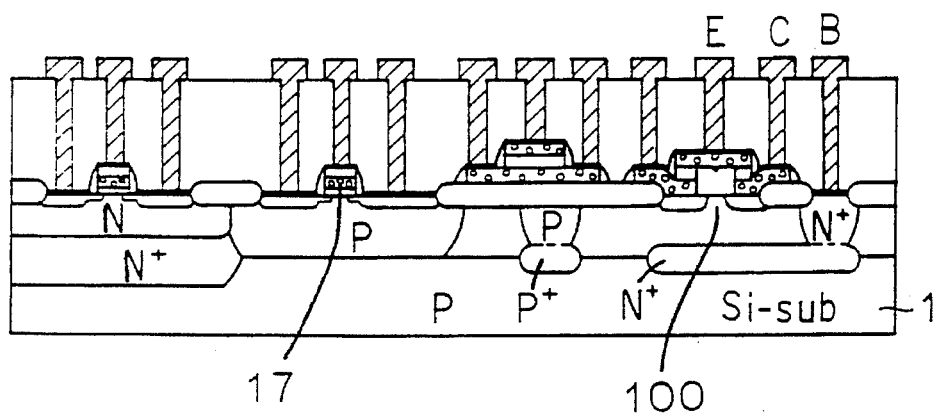

Referring to FIG. 117, a third polysilicon film 99 is deposited on the entire surface of silicon substrate 1. Arsenic of high concentration is implanted into third polysilicon film 99. Resist pattern 101 is formed having a pattern existing in an thick portion of gate electrodes 67, 69, polysilicon resistance 71, and a base region 100 of the lateral PNP transistor to be formed, on third polysilicon film 99. With resist pattern 101 used as a mask, third polysilicon film 99 is etched. Then, by carrying cut the same steps as those of Embodiment 10, a Bi-CMOS including a lateral PNP transistor shown in FIG. 118 is obtained.

As described above, in the semiconductor memory device according to the first aspect of the present invention, the thickness of the gate electrode of the field effect transistor is made larger than the thickness of the emitter electrode of the bipolar transistor. The semiconductor device having such a structure is manufactured by forming the field effect transistor after completion of the bipolar transistor. Therefore, when sidewall spacers are formed by reactive ion etching on sidewalls of the gate electrode of the field effect transistor, operating portions of the bipolar transistor are protected by the external base electrode and the emitter electrode. Therefore, the surface thereof is not subjected to reactive ion etching. As a result, a Bi-CMOS is obtained in which characteristics of the bipolar transistor are not deteriorated.

In the method of manufacturing the semiconductor device according to the second and the third aspects of the present invention, when sidewall spacers are formed by reactive ion etching on sidewalls of the gate electrode, operating portions of the bipolar transistor are protected by the external base electrode and the emitter electrode. Therefore, the surface thereof is not subjected to reactive ion etching. As a result, a Bi-CMOS is obtained in which characteristics of the bipolar transistor are not deteriorated.

In the method of manufacturing the semiconductor device according to the fourth aspect of the present invention, when sidewall spacers are formed by reactive ion etching on sidewalls of the gate electrode, operating portions of the bipolar transistor are protected by the external base electrode and the emitter electrode. Therefore, the surface thereof is not subjected to reactive ion etching. A Bi-CMOS is further obtained including a field effect transistor having a source/drain region and a gate electrode overlapping with each other.

In the method of manufacturing the semiconductor device according to the fifth aspect of the present invention, when sidewall spacers are formed by reactive ion etching on sidewalls of the gate electrode, operating portions of the bipolar transistor are protected by the external base electrode and the emitter electrode. Therefore, the surface thereof is not subjected to reactive ion etching. As a result, a Bi-CMOS is obtained in which characteristics of the bipolar transistor are not deteriorated. A Bi-CMOS is further obtained including a field effect transistor having a source/drain region and a gate electrode overlapping with each other. A Bi-CMOS of low resistance is further obtained since the surface of the source/drain high concentration impurity region and the surface of the external base electrode are silicidated.

In the method of manufacturing the semiconductor device according to the sixth aspect of the present invention, when sidewall spacers are formed by reactive ion etching on sidewalls of the gate electrode, operating portions of the bipolar transistor are protected by the external base electrode and the emitter electrode. Therefore, the surface thereof is not subjected to reactive ion etching. As a result, a Bi-CMOS is obtained in which characteristics of the bipolar transistor are not deteriorated. Furthermore, a Bi-CMOS of low resistance is obtained since tungsten silicide is formed on the external base electrode.

In the method of manufacturing the semiconductor device according to the seventh aspect of the present invention, when sidewall spacers are formed by reaction ion etching on sidewalls of the gate electrode, operating portions of the bipolar transistor are protected by the external base electrode and the emitter electrode. Therefore, the surface thereof is not subjected to reactive ion etching. As a result, a Bi-CMOS is obtained in which characteristics of the bipolar transistor are not deteriorated. Furthermore, according to this method, since polysilicon resistance is formed on the field oxide film, a Bi-CMOS including polysilicon resistance is obtained.

In the method of manufacturing the semiconductor device according to the eighth aspect of the present invention, when sidewall spacers are formed by reactive ion etching on sidewalls of the gate electrode, operating portions of the bipolar transistor are protected by the external base electrode and the emitter electrode. Therefore, the surface thereof is not subjected to reactive ion etching. As a result, a Bi-CMOS is obtained in which characteristics of the bipolar transistor are not deteriorated. Furthermore, according to this method, since a thin film transistor is formed on the field oxide film, a Bi-CMOS including a thin film transistor is obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device having a bipolar transistor and a field effect transistor formed on the same semiconductor substrate, comprising the steps of:

forming sequentially a gate insulating film, a first conductor film, and a first film only in a region to form said field effect transistor;

forming an external base electrode having a second film formed thereon in a region to form said bipolar transistor;

forming an external base region and an intrinsic base region in the region to form said bipolar transistor;

forming a first sidewall spacer on a sidewall of said external base electrode in connection with said second film, using said first film as an etching-stopper which prevents said first conductor film from being etched;

removing said first film on said first conductor film completely;

forming a second conductor film on said semiconductor substrate in contact with said intrinsic base region and said first conductor film;

patterning said second conductor film together with said first conductor film to form an emitter electrode in the region to form said bipolar transistor and a gate electrode in the region to form said field effect transistor;

forming a third film on the entire surface of said semiconductor substrate so as to cover said gate electrode;

etching selectively said third film to form a second sidewall spacer on a sidewall of said gate electrode;

forming a protective insulating film on said semiconductor substrate so as to cover said gate electrode, said external base electrode, and said emitter electrode;

forming a contact hole for electrical connection to said bipolar transistor and said field effect transistor in said protective insulating film; and forming an electrode interconnection electrically connected to said field effect transistor and said bipolar transistor through said contact hole.

2. The method of manufacturing a semiconductor device as recited in claim 1, wherein said first film is formed of an oxide film.

3. The method of manufacturing a semiconductor device as recited in claim 1, wherein said first film is formed of a titanium nitride film.

4. The method of manufacturing a semiconductor device as recited in claim 1, wherein said second film on said external base electrode is formed of an oxide film, and said first sidewall spacer formed on the sidewall of said external base electrode is formed of an oxide film.

5. The method of manufacturing a semiconductor device as recited in claim 1, wherein said second film on said external base electrode is formed of a nitride film, and said first sidewall spacer formed on the sidewall of said external base electrode is formed of a nitride film.

6. The method of manufacturing a semiconductor device as recited in claim 1, wherein said second film on said external base electrode is formed of a nitride film, and said first sidewall spacer formed on the sidewall of said external base electrode is structured in two layers of an internal sidewall spacer formed of an oxide film in contact with said external base electrode, and an external sidewall spacer formed of a nitride film provided on a sidewall of said internal sidewall spacer.

7. The method of manufacturing a semiconductor device as recited in claim 6, wherein formation of said intrinsic base region is carried out by phase diffusion of $B_2H_6$ gas after formation of said first sidewall spacer structured in two layers.

* * * * *